(12) United States Patent
Richards et al.

(10) Patent No.: US 12,543,610 B2
(45) Date of Patent: Feb. 3, 2026

(54) MICROELECTRONIC DEVICE ASSEMBLIES, STACKED SEMICONDUCTOR DIE ASSEMBLIES, AND MEMORY DEVICE PACKAGES

(71) Applicant: Lodestar Licensing Group LLC, Evanston, IL (US)

(72) Inventors: Randon K. Richards, Kuna, ID (US); Aparna U. Limaye, Boise, ID (US); Owen R. Fay, Meridian, ID (US); Dong Soon Lim, Boise, ID (US)

( * ) Notice: Subject to any disclaimer, the term of this patent is extended or adjusted under 35 U.S.C. 154(b) by 62 days.

(21) Appl. No.: 18/439,693

(22) Filed: Feb. 12, 2024

(65) Prior Publication Data
US 2024/0186295 A1    Jun. 6, 2024

Related U.S. Application Data

(63) Continuation of application No. 17/932,401, filed on Sep. 15, 2022, now Pat. No. 11,948,921, which is a
(Continued)

(51) Int. Cl.
*H01L 23/48* (2006.01)
*H01L 21/66* (2006.01)
(Continued)

(52) U.S. Cl.
CPC .......... *H01L 25/0657* (2013.01); *H01L 21/78* (2013.01); *H01L 22/12* (2013.01);
(Continued)

(58) Field of Classification Search
CPC ....... H01L 25/0657; H01L 2924/15311; H01L 24/13; H01L 2224/0401;
(Continued)

(56) References Cited

U.S. PATENT DOCUMENTS 9,859,253 B1    1/2018   Jayaraman et al.
10,424,531 B2    9/2019   Bitz et al.
(Continued)

FOREIGN PATENT DOCUMENTS

CN    103165585 A    6/2013
CN    103325779 A    9/2013
(Continued)

OTHER PUBLICATIONS

Chinese First Office Action for Chinese Application No. 202011122316.X, dated Jun. 20, 2024, 18 pages with translation.
(Continued)

*Primary Examiner* — Niki H Nguyen
(74) *Attorney, Agent, or Firm* — TraskBritt

(57) ABSTRACT

Disclosed is a microelectronic device assembly comprising a substrate having conductors exposed on a surface thereof. Two or more microelectronic devices are stacked on the substrate and the components are connected with conductive material in preformed holes in dielectric material in the bond lines aligned with TSVs of the devices and the exposed conductors of the substrate. Methods of fabrication are also disclosed.

16 Claims, 30 Drawing Sheets

Related U.S. Application Data continuation of application No. 16/939,678, filed on Jul. 27, 2020, now Pat. No. 11,456,284.

(60) Provisional application No. 63/037,902, filed on Jun. 11, 2020, provisional application No. 62/916,371, filed on Oct. 17, 2019.

(51) Int. Cl.

| | |
|---|---|
| *H01L 21/78* | (2006.01) |
| *H01L 23/00* | (2006.01) |
| *H01L 23/52* | (2006.01) |
| *H01L 23/552* | (2006.01) |
| *H01L 23/64* | (2006.01) |
| *H01L 23/66* | (2006.01) |
| *H01L 25/00* | (2006.01) |
| *H01L 25/065* | (2023.01) |
| *H01L 25/18* | (2023.01) |
| *H01L 29/40* | (2006.01) |
| *H01Q 1/22* | (2006.01) |
| *H01Q 1/48* | (2006.01) |

(52) U.S. Cl.
CPC .......... *H01L 23/552* (2013.01); *H01L 23/645* (2013.01); *H01L 23/66* (2013.01); *H01L 24/08* (2013.01); *H01L 24/80* (2013.01); *H01L 25/0652* (2013.01); *H01L 25/18* (2013.01); *H01L 25/50* (2013.01); *H01Q 1/2283* (2013.01); *H01Q 1/48* (2013.01); *H01L 2223/6677* (2013.01); *H01L 2224/08145* (2013.01); *H01L 2224/80895* (2013.01); *H01L 2224/80896* (2013.01); *H01L 2225/06531* (2013.01); *H01L 2225/06537* (2013.01); *H01L 2225/06548* (2013.01); *H01L 2225/06586* (2013.01); *H01L 2225/06589* (2013.01); *H01L 2924/1431* (2013.01); *H01L 2924/1436* (2013.01); *H01L 2924/1443* (2013.01); *H01L 2924/14511* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
CPC . H01L 2225/06513; H01L 2224/48227; H01L 2224/16227; H01L 2225/06517; H01L 24/05; H01L 24/81; H01L 23/3128; H01L 23/481; H01L 23/49827; H01L 25/0652; H01L 2224/04105; H01L 2224/12105; H01L 2224/16146; H01L 2225/1058; H01L 2224/04042; H01L 2924/18161; H01L 24/08; H01L 21/486; H01L 23/5383; H01L 2924/16152; H01L 2224/08145; H01L 24/06; H01L 2224/81815; H01L 24/16; H01L 2224/32225; H01L 23/49816; H01L 2224/32145; H01L 24/73; H01L 2224/16145; H01L 2924/181; H01L 2225/06562; H01L 2224/16237
See application file for complete search history.

(56) References Cited

U.S. PATENT DOCUMENTS

| | | | |
|---|---|---|---|
| 10,916,487 B2 | 2/2021 | Bitz et al. | |
| 10,957,679 B2 | 3/2021 | Lee et al. | |
| 11,362,070 B2 | 6/2022 | Limaye et al. | |
| 11,456,284 B2 | 9/2022 | Richards et al. | |
| 2003/0052409 A1 | 3/2003 | Matsuo et al. | |
| 2007/0018313 A1 | 1/2007 | Gomyo et al. | |
| 2008/0157361 A1 | 7/2008 | Wood et al. | |
| 2009/0260228 A1 | 10/2009 | Val | |
| 2009/0302435 A1 | 12/2009 | Pagaila et al. | |
| 2009/0314538 A1 | 12/2009 | Jomaa et al. | |
| 2011/0024899 A1 | 2/2011 | Masumoto et al. | |
| 2011/0068481 A1 | 3/2011 | Park et al. | |
| 2011/0079924 A1 | 4/2011 | Suh | |
| 2011/0101512 A1 | 5/2011 | Choi et al. | |
| 2011/0147911 A1 | 6/2011 | Kohl et al. | |
| 2012/0020026 A1 | 1/2012 | Oganesian et al. | |
| 2012/0049334 A1* | 3/2012 | Pagaila | H01L 23/49517 438/107 |
| 2012/0056312 A1 | 3/2012 | Pagaila et al. | |
| 2012/0299191 A1 | 11/2012 | Camacho | |
| 2013/0026643 A1 | 1/2013 | England et al. | |
| 2013/0037802 A1 | 2/2013 | England et al. | |
| 2013/0154106 A1 | 6/2013 | Hu et al. | |
| 2013/0228898 A1 | 9/2013 | Ide | |
| 2013/0260510 A1 | 10/2013 | Theuss | |
| 2013/0336039 A1 | 12/2013 | Frans | |
| 2013/0344655 A1* | 12/2013 | Ohba | H01L 21/76898 438/109 |
| 2014/0048930 A1 | 2/2014 | Choi | |
| 2015/0108661 A1 | 4/2015 | Vincent | |
| 2015/0155011 A1 | 6/2015 | Schenck et al. | |
| 2015/0279789 A1 | 10/2015 | Mahajan et al. | |
| 2016/0141260 A1 | 5/2016 | Chang et al. | |
| 2016/0260693 A1 | 9/2016 | Lin et al. | |
| 2017/0012031 A1 | 1/2017 | Lim | |
| 2017/0062383 A1* | 3/2017 | Yee | H01L 24/20 |
| 2017/0084589 A1 | 3/2017 | Kuo et al. | |
| 2018/0095127 A1 | 4/2018 | Pappu et al. | |
| 2019/0019741 A1 | 1/2019 | Li et al. | |
| 2019/0189589 A1 | 6/2019 | Jung et al. | |
| 2019/0385996 A1* | 12/2019 | Nakano | H01L 23/15 |

FOREIGN PATENT DOCUMENTS

| | | | | |
|---|---|---|---|---|
| CN | 105938816 A | | 9/2016 | |
| CN | 106548948 A | * | 3/2017 | ......... H01L 25/0657 |
| CN | 108701680 A | | 10/2018 | |
| KR | 10-2016-0113201 A | | 9/2016 | |
| KR | 10-2019-0000775 A | | 1/2019 | |
| TW | 201324731 A1 | | 6/2013 | |
| TW | 201342581 A1 | | 10/2013 | |
| WO | 2003/005782 A2 | | 1/2003 | |
| WO | 2019/066986 A1 | | 4/2019 | |

OTHER PUBLICATIONS

"Microelectronics Packaging Technology", compiled by the Editorial Committee of the Production Technology Branch of the Chinese Electronics Society, published by the University of Science and Technology of China Press, ISBN: 7-312-01425-9, Apr. 30, 2003, p. 214.
Li et al., "3D Microelectronic Packaging From Fundamentals to Applications", Published by Springer, ISBN: 978-3-319-44586-1, Dec. 31, 2017, 10 pages.
Chinese Notice of Allowance and Search Report for Chinese Application No. 202011122316.X, dated Jan. 1, 2025, 4 pages.
International Search Report for Application No. PCT/US2020/051727, mailed Dec. 30, 2020, 3 pages.
International Search Report for Application No. PCT/US2021/034194, mailed Oct. 28, 2021, 7 pages.
Written Opinion of the International Searching Authority for Application No. PCT/US2020/051727, mailed Dec. 30, 2020, 5 pages.
Written Opinion of the International Searching Authority for Application No. PCT/US2021/034194, mailed Oct. 28, 2021, 12 pages.

* cited by examiner

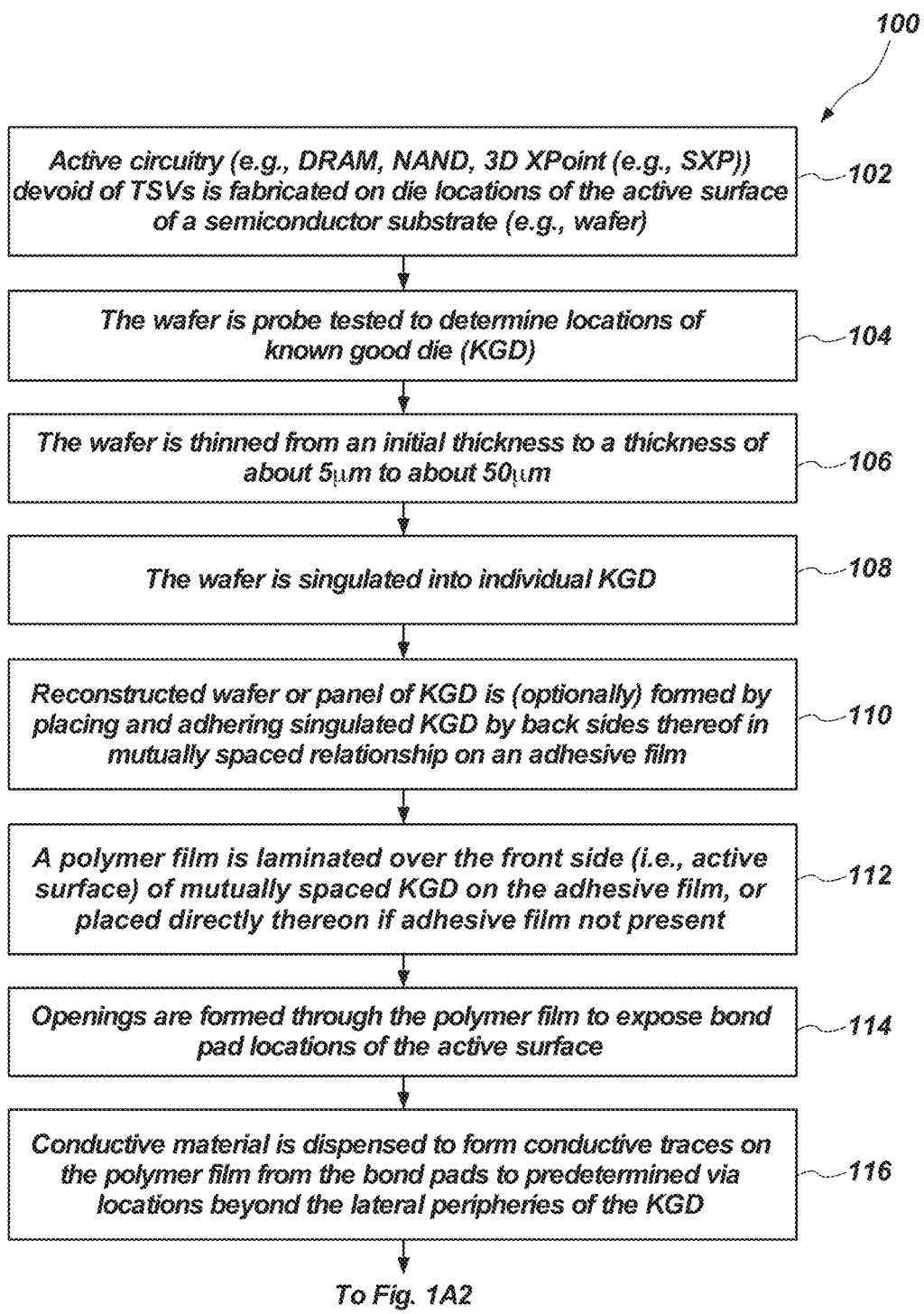
FIG. 1A1

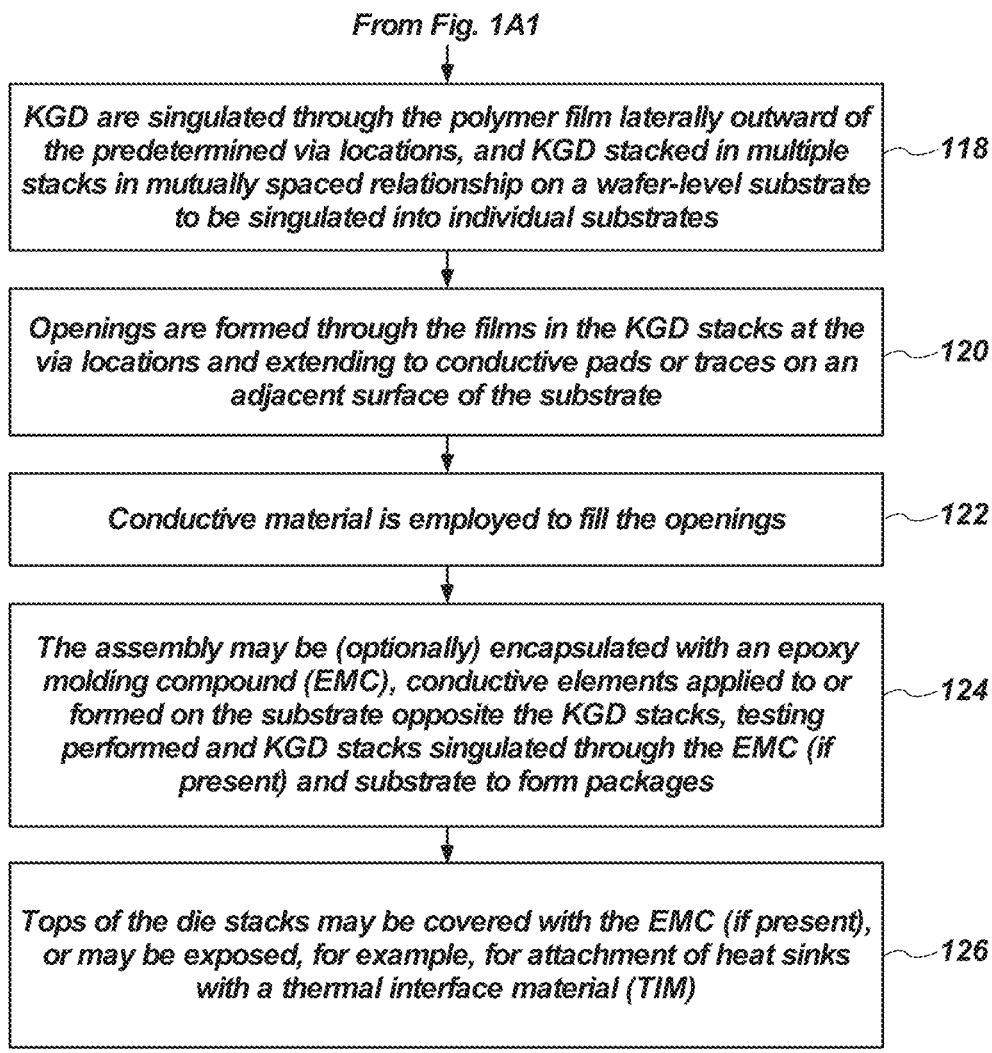
FIG. 1A2

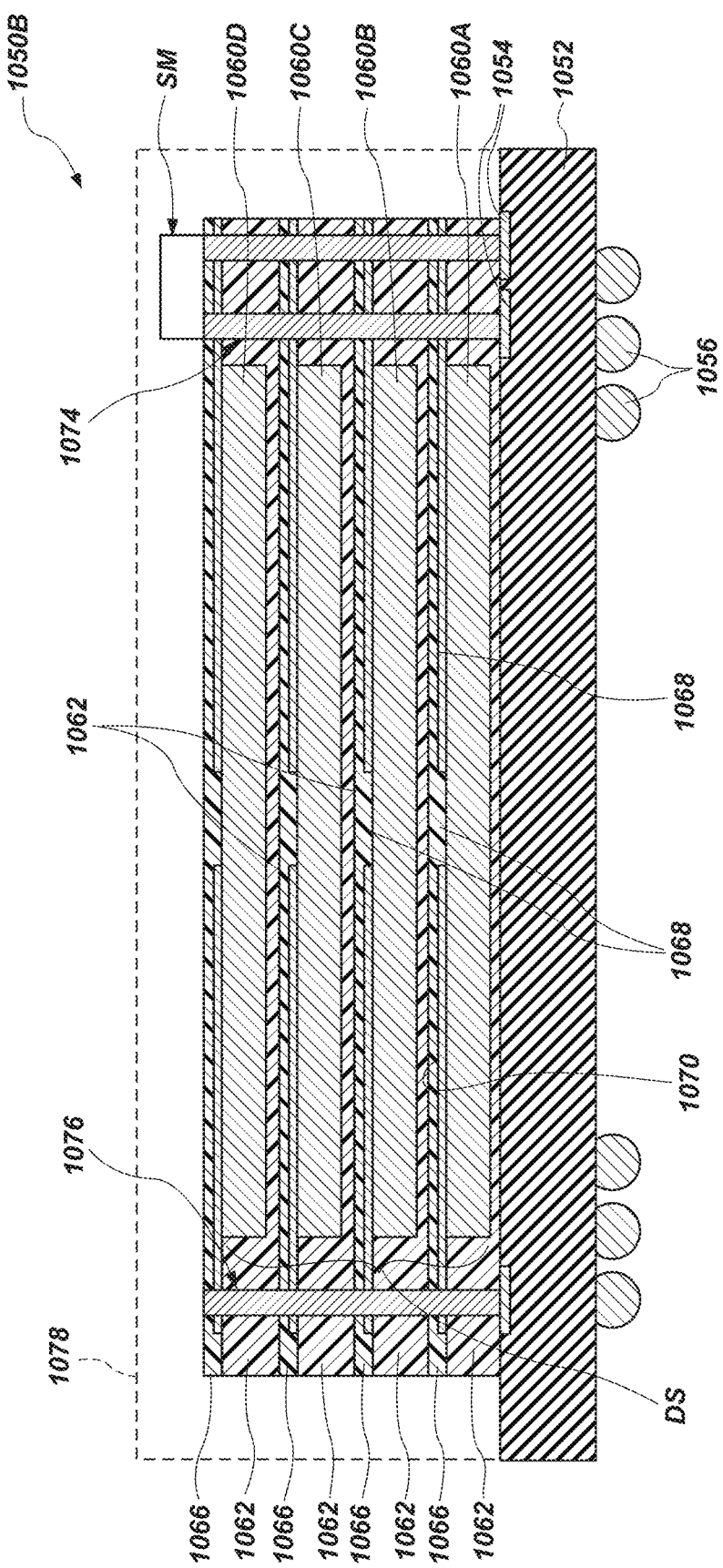
FIG. 10B1

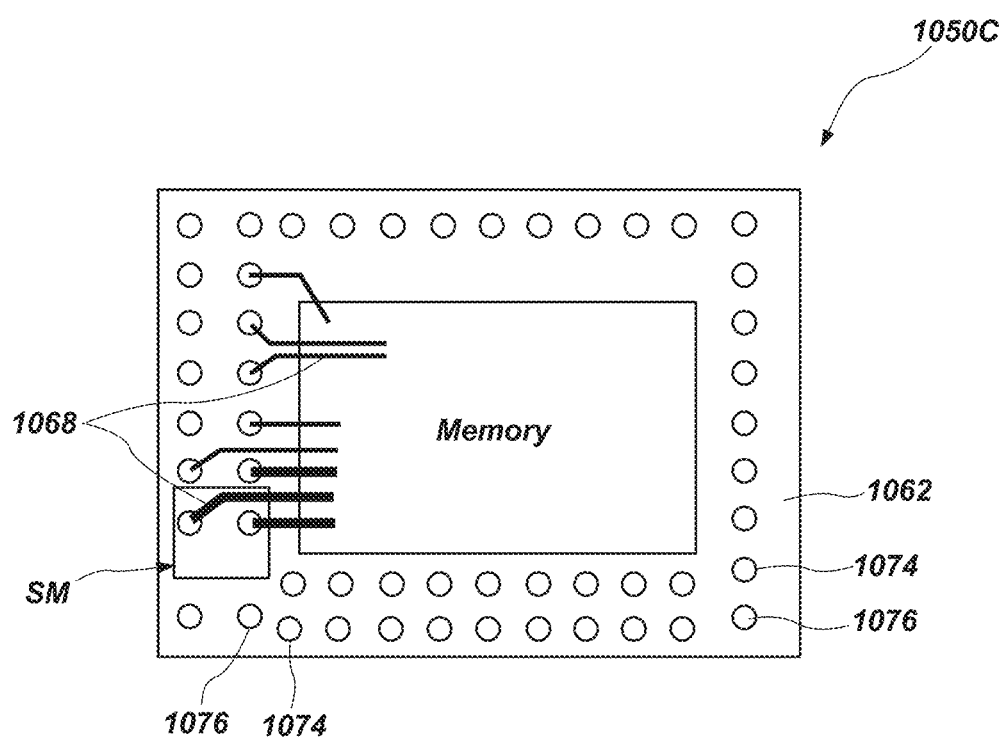
FIG. 10B2

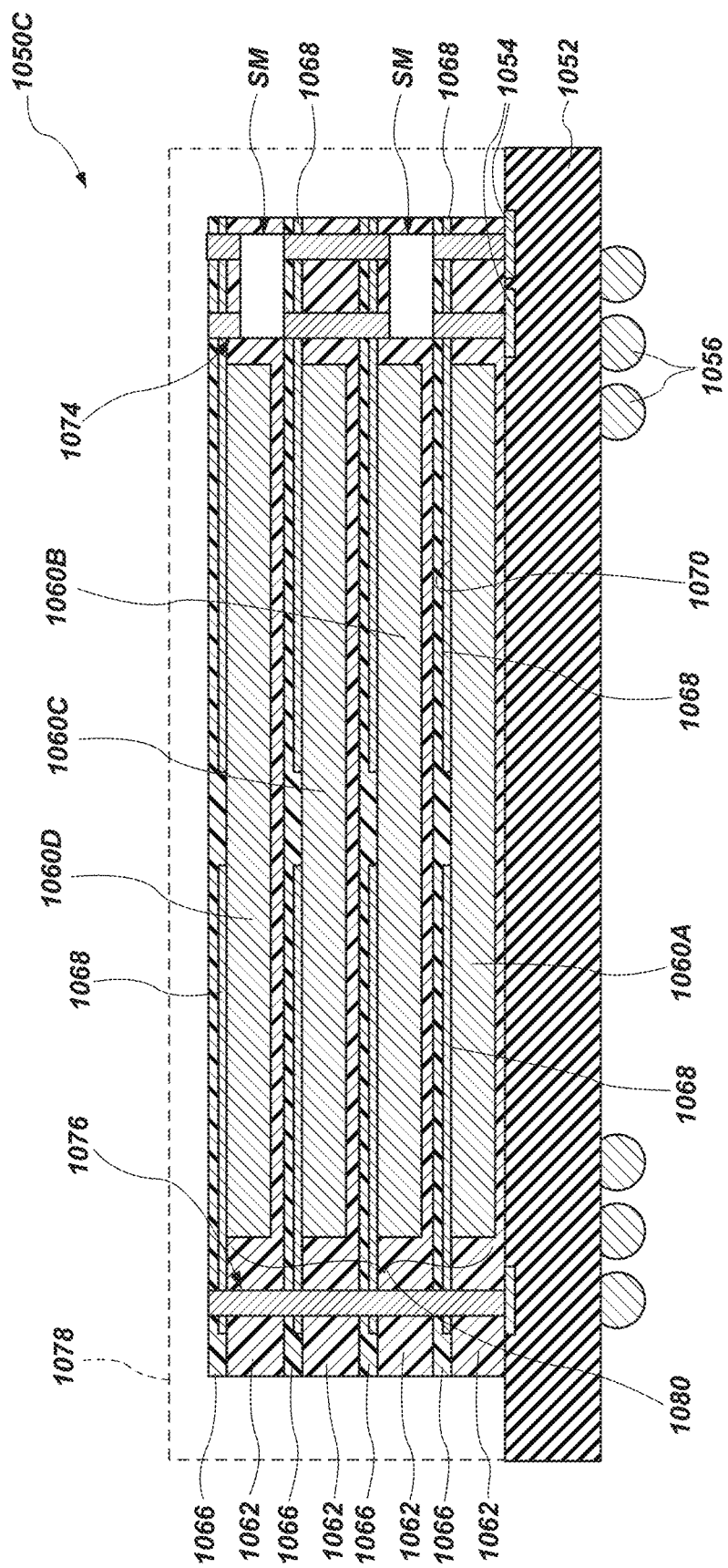
FIG. 10C1

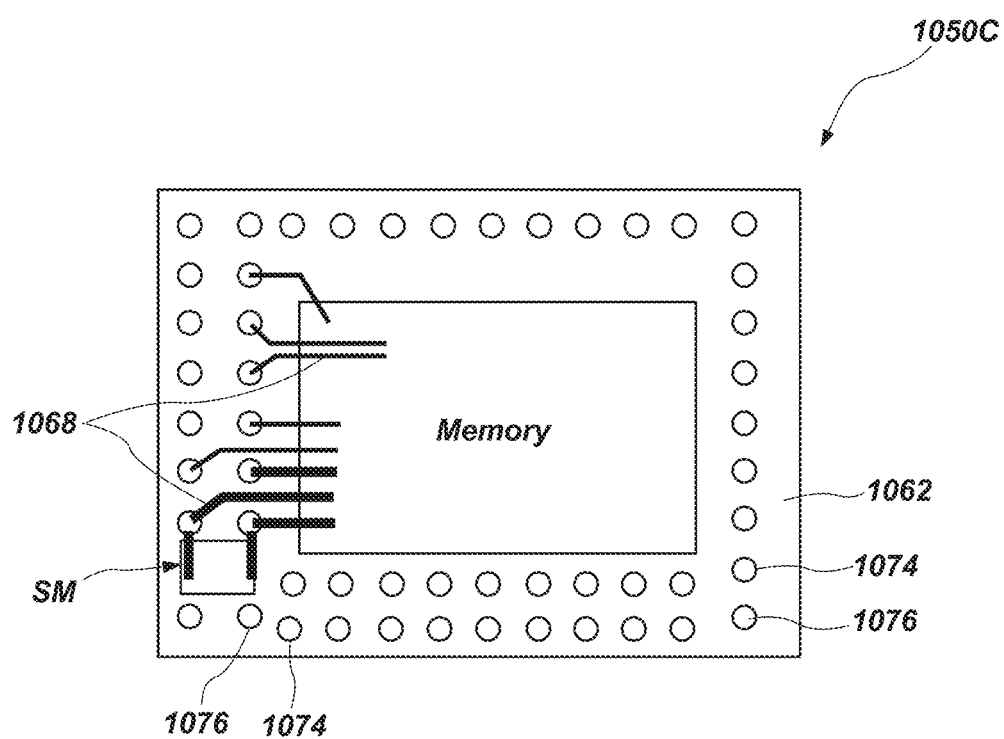
FIG. 10C2

MICROELECTRONIC DEVICE ASSEMBLIES, STACKED SEMICONDUCTOR DIE ASSEMBLIES, AND MEMORY DEVICE PACKAGES

CROSS-REFERENCE TO RELATED APPLICATIONS

This application is a continuation of U.S. patent application Ser. No. 17/932,401, filed Sep. 15, 2022, now U.S. Pat. No. 11,948,921, issued Apr. 2, 2024, which is a continuation of U.S. patent application Ser. No. 16/939,678, filed Jul. 27, 2020, now U.S. Pat. No. 11,456,284, issued on Sep. 27, 2022, which claims the benefit under 35 U.S.C. § 119 (e) of U.S. Provisional Patent Application Ser. No. 62/916,371, filed Oct. 17, 2019, and of U.S. Provisional Patent Application Ser. No. 63/037,902, filed Jun. 11, 2020, the disclosure of each of which is hereby incorporated herein in its entirety by this reference.

The subject matter of this application is related to U.S. patent application Ser. No. 16/939,756 filed Jul. 27, 2020, now U.S. Pat. No. 11,410,973, issued Aug. 9, 2022, U.S. patent application Ser. No. 16/939,650 filed Jul. 27, 2020, now U.S. Pat. No. 11,362,070, issued Jun. 14, 2022, and U.S. patent application Ser. No. 16/939,720 filed Jul. 27, 2020, now U.S. Pat. No. 11,393,794, issued Jul. 19, 2022, the disclosure of each of which is hereby incorporated herein in its entirety by this reference.

TECHNICAL FIELD

Embodiments disclosed herein relate to fabrication of microelectronic device packages. More particularly, embodiments disclosed herein relate to fabrication of microelectronic device assemblies comprising stacked microelectronic devices employing conductive material in preformed holes in dielectric material between TSVs of the microelectronic device, and to related packages and methods.

BACKGROUND

As the electronics industry has moved toward broad commercialization of three-dimensional assemblies of stacked microelectronic devices, most commonly in the form of stacked semiconductor dice, the time and cost incurred in vertically connecting aligned conductive elements of the stacked dice and to conductive elements of a base substrate prior to encapsulating the die stacks has become an issue. Conventionally, a number of singulated semiconductor dice comprising so-called through substrate vias (TSVs, also termed "through silicon vias") terminating at opposing surfaces of each semiconductor die at conductive elements in the form of pillars and pads, are stacked with pillars of a die aligned with pads of an adjacent die. Each die stack may be formed on and aligned with conductive elements of a die location of an unsingulated base wafer, other bulk semiconductor substrate, or other component. The pillars may comprise a single conductive material, such as copper, or a conductive material capped by solder. While an uppermost semiconductor die in a stack may not be furnished with TSVs, nonetheless the pillars of such semiconductor dice are aligned with pads of a next lower semiconductor die and communicate through the TSVs for signal, power and ground (e.g., bias) purposes, as do the other semiconductor dice in the stack.

The use of TSVs presents several issues in terms of fabrication costs and the resulting packages. For example, fabrication of the TSVs conventionally involves formation of blind holes in a semiconductor wafer prior to thinning, followed by lining of the holes with a dielectric material to electrically isolate conductive material of the TSVs. Conductive pillars are formed on one side of the TSVs (i.e., on the active surface of the wafer) in a post wafer finish process and, after the semiconductor wafer is thinned to expose the conductive material, conductive pads are formed thereover. Further, after semiconductor dice have been singulated from the semiconductor wafer, they are then stacked with mutually aligned pillars, TSVs and pads for subsequent interconnection of adjacent pillars and pads by, in accordance with the current state of the art, thermocompression bonding.

Thermocompression bonding techniques, wherein heat and pressure (i.e., vertical force) are applied to cause conductive elements of a semiconductor die to diffusion bond to conductive elements of another semiconductor die or other base substrate, have proven to provide robust mechanical and electrical connections between the components. However, thermocompression bonding, is costly and time-consuming when multiple, stacked semiconductor dice are to be diffusion bonded, an ever-more common requirement as three-dimensional (3D) assemblies of semiconductor dice using smaller conductive elements in the form of copper pillars at reduced pitches are implemented on a commercial scale. For example, stacks of memory dice comprising four, eight, twelve or even sixteen dice as a complete assembly, or in combination with a logic die such as may be implemented in a Hybrid Memory Cube architecture, as well as such stacks including a device logic die in the case of high-bandwidth memory (HBM) architectures, may be fabricated.

For example, when multiple semiconductor dice are to be stacked on die locations of a bulk semiconductor substrate (e.g., wafer), as the stack is formed, the singulated dice of a given level are placed and then thermocompression gang bonded one by one to the base wafer or to a lower level of dice by application of heat and pressure, and the process is repeated, die-level by die-level, until a die stack of desired number (e.g., four dice, eight dice, etc.) is achieved. Even when such stacking and gang bonding is performed at the wafer level, it will be appreciated that such an approach is cost- and time-intensive, requiring multiple acts of stacking and individually gang bonding of dice of each die level using a pick and place apparatus with a bond head before proceeding to form the next, higher level. In addition, conventional thermocompression bonding of copper-to-copper conductive elements is a solid state diffusion bonding process resulting in inter-diffusion of atoms and grain growth between two abutting metal surface carried out at undesirably high temperatures, on the order of about 300° C. even for so-called "low-temperature" bonding. Avoidance of such temperatures associated with thermocompression bonding is desirable due to thermal budget limitations of the dice, as well as post-bonding thermo-mechanical stress control, and alignment accuracy constraints.

In addition to the foregoing, use of TSVs for vertical conductive paths in a stack of semiconductor dice also consumes valuable real estate (i.e., area) on each die. As semiconductor dice become smaller and critical dimensions and pitches of features are reduced in size to increase circuit density, the use of TSVs, particularly as the number of semiconductor dice in a stack increases, becomes less desirable. This is a particular issue with memory devices incorporating ever-more numerous, smaller and more densely located memory cells, although the problem is not so limited.

BRIEF DESCRIPTION OF THE DRAWINGS

FIGS. 1A1 and 1A2 comprise a flow diagram of an embodiment of a method for fabricating a microelectronic device package according to the disclosure;

FIG. 10A is a flow diagram of an embodiment of a method for fabricating a microelectronic device assembly incorporating surface mount components according to the disclosure and FIGS. 10B1-10D illustrate different die assemblies incorporating surface mount components;

DETAILED DESCRIPTION

Figure 1B:
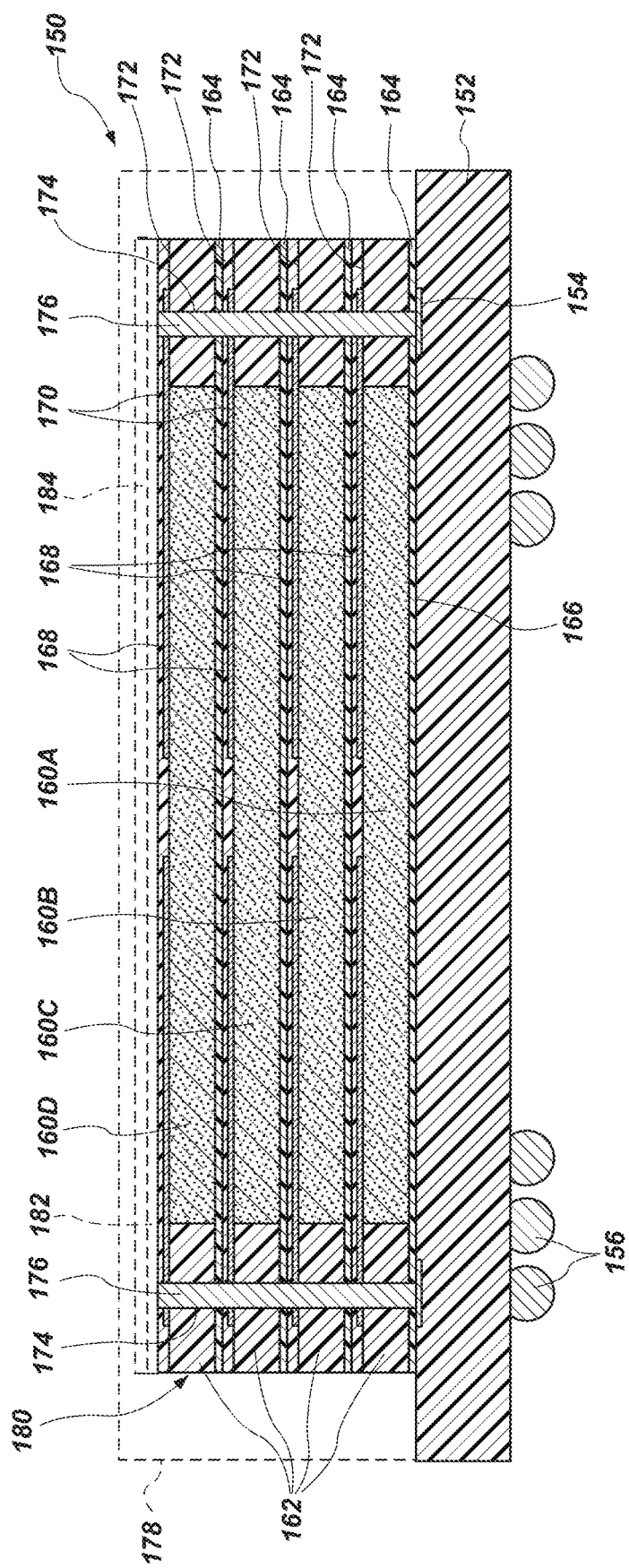
FIG. 1B is a side sectional schematic of a microelectronic device package according to an embodiment of the disclosure and which may be fabricated according to the method of FIGS. 1A1 and 1A2.

Microelectronic device packages comprising multiple stacked microelectronic devices (e.g., semiconductor dice) devoid of TSVs, as well as methods for fabricating such packages and related electronic systems.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing a microelectronic package, structure including a microelectronic package, or a system (e.g., an electronic system) including a microelectronic package. Only those process acts and materials necessary to understand the embodiments of the disclosure are described in detail below. Additional acts and materials to form a complete microelectronic device package, a complete structure including a microelectronic package, or a complete system including a microelectronic package may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the FIGURES are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the FIGURES. Unless otherwise specified, the spatially relative terms are intended to encompass different orientations of the materials in addition to the orientation depicted in the FIGURES. For example, if materials in the FIGURES are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed, additional structures are located, or both. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. In some embodiments, the substrate may comprise an interposer or a circuit board.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "configured" refers to a size, shape, material composition, and arrangement of one or more of at least one structure and at least one apparatus facilitating operation of one or more of the structure and the apparatus in a pre-determined way.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, the term "wafer" is to be broadly construed to mean and include both conventional semiconductor material wafers as well as other bulk substrate comprising semiconductor material on another, supporting material.

As used herein, the term "microelectronic device" means and includes singulated semiconductor dice, groups of unsingulated semiconductor dice, dice and dice groups comprising functions other than functions dependent upon semiconductive material, for example, optical devices and MEMS devices. Likewise, the term "semiconductor dice" as used herein may be interpreted broadly as encompassing other microelectronic devices.

As used herein, the terms "fan-out package" and FOP mean and include a microelectronic device package including at least one level of conductive traces carried on a dielectric material such as a film and operably coupled to bond pads of an associated semiconductor die and extending (i.e., fanning out) to locations beyond the die periphery on one or more sides thereof. Similarly, a FOP-configured redistribution layer, or RDL, is a redistribution layer comprising at least one level of conductive traces carried on a dielectric material such as a film and configured with inner ends at locations of bond pads of a semiconductor to be operably coupled to the conductive traces, which extend (e.g., fan out) to locations beyond a periphery of the mounting location for the semiconductor die to locations beyond the periphery of the die mounting location on one or more sides thereof.

As used herein, a "memory device" means and includes a microelectronic device exhibiting, but not limited to, memory functionality.

FIGS. 1A1 and 1A2 are two parts of a flow diagram of an embodiment of a method 100 for fabricating a microelectronic device package according to the disclosure. In act 102, active circuitry (e.g., DRAM, NAND, 3D XPoint (e.g., SXP)) devoid of TSVs is fabricated on die locations of the active surface of a semiconductor substrate (e.g., wafer). In act 104, the wafer is probe tested to determine locations of known good die (KGD). The wafer is thinned in act 106, for example, from an initial thickness of about 600 μm to about 700 μm, for example to a thickness of about 5 μm to about 200 μm, and as specific non-limiting examples, to a thickness on the order of about 100 μm, about 50 μm, or about 30 μm. However, it is noted that the embodiment of the method is not limited to any particular die thickness. The wafer is then singulated (i.e., diced) using a conventional process (saw blade, laser, stealth (i.e., laser-induced street defects followed by fracture from radial expansion of carrier membrane), etc.) at act 108 into individual KGD. In act 110, a reconstructed wafer or panel of KGD is then (optionally) formed by placing and adhering singulated KGD by the back sides thereof in mutually spaced relationship on an adhesive film, for example a die attach film (DAF) or film over die (FOD) like material. A film, for example a wafer or panel level film such as a non-conductive film (NCF) comprising a silica-filled epoxy, a b-staged polyimide film, a polytetrafluoroethylene (PTFE) film or other polymer film is laminated over the front side (i.e., active surfaces) of the mutually spaced KGD of the reconstructed wafer or panel in act 112, or laminated to active surfaces of singulated KGD place thereon. In act 114, openings are formed (e.g., by laser ablation) through the film to expose bond pad locations on the active surface of the KGD followed by, optionally, a solvent clean act to remove any residue on the bond pad locations resulting from the to ensure a robust electrical connection between conductive traces to be formed in act 116 on the polymer film. A conductive material, for example, an Ag or Cu paste is dispensed to form conductive traces on the polymer film from the bond pads to predetermined via locations beyond the lateral peripheries of the KGD in act 116. Alternatively, the conductive traces may be applied by an ink jet technique. In act 118, the KGD are singulated through the polymer film laterally outward of the predetermined via locations, and KGD stacked on a substrate, which may be a wafer-level substrate to be singulated into individual substrates and bearing multiple KGD stacks in mutually spaced relationship. In act 120, via holes, which may be referred to as through poly vias (TPVs) are formed, for example, by laser or patterning and anisotropic etching through the films in the KGD stacks at the via locations and extending to conductive pads or traces on an adjacent surface of the substrate. In act 122, a sintered Ag or Cu paste or other conductive material is employed to fill the vias, for example, using an ink jet type applicator. As another approach, the vias may be filled with a Sn solder in a wave solder process. In act 124, the assembly may be (optionally) encapsulated with an epoxy molding compound (EMC), conductive elements applied to or formed on the substrate opposite the KGD stacks (for example, solder bumps in a ball grid array (BGA) format coupled to conductive paths extending to conductive pads or traces on the substrate surface adjacent the KGD stacks, testing) performed and the KGD stacks singulated through the EMC (if present) and substrate to form packages. In act 126, the tops of the die stacks may be covered with the EMC, or may be exposed, for example, for attachment of heat sinks with a thermal interface material (TIM).

FIG. 1B is a side sectional schematic of a microelectronic device package 150 according to an embodiment of the disclosure, and which may be fabricated according to the method of FIGS. 1A1 and 1A2. Microelectronic device package 150 comprises a substrate 152 having traces (not shown) carried in a dielectric material and extending from conductive pads 154 on an upper surface thereof to conductive elements 156 on an opposing, lower surface thereof. Conductive elements 156 may comprise, for example, solder balls formed on or applied to under bump metallization (UBM) of substrate 152. Multiple semiconductor dice 160A-160D, for example, dice configured as double data rate (DDRx) DRAM, NAND Flash or 3D Xpoint (e.g., SXP) memory, are stacked on the upper surface of substrate 152. Each semiconductor die 160A-160D is laminated to a polymer film 162, for example, a non-conductive film (NCF), a b-staged polyimide film, or a polytetrafluoroethylene (PTFE) film extending beyond at least one lateral periphery of the respective die 160A-160D on one or more sides thereof (two sides shown). Each semiconductor die 160A-160D is attached to a DAF 164 on the back side 166 thereof. The DAF may be eliminated if an NCF exhibiting sufficient adhesive characteristics for lamination purposes is employed. Conductive traces 168 extend from bond pad locations (not shown) on active surfaces 170 of each semiconductor die 160A-160D laterally outwardly over upper surfaces 172 of polymer films 162 at least to locations of vias 174 filled with conductive material 176 extending between semiconductor dice 160A-160D and to conductive pads 154 of substrate 152. As shown in broken lines, semiconductor dice 160A-160D may be encapsulated in, for example, an EMC 178 extending at least around the lateral periphery of die stack 180 and abutting the upper surface of substrate 152. The EMC 178 may extend over the uppermost semiconductor die 160D as shown. The EMC 178 may, alternatively, leave the active surface 170 and conductive traces 168 uncovered, to be covered by a thin dielectric layer, which may comprise a thermal interface material (TIM) 182 and a heat sink 184, both as shown in broken lines, for enhanced heat transfer from the microelectronic device package 150.

Figure 2A:
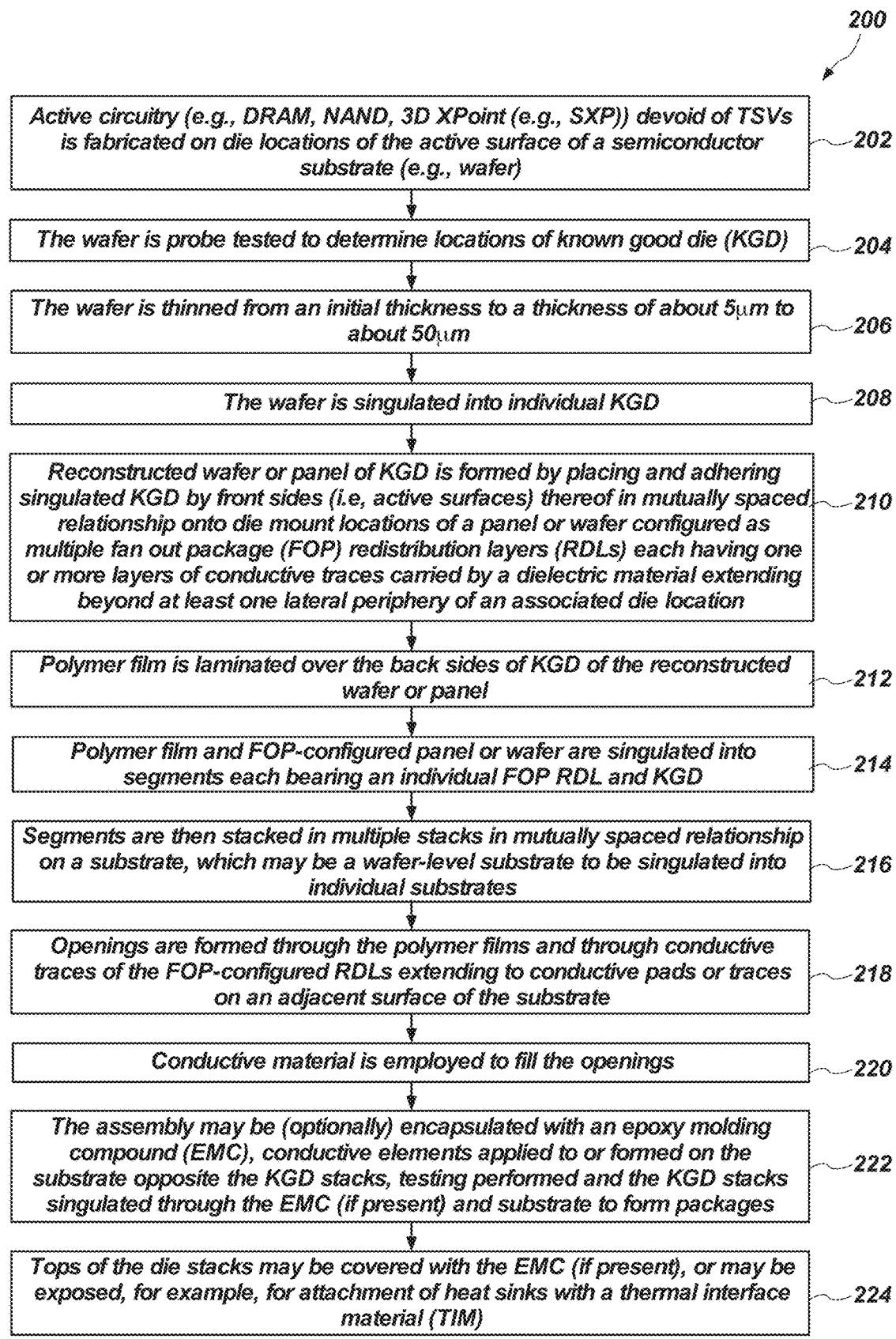
FIG. 2A is a flow diagram of another embodiment of a method for fabricating a microelectronic device package according to the disclosure.

FIG. 2A is a flow diagram of an embodiment of a method 200 for fabricating a microelectronic device package according to the disclosure. In act 202, active circuitry (e.g., DRAM, NAND, 3D XPoint (e.g., SXP)) devoid of TSVs is fabricated on die locations of the active surface of a semiconductor substrate (e.g., wafer), In act 204, the wafer is probe tested to determine locations of known good die (KGD). The wafer is thinned in act 206, for example, from an initial thickness of about 600 µm to about 700 µm, for example, to a thickness of about 5 µm to about 50 µm, and as a specific example, to a thickness on the order of about 30 µm. However, it is noted that the embodiment of the method is not limited to any particular die thickness. The wafer is then singulated (i.e., diced) using a conventional process (saw blade, laser, stealth (i.e., laser-induced street defects followed by fracture from radial expansion of carrier membrane), etc.) at act 208. In act 210, a reconstructed wafer or panel of KGD is then formed by placing and adhering singulated KGD by front sides (i.e., active surfaces) thereof in mutually spaced relationship onto die mount locations of a panel or wafer configured as multiple fan-out package (FOP) redistribution layers (RDLs) each having one or more layers of conductive (e.g., copper) traces carried by a dielectric material extending beyond at least one lateral periphery of an associated die location. A film, for example, a wafer level film such as a non-conductive film (NCF), a b-staged polyimide film, a polytetrafluoroethylene (PTFE) film or other polymer film is laminated over the back sides of KGD of the reconstructed wafer or panel in act 212. In act 214, the polymer film and FOP-configured panel or wafer are singulated into segments each bearing an individual FOP RDL and KGD. In act 216, the segments are then stacked on a substrate, which may be a wafer-level substrate to be singulated into individual substrates and bearing multiple KGD stack in mutually spaced relationship. In act 218, openings, which may be referred to as TPVs are formed (e.g., by laser ablation or anisotropic etching) through the polymer films and through conductive traces of the FOP-configured RDLs extending to conductive pads or traces on an adjacent surface of the substrate. In act 220, an Ag or Cu paste or other conductive material is employed to fill the vias, for example, using an ink jet type applicator. As another example, the vias may be filled with a Sn solder in a wave solder process. In act 222, the assembly may be (optionally) encapsulated with an epoxy molding compound (EMC), conductive elements applied to or formed on the substrate opposite the KGD stacks (for example, solder bumps in a ball grid array (BGA) format), testing performed and the KGD stacks singulated through the EMC (if present) and substrate to form packages. In act 224, the tops of the die stacks may be covered with the EMC (if present), or may be exposed, for example, for attachment of heat sinks with a thermal interface material (TIM).

Figure 2B:
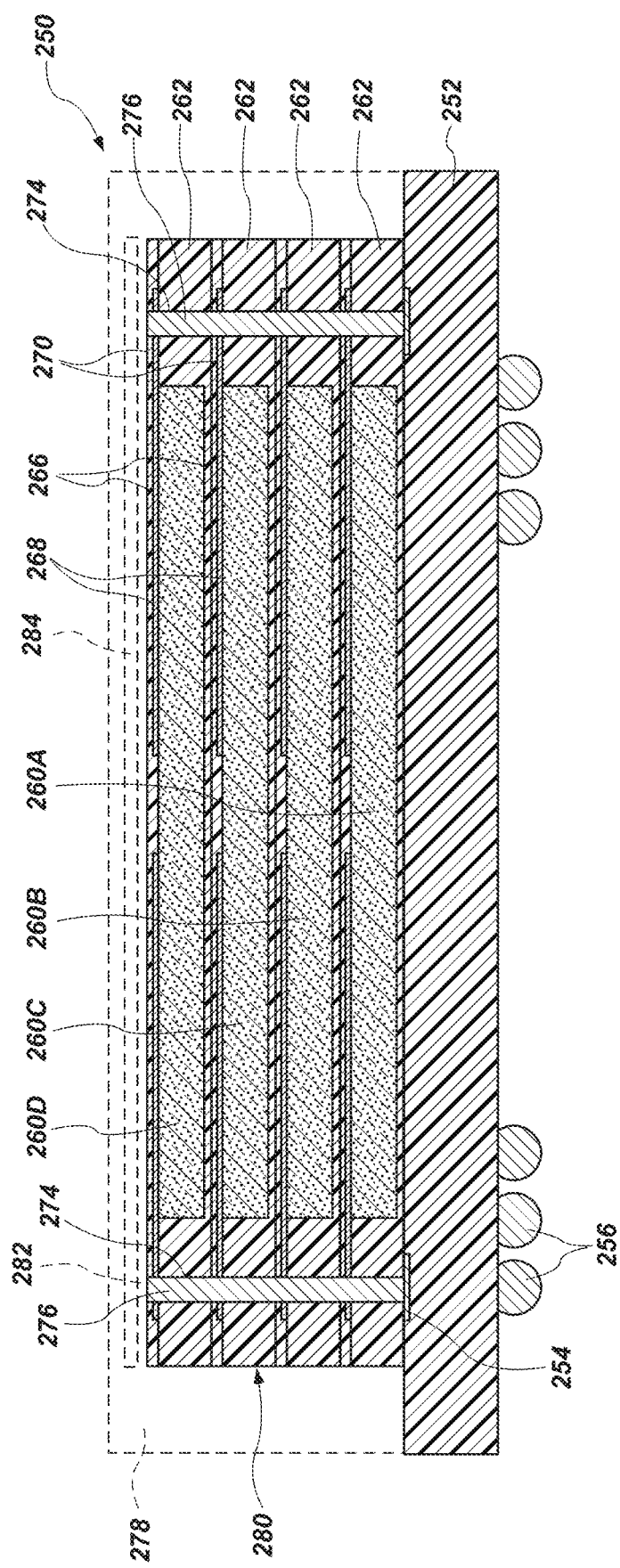
FIG. 2B is a side partial sectional schematic of a microelectronic device package according to an embodiment of the disclosure and which may be fabricated according to the method of FIG. 2A.

FIG. 2B is a side sectional schematic of a microelectronic device package 250 according to an embodiment of the disclosure, and which may be fabricated in according to the method of FIG. 2A. Microelectronic device package 250 comprises a substrate 252 having traces (not shown) carried in a dielectric material and extending from conductive pads 254 on an upper surface thereof to conductive elements 256 on an opposing, lower surface thereof. Conductive elements 256 may comprise, for example, solder balls formed on or applied to under bump metallization (UBM) of substrate 252. Multiple semiconductor dice 260A-260D, for example dice, configured as double data rate (DDRx) DRAM, NAND Flash or 3D XPoint (e.g., SXP) memory, are stacked on the upper surface of substrate 252. Each semiconductor die 260A-260D is laminated to a polymer film 262, for example, a non-conductive film (NCF), a b-staged polyimide film, a polytetrafluoroethylene (PTFE) film or other polymer film extending beyond a lateral periphery of the respective die 260A-260D on one or more sides thereof (two sides shown). An FOP-configured RDL 266 bearing conductive traces 268 is secured to the active surface 270 of each semiconductor die 260A-260D, conductive traces 268 extending through or over RDLs 266 from bond pad locations (not shown) on the active surfaces 270 of each semiconductor die 260A-260D laterally outwardly at least to locations of vias 274 filled with conductive material 276 extending between semiconductor dice 260A-260D and to conductive pads 254 of substrate 252. As shown in broken lines, semiconductor dice 260A-260D are encapsulated in, for example, an EMC 278 extending at least around the lateral periphery of die stack 280 and abutting the upper surface of substrate 252. The EMC 278 may extend over the uppermost semiconductor die 260D as shown. The EMC 278 may, alternatively, leave the active surface 270 and conductive traces 268 uncovered, to be covered by a thin dielectric layer, which may comprise a thermal interface material (TIM) 282 and a heat sink 284, both as shown in broken lines, for enhanced heat transfer from the microelectronic device package 250.

Figure 3A:
FIG. 3A is a flow diagram of an embodiment of a method for fabricating a microelectronic device package according to the disclosure.

FIG. 3A is a flow diagram of an embodiment of a method 300 for fabricating a microelectronic device package according to the disclosure. In act 302, active circuitry (e.g., DDRx DRAM with Master/Slave architecture) devoid of TSVs is fabricated on die locations of the active surface of respective semiconductor substrates (e.g., wafer) configured respectively for Master and Slave architectures. In act 304, the Master and Slave wafers are each probe tested to determine locations of known good die (KGD). In act 306, the Master wafer is then post wafer finished with conductive (e.g., copper) elements in the form of pillars configured for direct chip attach (DCA). The wafers are thinned in act 308, for example, from an initial thickness of about 600 µm to about 700 µm, for example, to a thickness of about 5 µm to about 50 µm, and as a specific example, to a thickness on the order of about 30 µm. However, it is noted that the embodiment of the method is not limited to any particular die thickness. The Master and Slave wafers are then singulated (i.e., diced) using a conventional process (saw blade, laser, stealth (i.e., laser-induced street defects followed by fracture from radial expansion of carrier membrane), etc.) at act 310. In act 312, a reconstructed wafer or panel of Master die KGD is then formed by placing and adhering singulated Master KGD by the back sides thereof in mutually spaced relationship onto a panel or wafer comprising a polymer film, for example, a non-conductive film (NCF), a b-staged polyimide film, a polytetrafluoroethylene (PTFE) film or other polymer film. In act 314, a reconstructed wafer or panel of Slave KGD is then formed by placing and adhering singulated Slave KGD by front sides (i.e., active surfaces) thereof in mutually spaced relationship onto die mount locations of a panel or wafer configured as multiple fan-out package (FOP) redistribution layers (RDLs) each having one or more layers of conductive (e.g., copper) traces carried by a dielectric material and extending beyond at least one lateral periphery of an associated die mount location. A film, for example, a wafer level film such as a non-conductive film (NCF), a b-staged polyimide film, a polytetrafluoroethylene (PTFE) film or other polymer film is laminated over the back side of each of the reconstructed Master and Slave KGD wafers or panels in act 316. In act 318, the reconstructed Master and Slave wafers are singulated respectively between Master KGD locations and between the FOP-configured RDLs into segments, each segment bearing an individual Master or Slave KGD, with an FOP RDL associated with each Slave KGD.

In act 320, the Master KGD segments are placed in mutually spaced relationship on a wafer-level substrate, inverted with their conductive pillars in a DCA orientation against conductive pads or traces of the substrate, and thermocompression bonded. In act 322, the Slave KGD are then stacked on the Master KGD at the mutually spaced relationship. In act 324, openings, which may be referred to as TPVs are formed (e.g., by laser ablation or anisotropic etching) through the polymer films and through conductive traces of the FOP-configured RDLs of the Slave KGD extending to conductive pads or traces on the substrate. In act 326, an Ag or Cu paste or other conductive material is employed to fill the vias, for example, using an ink jet type applicator. As another example, the vias may be filled with a Sn solder in a wave solder process. In act 328, the assembly may be (optionally) encapsulated with an epoxy molding compound (EMC), conductive elements applied to or formed on the substrate opposite the KGD stacks (for example, solder bumps in a ball grid array (BGA) format), testing performed and the KGD stacks singulated through the EMC (if present) and substrate to form packages. In act 330, the tops of the die stacks may be covered with the EMC, or may be exposed, for example, for attachment of heat sinks with a thermal interface material (TIM).

Figure 3B:
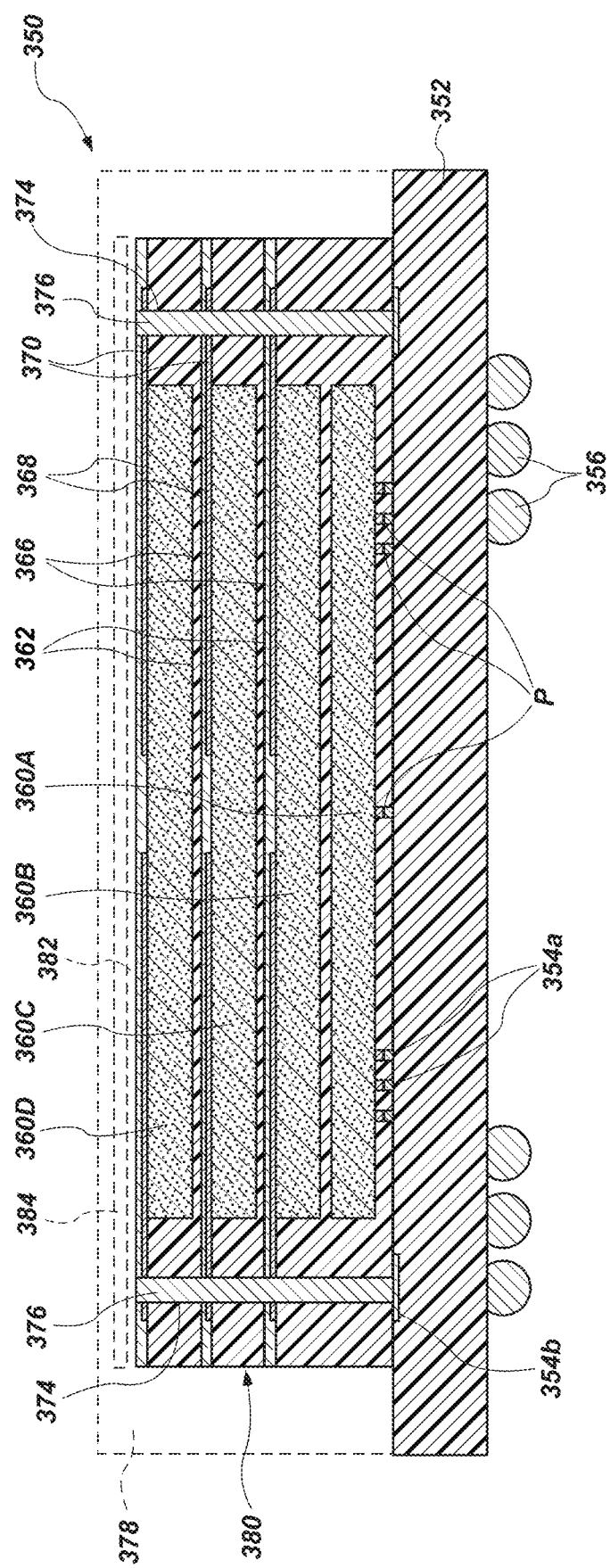
FIG. 3B is a side sectional schematic of a microelectronic device package according to an embodiment of the disclosure and which may be fabricated according to the method of FIG. 3A.
Figure 4A:
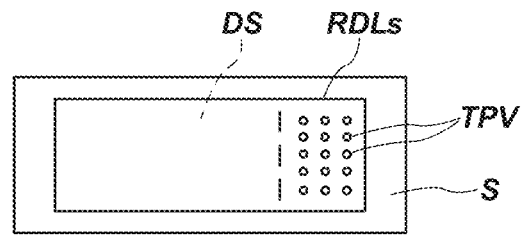
FIGS. 4A-4D are schematic top elevations of die stacks according to embodiments of the disclosure illustrating various embodiments including through poly vias on one, two, three or four sides of a die stack.
Figure 4B:
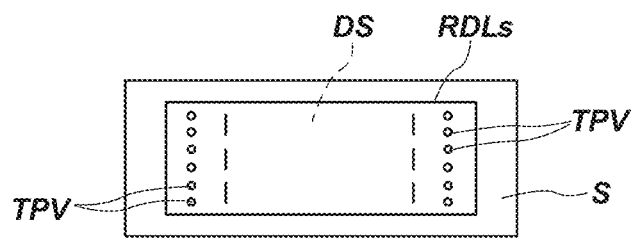
Figure 4C:
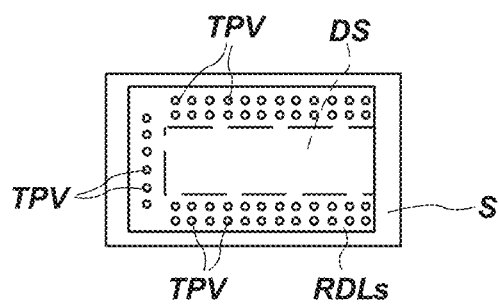
Figure 4D:
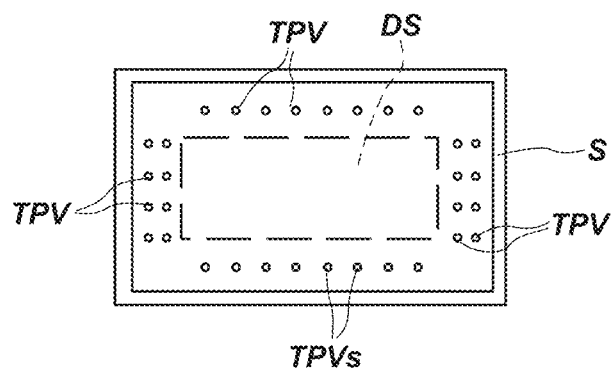

FIG. 3B is a side sectional schematic of a microelectronic device package 350 according to an embodiment of the disclosure, and which may be fabricated according to the method of FIG. 3A. Microelectronic device package 350 comprises a substrate 352 having traces (not shown) carried in a dielectric material and extending from conductive pads 354a and 354b on an upper surface thereof to conductive elements 356 on an opposing, lower surface thereof. Conductive elements 356 may comprise, for example, solder balls formed on or applied to under bump metallization (UBM) of substrate 352. Multiple semiconductor dice 360A-360D, for example, dice configured as double data rate (DDRx) DRAM in a Master/Slave architecture, are stacked on the upper surface of substrate 352. Each semiconductor die 360A-360D is laminated on its back side to a polymer film 362, for example, a non-conductive film (NCF), a b-staged polyimide film, a polytetrafluoroethylene (PTFE) film extending beyond a lateral periphery of the respective die 360A-360D on one or more sides thereof (two sides shown). Semiconductor die 360A is inverted in a flip-chip orientation over substrate 352, and conductive elements in the form of pillars P are connected to conductive pads 354a in a DCA arrangement by thermocompression (i.e., diffusion) bonds. An FOP-configured RDL 366 bearing conductive traces 368 is secured to the active surface 370 of each semiconductor die 260B-260D, conductive traces 368 extending through or over RDLs 366 from bond pad locations (not shown) on the active surfaces 370 of each semiconductor die 360B-360D laterally outwardly at least to locations of vias 374 filled with conductive material 376 extending between semiconductor dice 360A-360D and to conductive pads 354b of substrate 352. As shown, semiconductor dice 360A-360D are encapsulated in, for example, an EMC 378 extending at least around the lateral periphery of die stack 380 and abutting the upper surface of substrate 352. The EMC 378 may extend over the uppermost semiconductor die 360D as shown. The EMC 378 may, alternatively, leave the active surface 370 and conductive traces 368 uncovered, to be covered by a thin dielectric layer, which may comprise a thermal interface material (TIM) 382 and a heat sink 384, both as shown in broken lines, for enhanced heat transfer from the microelectronic device package 350.

While the three embodiments illustrated and described above provide TPVs on opposing sides of the die stacks, embodiments of the disclosure are not so limited. For example, FOP-configured RDLs or other dielectric films comprising conductive traces (FIGS. 1A1, 1A2, and 1B) extending to TPVs may extend beyond the lateral periphery of the die stacks DS on substrates S on one, two, three or four sides of the die stacks, as illustrated respectively in FIGS. 4A-4D.

Figure 5A:
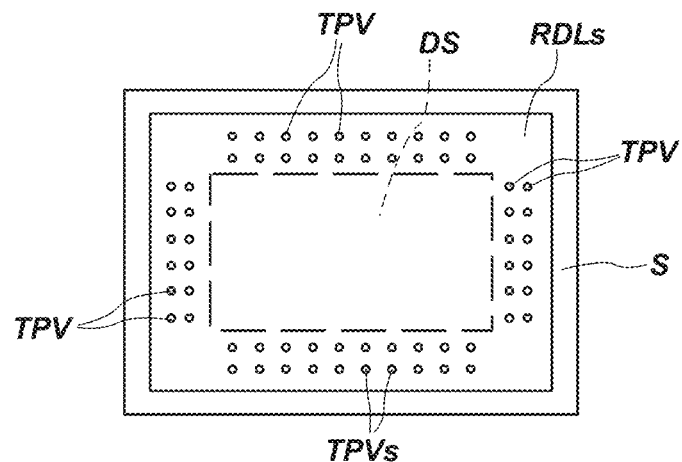
FIGS. 5A and 5B are, respectively, schematic top elevations of die stacks according to embodiments of the disclosure illustrating different arrangements of multiple rows of through poly vias.
Figure 5B:
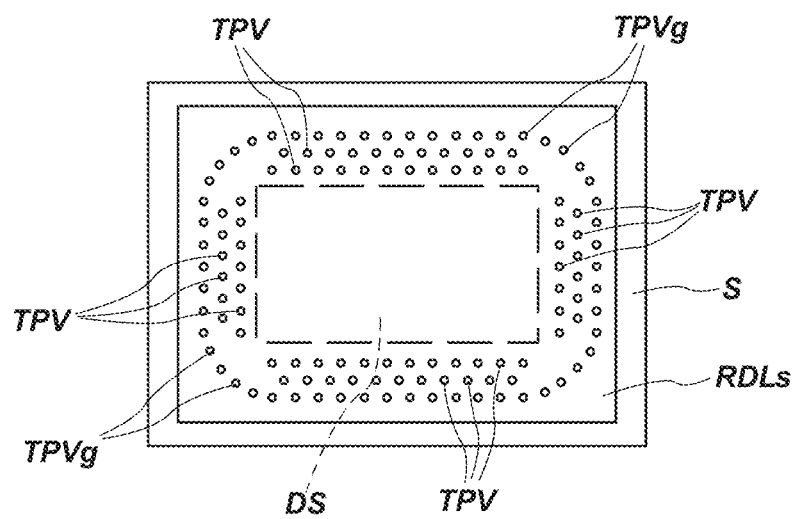
Figure 5C:
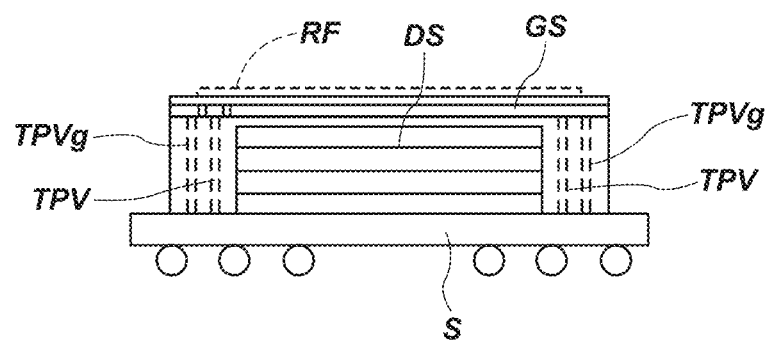
FIG. 5C is a schematic side elevation of an embodiment of the disclosure comprising a Faraday cage comprising through silicon vias around and a ground structure over a die stack.

In addition, while the three embodiments illustrated and described above provide a single row of TPVs, embodiments of the disclosure are not so limited. For example, FIG. 5A shows a substrate S with die stack DS having RDLs or other dielectric films comprising conductive traces (FIGS. 1A1, 1A2, and 1B) having two aligned rows of TPVs on each of four sides, while FIG. 5B shows a substrate S with a die stack DS having RDLs or other dielectric films comprising conductive traces (FIGS. 1A1, 1A2, and 1B) having three staggered rows of TPVs on each of four sides. Of course, there may be a different number of TPVs on one side of a die stack than on one or more other sides thereof. In addition to moving signal, power and ground (e.g., bias) paths to locations exterior to the semiconductor dice of die stacks DS, an outer ring of ground TPVs, TPVgs may provide a ground stitching function for the die stack DS if one or more semiconductor dice of the die stack DS, unlike NAND Flash, are susceptible to electromagnetic interference (EMI). Similarly, a ground plane or mesh, trace arrays or other ground structure GS extending over the top of a die stack DS and operably coupled to ground TPVgs may provide a complete Faraday cage protecting die stack DS against EMI and functioning as an EMI shield, as illustrated in FIG. 5C. Ground structure GS may comprise a conductive (e.g., metal) mesh or film. In the former instance, the size of the mesh and thickness of the mesh material may be tuned for isolation of desired EMI frequencies. Of course, ground structure GS is electrically isolated by a dielectric material from conductive traces on the top of die stack DS operably coupled to the semiconductor dice. In a further implementation of the structure of FIG. 5C, and as shown in broken lines, a radiofrequency antenna RF may be disposed over and electrically isolated by dielectric film D from ground structure GS and be operably coupled to one or more semiconductor dice of die stack DS. The radiofrequency antenna RF may be formed in situ to a configuration and thickness tuned to the intended wavelength of operation.

Figure 6A:
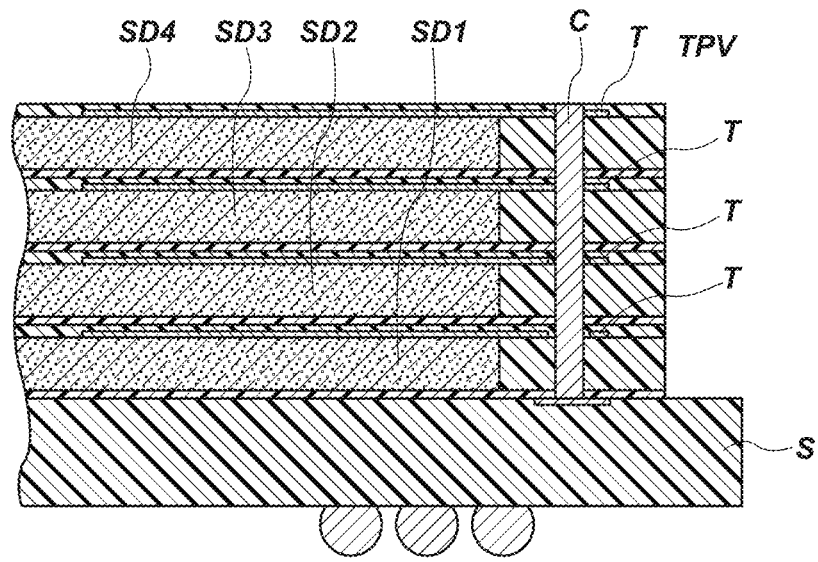
FIGS. 6A-6D are schematic illustrations of different example configurations of connections between conductive traces and conductive material of through poly vias.
Figure 6B:
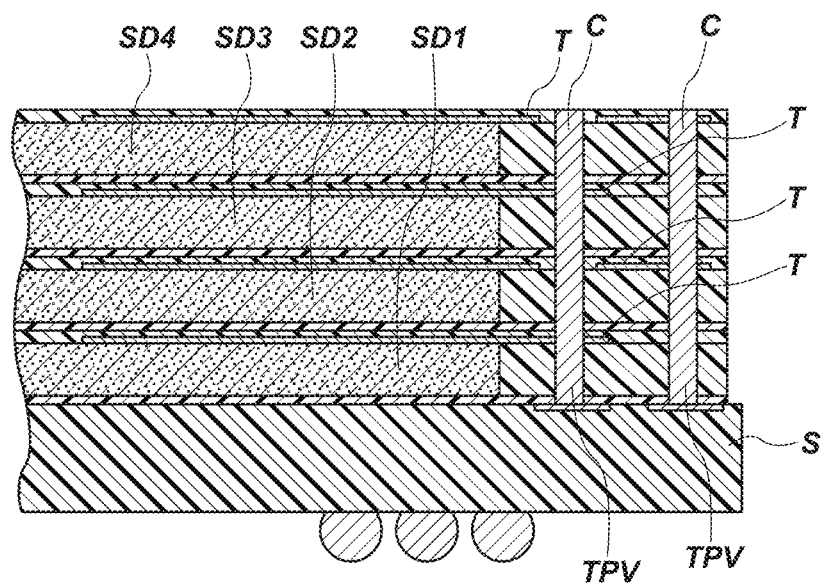
Figure 6C:
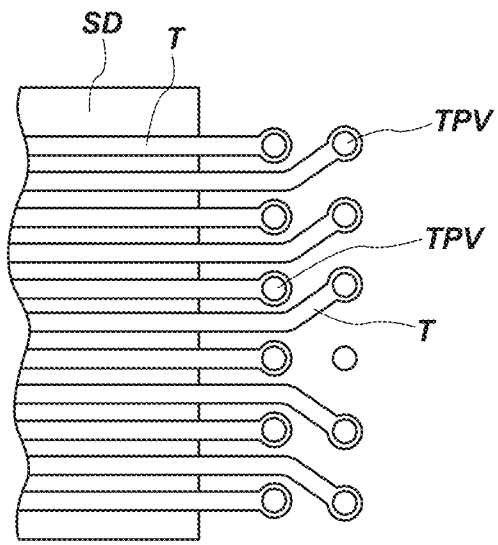
Figure 6D:
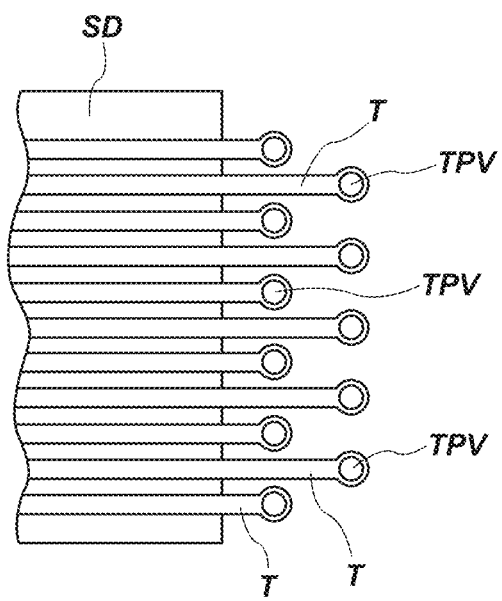

Further, it is contemplated that each level of conductive traces extending from bond pad locations on the various semiconductor dice, may be identical and extend to all conductive vias at each level as shown in FIGS. 1A1, 1A2, 2A and 3A, or may be customized so that some or all of the conductive trace patterns for a given semiconductor die level may be the same as or different than the conductive trace patterns of one or more other semiconductor die levels of the stack. For example, as shown in FIG. 6A, conductive traces T of third and fourth levels SD3 and SD4 of semiconductor dice SD1-SD4 may be operably coupled to conductor C of a TPV through physical and electrical contact with the sidewall of conductor C, while conductive traces T of the first and second levels SD1 and SD2 may be electrically isolated from the TPV with dielectric material surrounding conductor C. Accordingly, in some examples, signals generated by the circuitry of one semiconductor die, for example SD4, may be routed through conductor C of a TPV and received by circuitry of another die, for example SD3, as well as by circuitry of substrate S. Similarly, signals may be routed between circuitry of one semiconductor die, for example SD3, and another semiconductor die, for example, SD1 through a conductor C of one TPV and circuitry of substrate S through a conductor C of another TPV.

Where multiple rows of TPVs are employed, as shown in FIG. 6B, conductive traces T may, at different levels, extend from a semiconductor die SD to and operably couple to conductor C of TPVs of different rows. In the case of FIG. 6B, conductive traces T of the first and third levels SD1 and SD3 of semiconductor dice SD1-SD4 are operably coupled to conductors C of TPVs of an inner row, while the second and fourth levels SD2 and SD4 are operably coupled to conductors C of TPVs of an outer row. The rows of TPVs may, as noted before, may be aligned, in which case conductive traces T may extend from a semiconductor die SD and be routed around a TPV of an inner row to extend to a TPV of an outer row, as shown in FIG. 6C, while in cases where the rows of TPVs are staggered as shown in FIG. 6D, a conductive trace T may extend from a semiconductor die SD straight between the TPV of an inner row to reach a TPV of an outer row and couple with the conductor C thereof. With an arrangement of multiple rows of TPVs, signals may not only be selectively routed between and among circuitry of semiconductor dice SD1-SD4 and between circuitry of any of semiconductor dice SD1-SD4 and circuitry of substrate S through selective contact and selective electrical isolation of traces T with a given conductor C, but signals may also be routed up or down a given conductor C of one TPV from a trace T of one semiconductor die to a trace T on another semiconductor die, and back through a further trace T of the other semiconductor die to a conductor C of a different TPV of a different row, enhancing the potential number of available signal paths.

Figure 7:
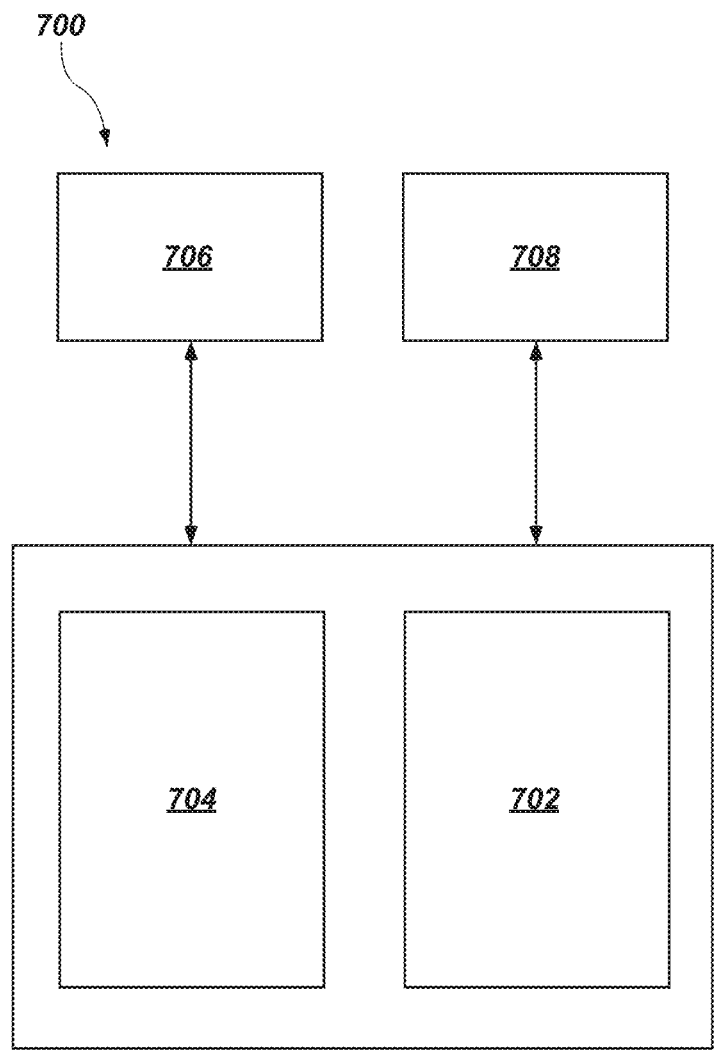
FIG. 7 is a block diagram of an electronic system incorporating one or more semiconductor packages according to embodiments of the disclosure.

FIG. 7 is a block diagram of an illustrative electronic system 700 according to embodiments of the disclosure. The electronic system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 700 includes at least one memory device 702. The memory device 702 may comprise, for example, an embodiment of a microelectronic device package previously described herein according to any of the embodiments of FIG. 1B, 2B or 3B. The electronic system 700 may further include at least one electronic signal processor device 704 (often referred to as a "microprocessor"). The electronic signal processor device 704 may, optionally, include an embodiment of a microelectronic device package previously described herein according to any of the embodiments of FIG. 1B, 2B or 3B. While the memory device 702 and the electronic signal processor device 704 are depicted as two (2) separate devices in FIG. 7, in additional embodiments, a single (e.g., only one) memory/processor device having the functionalities of the memory device 702 and the electronic signal processor device 704 is included in the electronic system 700. In such embodiments, the memory/processor device may include an embodiment of a microelectronic device package previously described herein according, for example, to the embodiment of FIG. 3B. The electronic system 700 may further include one or more input devices 706 for inputting information into the electronic system 700 by a user, such as, for example, a mouse or other pointing device, a keyboard, a touchpad, a button, or a control panel. The electronic system 700 may further include one or more output devices 708 for outputting information (e.g., visual or audio output) to a user such as, for example, a monitor, a display, a printer, an audio output jack, a speaker, etc. In some embodiments, the input device 706 and the output device 708 may comprise a single touchscreen device that can be used both to input information to the electronic system 700 and to output visual information to a user. The input device 706 and the output device 708 may communicate electrically with one or more of the memory device 702 and the electronic signal processor device 704.

A specific number of semiconductor dice in a given die stack have been mentioned as examples in the above-described embodiments, but the number of semiconductor dice in a stack is not so limited. For example, a stack of DRAM memory dice may comprise thirty-two dice, while a stack of NAND Flash dice may comprise as many as 128 or even 256 dice.

In addition, while specific types of semiconductor dice are mentioned as examples in the above-described embodiments, there is no limitation on the type or types of dice that may be stacked in a single die stack. In other words, other types of memory dice such as SRAM, HRAM, MRAM and FeRAM, among others, may be stacked. Further, logic dice, including memory controller dice, as well as processors, for example, graphics processor units (GPUs), audio processors, as well as ASICs including a processor core and memory blocks, in addition to conventional microprocessors may be stacked in combination with dice exhibiting other functionalities, such as logic and memory dice. Field Programmable Gate Arrays (FPGAs) are another example of stackable components.

The customization of each level of conductive traces obtainable with embodiments of the present disclosure allows case of operably coupling bond pads of different patterns and at different (e.g., centrally, multiple rows adjacent a centerline, peripheral on one or more sides) locations of semiconductor dice exhibiting different functions to peripherally located TPVs for connection to conductive pads and traces on a substrate for communication to higher-level packaging through conductive paths of the substrate extending to conductive elements. The implementation of FOP-configured RDLs bearing multiple levels of conductive traces adds even further flexibility for the ever-expanding numbers of pin connections for state of the art semiconductor dice. Further, in lieu of a conventional organic substrate, a silicon substrate comprising active circuitry may be employed. For example, embodiments of the disclosure may be employed to implement a wide I/O Hybrid Memory Cube architecture using DDR logic in the memory die stack without employing expensive TSVs while allowing greater memory density. Similarly, embodiments of the disclosure may be employed to implement a wide I/O High-Bandwidth Memory architecture using device logic in the memory die stack without employing expensive TSVs while allowing greater memory density.

Figure 8A:
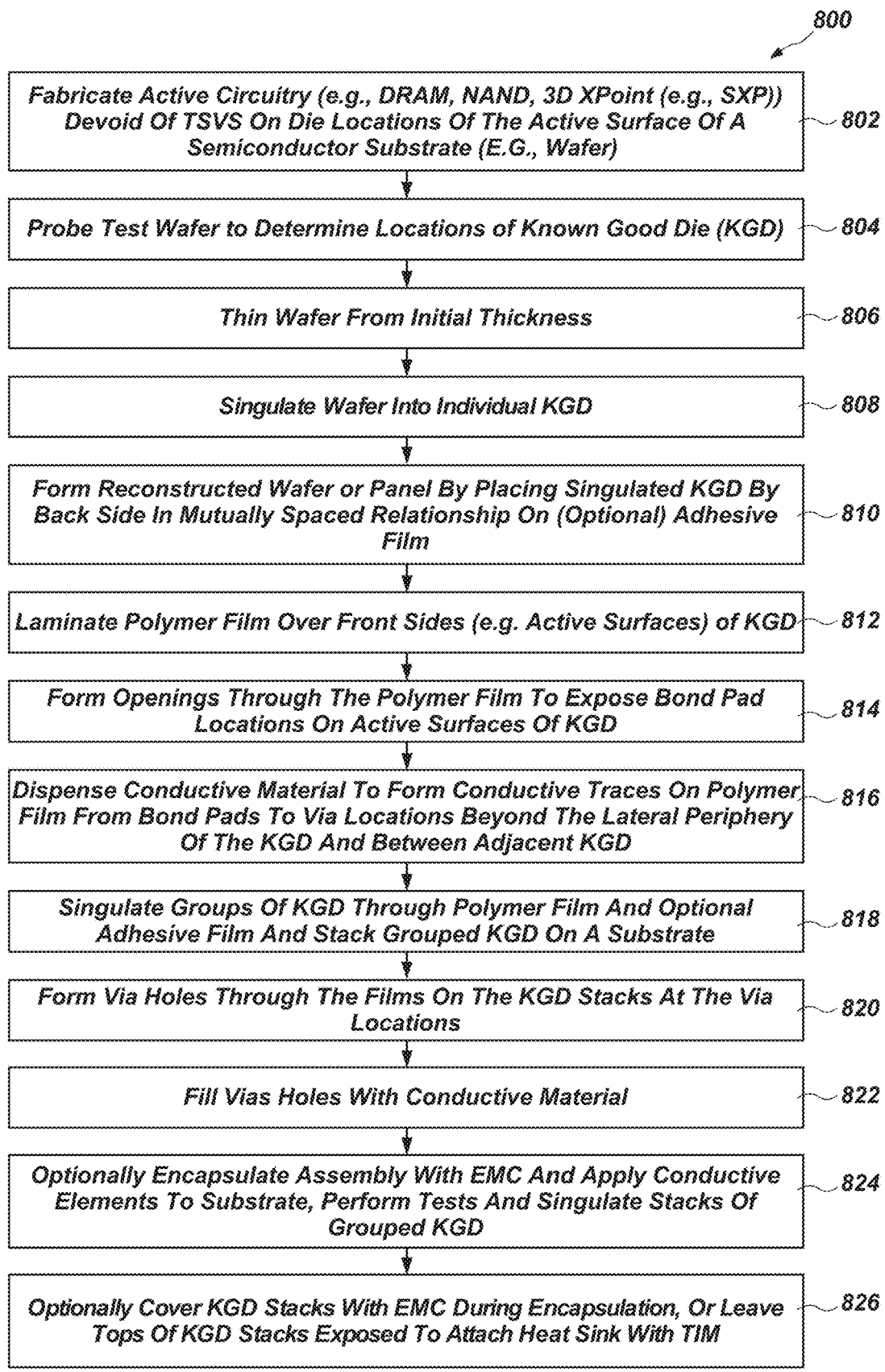
FIG. 8A is a flow diagram of an embodiment of a method for fabricating a microelectronic device package comprising multiple stacks of microelectronic devices according to the disclosure and FIG. 8B is a side sectional schematic of a microelectronic device package comprising multiple stacks of microelectronic devices according to an embodiment of the disclosure.

FIG. 8A is a flow diagram of an embodiment of a method 800 for fabricating a microelectronic device package comprising multiple stacks of microelectronic devices according to the disclosure. In act 802, active circuitry (e.g., DRAM, NAND, 3D Xpoint (e.g., SXP)) devoid of TSVs is fabricated on die locations of the active surface of a semiconductor substrate (e.g., wafer). In act 804, the wafer is probe tested to determine locations of known good die (KGD). The wafer is thinned in act 806, for example, from an initial thickness of about 600 μm to about 700 μm, for example to a thickness of about 5 μm to about 200 μm, and as specific non-limiting examples, to a thickness on the order of about 100 μm, about 50 μm, or about 30 μm. However, it is noted that the embodiment of the method is not limited to any particular die thickness. The wafer is then singulated (i.e., diced) using a conventional process (saw blade, laser, stealth (i.e., laser-induced street defects followed by fracture from radial expansion of carrier membrane), etc.) at act 808 into individual KGD. In act 810, a reconstructed wafer or panel of KGD is then (optionally) formed by placing and adhering singulated KGD by the back sides thereof in mutually spaced relationship on an adhesive film, for example a die attach film (DAF) or film over die (FOD) like material. A polymer film, for example a wafer or panel level film such as a non-conductive film (NCF) comprising a silica-filled epoxy, a b-staged polyimide film, a polytetrafluoroethylene (PTFE) film or other polymer film is laminated over the front sides (i.e., active surfaces) of the mutually spaced KGD of the reconstructed wafer or panel in act 812 and on the adhesive film, if present. In act 814, openings are formed (e.g., by laser ablation) through the polymer film to expose bond pad locations on the active surface of the KGD followed by, optionally, a solvent clean act to remove any residue on the bond pad locations resulting from the laser ablation to ensure a robust electrical connection between conductive traces to be formed in act 816 on the polymer film. A conductive material, for example, an Ag or Cu paste is dispensed to form conductive traces on the polymer film from the bond pads to predetermined via locations beyond the lateral peripheries of the KGD, and in some instances extending between adjacent KGD to be packaged together in act 816. Alternatively, the conductive traces may be applied by an ink jet technique. In act 818, the KGD are singulated using a dicing blade through the polymer film and optional adhesive film laterally outward of the predetermined via locations and around groups (e.g., two, three, four, etc.) KGD, and the groups of KGD stacked on a substrate, which may be a wafer-level substrate to be singulated into individual substrates and bearing multiple KGD stacks in mutually spaced relationship. In act 820, via holes, which may be referred to as through poly vias (TPVs) are formed, for example, by laser or patterning and anisotropic etching through the films in the KGD stacks at the via locations and extending to conductive pads or traces on an adjacent surface of the substrate. In act 822, a sintered Ag or Cu paste or other conductive material is employed to fill the vias by, for example, using an ink jet type applicator. As another approach, the vias may be filled with a Sn solder in a wave solder process. In act 824, the assembly may be (optionally) encapsulated with an epoxy molding compound (EMC), conductive elements applied to or formed on the substrate opposite the KGD stacks (for example, solder bumps in a ball grid array (BGA) format coupled to conductive paths extending to conductive pads or traces on the substrate surface adjacent the KGD stacks), testing performed and the KGD stacks singulated in groups of KGD stacks mutually operably coupled by conductive traces extending between the KGD stacks and through the EMC (if present) and substrate to form packages. In act 826, the tops of the KGD stacks may be covered with the EMC, or may be exposed, for example, for attachment of heat sinks with an interposed thermal interface material (TIM).

Figure 8B:
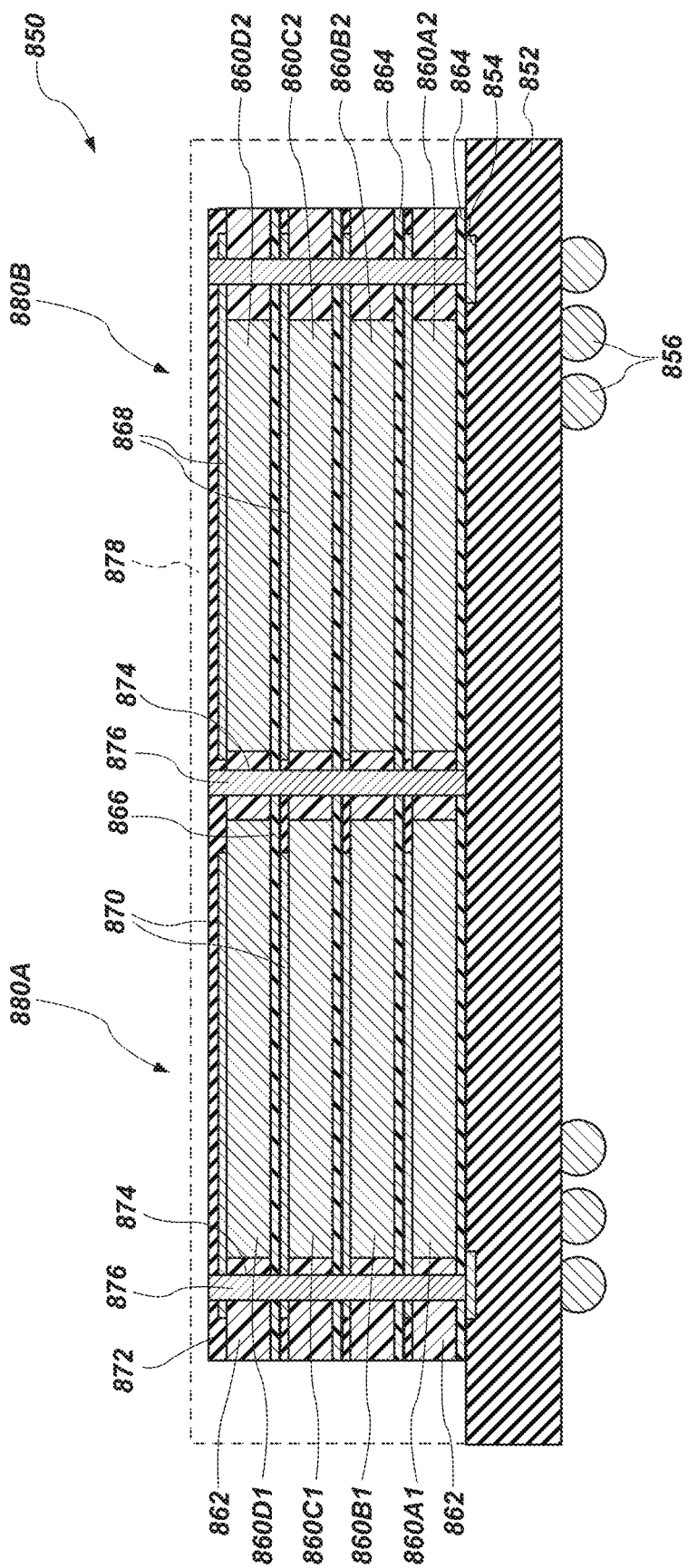

FIG. 8B is a side sectional schematic of a microelectronic device package 850 according to an embodiment of the disclosure, and which may be fabricated according to the method of FIG. 8A. Microelectronic device package 850 comprises a substrate 852 having traces (not shown) carried in a dielectric material and extending from conductive pads 854 on an upper surface thereof to conductive elements 856 on an opposing, lower surface thereof. Substrate 852 may comprise an organic or an inorganic (e.g., silicon) material, the latter allowing for smaller features and tighter pitches than the former. Conductive elements 856 may comprise, for example, solder balls formed on or applied to terminal pads on the underside of substrate 852. Multiple semiconductor dice 860A1-860D1 and 860A2-860D2, for example, dice configured as double data rate (DDRx) DRAM, NAND Flash or 3D Xpoint (e.g., SXP) memory, to be grouped in a package are stacked on the upper surface of substrate 852. Each level of semiconductor die 860A1 and 860A2, 860B1 and 860B2, 860C1 and 860C2 and 860D1 and 860D2 is laminated to a polymer film 862, for example, a non-conductive film (NCF), a b-staged polyimide film, or a polytetrafluoroethylene (PTFE) film extending beyond at least one lateral periphery of the respective die 860A1-860D1, 860A2-860D2 on one or more sides thereof (two sides shown). Each level of semiconductor die 860A1 and 860A2, 860B1 and 860B2, 860C1 and 860C2 and 860D1 and 860D2 may be attached to a DAF 864 on the back side 866 thereof. The DAF may be eliminated if an NCF exhibiting sufficient adhesive characteristics for lamination purposes is employed. Conductive traces 868 in the form of a redistribution layer (RDL) extend from bond pad locations (not shown) on active surfaces 870 of each level of semiconductor die 860A1 and 860A2, 860B1 and 860B2, 860C1 and 860C2 and 860D1 and 860D2 laterally outwardly over upper surfaces 872 of polymer films 862 and in at least some instances between adjacent die of a given level in different stacks at least to locations of vias 874 filled with conductive material 876 extending between semiconductor dice 860A1-860D1 and semiconductor die 860A2 and 860D2 and to conductive pads 854 of substrate 852. As shown in broken lines, semiconductor dice 860A1-860D1 and 860A2-860D2 may be encapsulated in, for example, an EMC 878 extending at least around the lateral peripheries of, and between, die stacks 880A and 880B and abutting the upper surface of substrate 852. The EMC 878 may extend over the uppermost semiconductor die 860D1 and 860D2 as shown. The EMC 878 may, alternatively, leave the active surface 870 and conductive traces 868 uppermost semiconductor die 860D1 and 860D2 uncovered, to be covered by a thin dielectric layer, which may comprise a thermal interface material (TIM), and a heat sink, for enhanced heat transfer from the microelectronic device package 850. In one implementation, there may be only one Master die in the package, for example semiconductor die 860A1 to control all of the other Slave die (i.e., 860B1-860D1 and 860A2-860D2) in the microelectronic device package 850, such control being allowed by conductive traces extending between the die stacks as depicted in FIG. 8B and described with respect to FIG. 8A. Alternatively, there may be a separate Master die, for example 860A1 and 860A2, for each respective associated stack of Slave die, 860B1-860D1 and 860A2-860D2, with communication between the die stacks operable through the conductive traces 868. Thus, Master/Slave die stacks may, if desired, be split across package channels. If a package is height-limited but a large number of die (e.g., sixteen, thirty-two) are required, both approaches may spread the die across a greater footprint in multiple die stacks, and the first approach may allow for multiple, even lower die stacks, each with Slave die linked to a single Master die in one stack. In another implementation, a logic die configured as a memory controller may be employed instead of a Master die at the base of each semiconductor die stack, or one logic die may be deployed at the bottom of a semiconductor die stack and operably coupled with memory die in multiple stacks.

The embodiment of FIGS. 8A and 8B may provide a significant cost reduction in comparison to current 3D package flow, in that through silicon vias (TSVs) are eliminated, and no post wafer fabrication acts to form complex back-end-of-line (BEOL) structures are required. DRAM, NAND or SXP memory may be easily stacked in levels, each comprising multiple die, in the assembly flow. Further, this embodiment allows the use of different conductive trace patterns for each different die level, and allows for separate address pins. Further, power and/or ground for each die may be tied together or be individualized. As noted above with respect to FIG. 5C, EMI shielding in the form of a Faraday cage or grounding areas may be incorporated into the redistribution layer (RDL) over and between the top die only or for each die level.

Figure 9A:
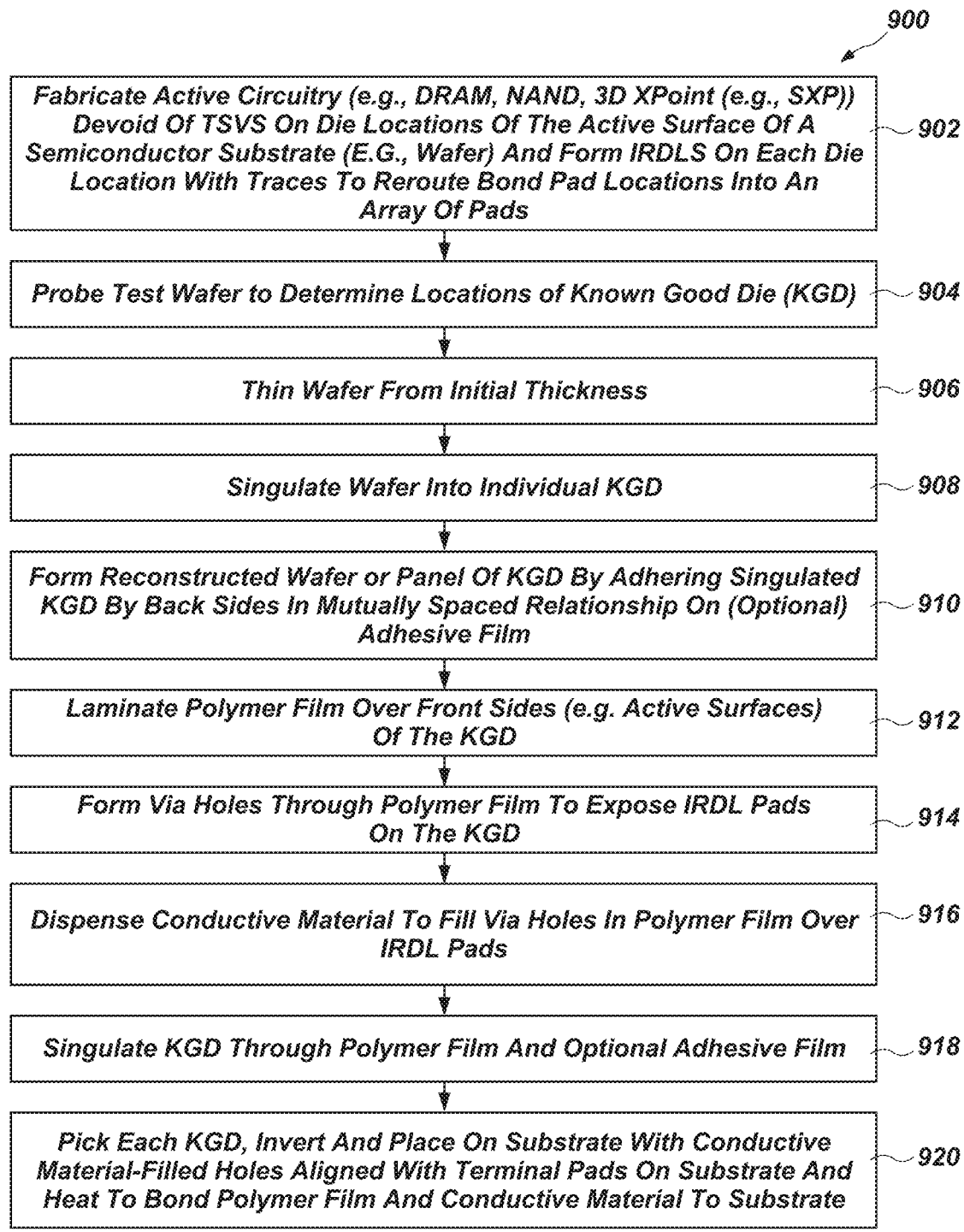
FIG. 9A is a flow diagram of an embodiment of a method according to the disclosure for fabricating a microelectronic device for direct chip attach to a substrate and FIG. 9B depicts the process sequence described with respect to FIG. 9A.
Figure 9B:
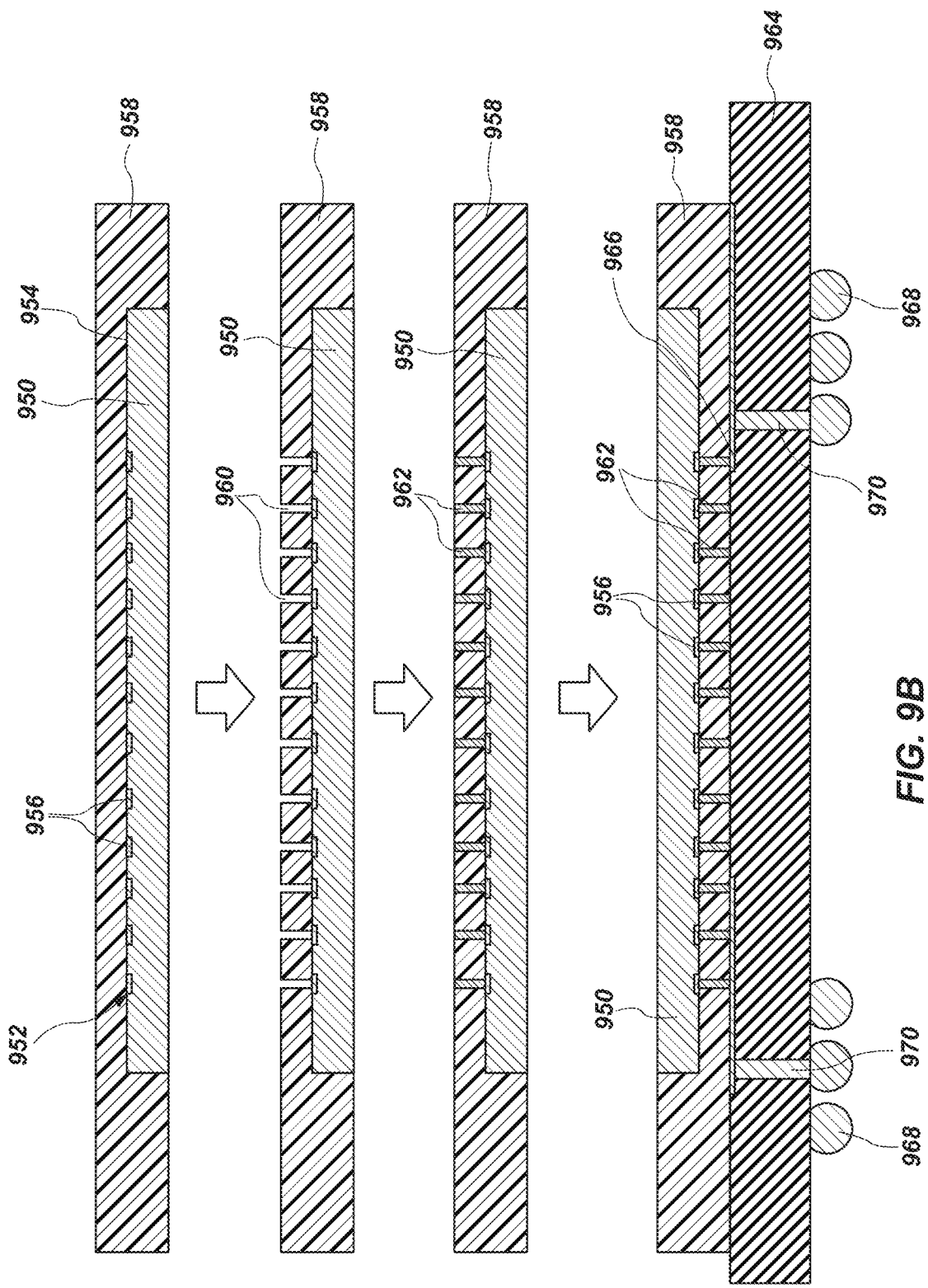

A conventional die to substrate attachment technique for high power, high data rate, high I/O count devices (e.g., memory controllers, ASIC, etc.) is direct chip attach (DCA), DCA allows for optimal signal and power/ground placement between die and the package substrate, and more physical area to place (conceptually the entire die area) over which to distribute connections. However, commodity memory is now pushing into power/signaling space, and could benefit from DCA, as described with respect to FIGS. 3A and 3B above, but for the cost of tooling and manufacturing, which is a significant barrier. An optimal solution would enable the flexibility of DCA at the cost of bond wires. Existing options to DCA include Chip Scale Package (CSP) and Fan Out Package (FOP) approaches, neither of which provides the advantages of DCA at a low cost. In the embodiment of FIGS. 9A and 9B, the use of through poly vias (TPVs) as described above may be adapted to exhibit the functionality of DCA but at a lower cost using die incorporating iRDL structures formed in post wafer fabrication processes and including traces to reroute bond pads into an array pattern suitable for a DCA-like attach to a substrate.

FIG. 9A is a flow diagram of an embodiment of a method 900 for fabricating a microelectronic device for direct chip attach to a substrate according to the disclosure. In act 902, active circuitry (e.g., DRAM, NAND, 3D Xpoint (e.g., SXP)) devoid of TSVs is fabricated on die locations of the active surface of a semiconductor substrate (e.g., wafer), and iRDLs are formed on each die location with traces to reroute bond pad locations on active surfaces of the die into an array of Cu pads. In act 904, the wafer is probe tested to determine locations of known good die (KGD). The wafer is thinned in act 906, for example, from an initial thickness of about 600 μm to about 700 μm, for example to a thickness of about 5 μm to about 200 μm, and as specific non-limiting examples, to a thickness on the order of about 100 μm, about 50 μm, or about 30 μm. However, it is noted that the embodiment of the method is not limited to any particular die thickness. The wafer is then singulated (i.e., diced) using a conventional process (saw blade, laser, stealth (i.e., laser-induced street defects followed by fracture from radial expansion of carrier membrane), etc.) at act 908 into individual KGD. In act 910, a reconstructed wafer or panel of KGD is then (optionally) formed by placing and adhering singulated KGD by the back sides thereof in mutually spaced relationship on an adhesive film, for example a die attach film (DAF) or film over die (FOD) like material. A film, for example a wafer or panel level film such as a non-conductive film (NCF) comprising a silica-filled epoxy, a b-staged polyimide film, a polytetrafluoroethylene (PTFE) film or other polymer film is laminated over the front sides (i.e., active surfaces) of the mutually spaced KGD of the reconstructed wafer or panel in act 912 on the KGD and the adhesive film, if present. In act 914, via holes are formed (e.g., by laser ablation) through the polymer film to expose iRDL pads on the active surface of the KGD followed by, optionally, a solvent clean act to remove any residue on the iRDL pads resulting from the laser ablation. A conductive material, for example, an Ag or Cu paste is dispensed to fill the via holes, or another conductive material by an ink jet technique, in act 916. As another approach, the via holes may be filled with a Sn solder in a wave solder process. In act 918, the KGD are singulated using a dicing blade through the polymer film laterally outward of the die footprint and of predetermined via locations, shown in broken lines, of TPVs for connecting other, higher die in a stack to be formed as described above with respect to FIGS. 3A and 3B. In act 920, each singulated KGD may be picked, inverted and placed on a substrate with the conductive material-filled via holes in the polymer film aligned with terminal pads on upper surface of the substrate, followed by heating of the assembly to adhere the die to the substrate through curing of the polymer film and bonding of the conductive material in the via holes to the terminal pads.

As shown in FIG. 9B, which depicts the process sequence described with respect to FIG. 9A, a semiconductor die 950 bearing an iRDL 952 on active surface 954 of semiconductor die 950 has bond pads (not shown) rerouted to (for example Cu) iRDL pads 956, this structure having a polymer film such as an NCF, b-stage polyimide film or PTFE film 958 laminated thereover. Via holes 960 are then formed, as by laser ablation, in polymer film 958 to expose the iRDL pads 956. An Ag, Cu, solder or other conductive fill material is introduced to fill via holes 960 and form conductive contacts 962. Semiconductor die 950 is then inverted and placed on substrate 964, which may be an organic or inorganic (e.g., silicon) substrate, with the conductive contacts 962 of semiconductor die 950 aligned with terminal pads 966 of substrate 964. The assembly is then heated to adhere the semiconductor die 950, by polymer film 958 and conductive contacts 962, to substrate 964 and terminal pads 966, respectively. For example, a thermocompression bonding tool may be employed for die placement accuracy and heating to obtain adhesion of the polymer film. In the case of an NCF, the heating temperature would be above the glass transition temperature (Tg) of the material. As shown, terminal pads 966 are connected to conductive elements 968 (e.g., solder balls) on the opposite side of substrate 964 by traces and vias comprising conductive paths 970. While a single die package is illustrated, if desired, a stacked die assembly may then be completed and, optionally, packaged, as depicted and described with respect to FIGS. 3A and 3B herein with a lowermost Master die connected to the substrate as described. Of course, the process and resulting die as described may be employed with a die exhibiting any functionality, and is not limited to memory.

Figure 9C:
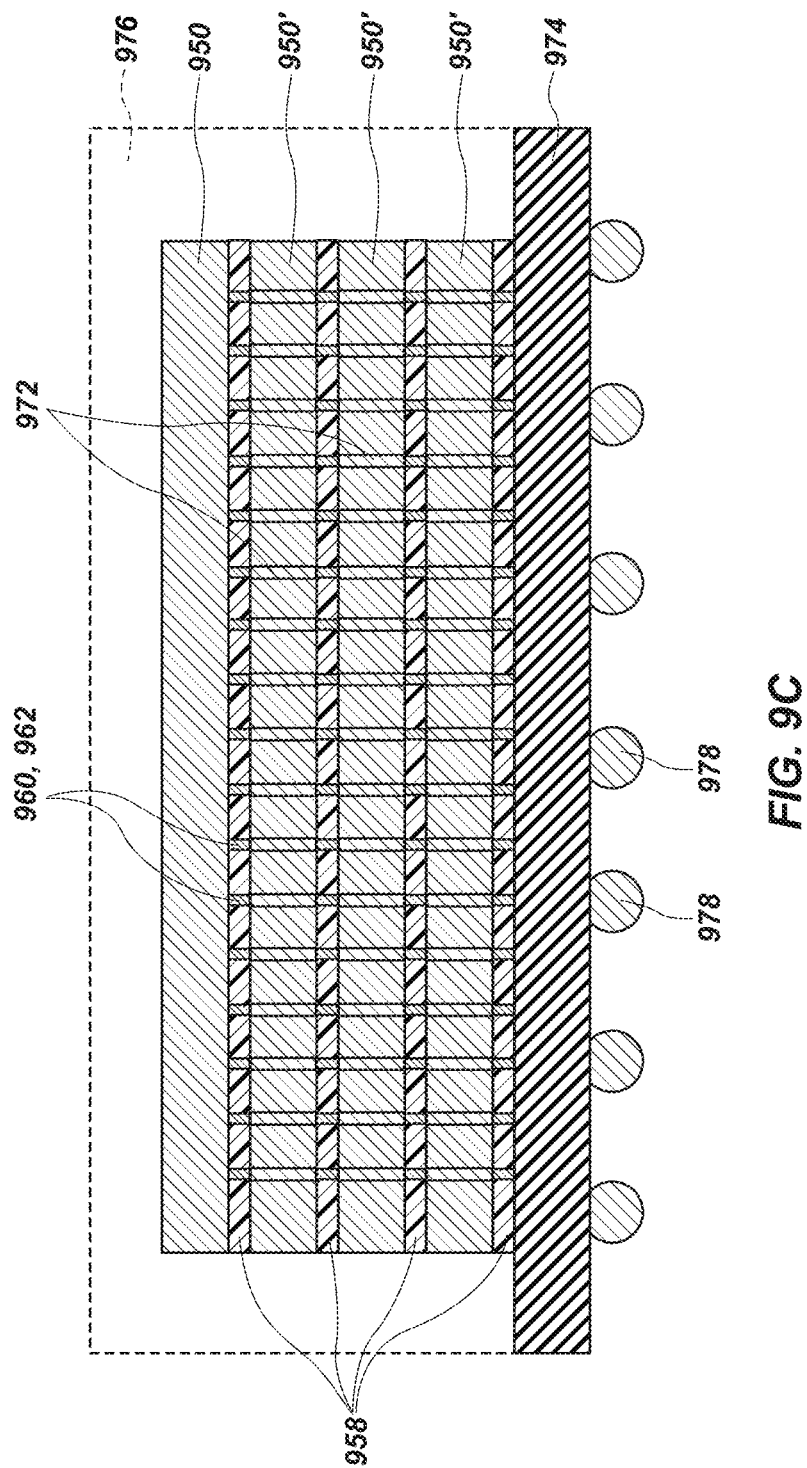
FIG. 9C depicts an additional implementation of the embodiment of FIGS. 9A and 9B for forming a die stack.

As a potential additional implementation of the embodiment of FIGS. 9A and 9B, and as depicted in FIG. 9C, die stacks DS may be fabricated using multiple semiconductor die 950' below uppermost semiconductor die 950 equipped with TSVs 972, then provided with a dielectric (e.g., polymer) film 958 having via holes 960 aligned with TSVs 972 and filled with conductive fill material forming conductive contacts 962. The semiconductor die 950 and 950' may then be stacked on a base wafer or other substrate 974 in laterally spaced relationship, and physically and electrically connected by heating to cure the polymer film in the bond lines between the die and between the lowermost die and the substrate, after which the assembly may be encapsulated with an EMC 976, and solder bumps 978 applied to the base wafer or substrate, both as shown in broken lines, after which completed packages may be singulated, as known in the art. Using such an approach, the conventional use of Cu pillars, in some instances capped by solder, and thermocompression bonding of a die stack, may be avoided.

Figure 10A:
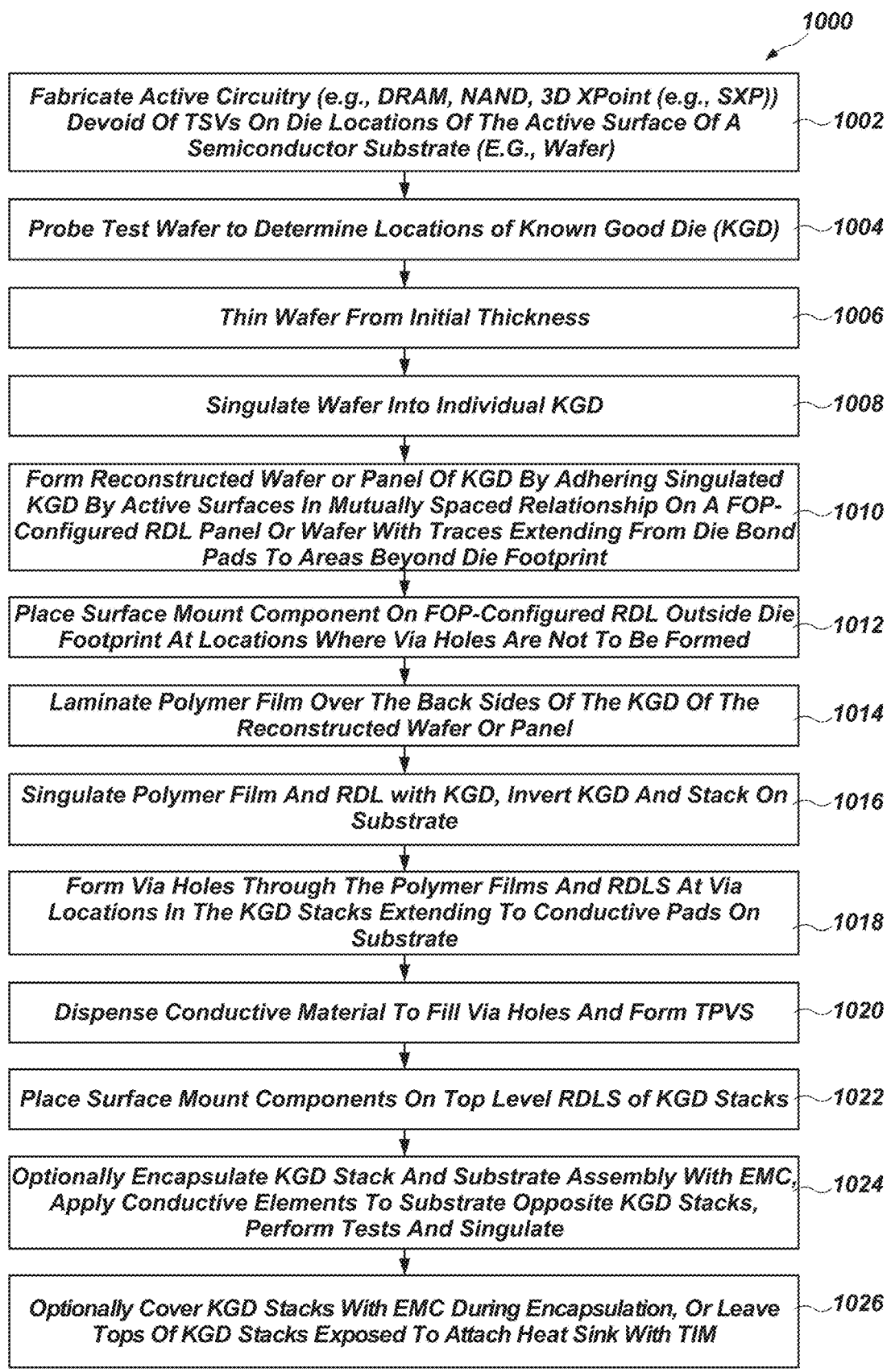

Referring now to FIGS. 10A-10D, in a further embodiment, the architecture of the previously described die assemblies may be further adapted to provide additional advantages in packaging and performance by incorporating surface mount components at various levels of semiconductor die in a die stack outside the footprint of the die of the stack. FIG. 10A is a flow diagram of an embodiment of a method 1000 for fabricating a microelectronic device assembly incorporating surface mount components according to the disclosure. In act 1002, active circuitry (e.g., DRAM, NAND, 3D XPoint (e.g., SXP)) devoid of TSVs is fabricated on die locations of the active surface of a semiconductor substrate (e.g., wafer). In act 1004, the wafer is probe tested to determine locations of known good die (KGD). The wafer is thinned in act 1006, for example, from an initial thickness of about 600 µm to about 700 µm, for example to a thickness of about 5 µm to about 200 µm, and as specific non-limiting examples, to a thickness on the order of about 100 µm, about 50 µm, or about 30 µm. However, it is noted that the embodiment of the method is not limited to any particular die thickness. The wafer is then singulated (i.e., diced) using a conventional process (saw blade, laser, stealth (i.e., laser-induced street defects followed by fracture from radial expansion of carrier membrane), etc.) at act 1008 into individual KGD. In act 1010, a reconstructed wafer or panel of KGD is then (optionally) formed by placing and adhering singulated KGD by the active surfaces thereof in mutually spaced relationship on a fan out package (FOP) configured RDL panel or wafer with traces extending from bond pads of the die to areas beyond the die footprints. In act 1012, surface mount components (e.g., capacitors, resistors, inductors) may be placed or have been previously formed on the FOP-configured RDL panel or wafer adjacent to but outside the footprint of the semiconductor die at locations where via holes are not to be formed. In act 1014, a polymer film, for example a wafer or panel level film such as a non-conductive film (NCF) comprising a silica-filled epoxy, a b-staged polyimide film, a polytetrafluoroethylene (PTFE) film or other polymer film is laminated over the back sides side of the mutually spaced KGD of the reconstructed wafer or panel. In act 1016, the polymer film bearing the KGD and the FOP-configured RDL is singulated with a dicing blade and the individual KGD each with an RDL are inverted and stacked on a base wafer or other substrate. In act 1018, via holes, which may be referred to as through poly vias (TPVs) are formed, for example, by laser or patterning and anisotropic etching through the RDLs and polymer films in the KGD stacks at the via locations and extending to conductive pads or traces on an adjacent surface of the substrate. In act 1020, a sintered Ag or Cu paste is dispensed, or other conductive material is employed, to fill the via holes by, for example, using an ink jet type applicator and form through poly vias (TPVs). As another approach, the vias may be filled with a Sn solder in a wave solder process. In act 1022, surface mount components (e.g., capacitors, resistors, inductors) may be placed or have been previously formed on and operably coupled to the RDL of the top level die of each KGD stack, as well as to other die as desired through conductive material of one or more TPVs. In act 1024, the KGD stack and substrate assembly may be optionally encapsulated with an epoxy molding compound (EMC), conductive elements applied to or formed on the substrate opposite the KGD stacks (for example, solder bumps in a ball grid array (BGA) format coupled to conductive paths extending to conductive pads or traces on the substrate surface adjacent the KGD stacks), testing performed and the KGD stacks singulated through the EMC (if present) and substrate to form packages. In act 1026, the tops of the die stacks may be covered with the EMC, or may be exposed, for example, for attachment of heat sinks with a thermal interface material (TIM) if surface mount components are mounted internal to the die stack and not over the top level die.

As depicted in drawings FIGS. 10B1-10D, the fabrication process described with respect to FIG. 10A may be implemented to form different die assemblies. For example, FIG. 10B1 is a side sectional schematic elevation and FIG. 10B2 is a top schematic elevation of a microelectronic device package 1050B according to an embodiment of the disclosure, and which may be fabricated in according to the method of FIG. 10A. Although illustrated as a memory device package comprising a stack of memory die, the structure is not so limited. Microelectronic device package 1050B comprises a substrate 1052 having traces (not shown) carried in a dielectric material and extending from conductive pads 1054 on an upper surface thereof to conductive elements 1056 on an opposing, lower surface thereof. Conductive elements 1056 may comprise, for example, solder balls formed on or applied to terminal pads of substrate 1052. Multiple semiconductor dice 1060A-1060D, for example dice configured as double data rate (DDRx) DRAM, NAND Flash or 3D XPoint (e.g., SXP) memory, are stacked on the upper surface of substrate 1052. Each semiconductor die 1060A-1060D is laminated on its back side to a polymer film 1062, for example, a non-conductive film (NCF), a b-staged polyimide film, a polytetrafluoroethylene (PTFE) film or other polymer film extending beyond a lateral periphery of the respective die 1060A-1060D on one or more sides thereof (two sides shown in FIG. 10B1, four sides in FIG. 10B2). An FOP-configured RDL 1066 bearing conductive traces 1068 is secured to the active surface 1070 of each semiconductor die 1060A-1060D, conductive traces 1068 extending through or over RDLs 1066 from bond pad locations (not shown) on the active surfaces 1070 of each semiconductor die 1060A-1060D laterally outwardly at least to locations of vias 1074 filled with conductive material 1076 (i.e., TPVs) extending between semiconductor dice 1060A-1060D and to conductive pads 1054 of substrate 1052. In this implementation, one or more surface mount components (e.g., capacitors, resistors, inductors) SM (one shown), for example decoupling capacitors, are mounted to the uppermost RDL 1066 and operably coupled thereto, as well as optionally to one or more TPVs. As depicted in FIG. 10B2, the surface mount component SM may be mounted over one or more TPV locations, and be connected to conductive traces 1068 of the uppermost RDL. As shown in broken lines, semiconductor dice 1060A-1060D may then be encapsulated in, for example, an EMC 1078 extending at least around the lateral periphery of die stack 1080 and abutting the upper surface of substrate 1052. The EMC 1078 may extend over the uppermost semiconductor die 1060D as shown.

FIG. 10C1 is a side sectional schematic elevation and FIG. 10C2 is a top schematic elevation of a microelectronic device package 1050C according to an embodiment of the disclosure, and which may be fabricated in according to the method of FIG. 10A. Although illustrated as a memory device package comprising a stack of memory die, the structure is not so limited. Microelectronic device package 1050C comprises a substrate 1052 having traces (not shown) carried in a dielectric material and extending from conductive pads 1054 on an upper surface thereof to conductive elements 1056 on an opposing, lower surface thereof. Conductive elements 1056 may comprise, for example, solder balls formed on or applied to under bump metallization (UBM) of substrate 1052. Multiple semiconductor dice 1060A-1060D, for example dice configured as double data rate (DDRx) DRAM, NAND Flash or 3D XPoint (e.g., SXP) memory, are stacked on the upper surface of substrate 1052. Each semiconductor die 1060A-1060D is laminated on its back side to a polymer film 1062, for example, a non-conductive film (NCF), a b-staged polyimide film, a polytetrafluoroethylene (PTFE) film or other polymer film extending beyond a lateral periphery of the respective die 1060A-1060D on one or more sides thereof (two sides shown in FIG. 10C1, four sides in FIG. 10C2). A FOP-configured RDL 1066 bearing conductive traces 1068 is secured to the active surface 1070 of each semiconductor die 1060A-1060D, conductive traces 1068 extending through or over RDLs 1066 from bond pad locations (not shown) on the active surfaces 1070 of each semiconductor die 1060A-1060D laterally outwardly at least to locations of vias 1074 filled with conductive material 1076 (i.e., TPVs) extending between semiconductor dice 1060A-1060D and to conductive pads 1054 of substrate 1052. In this implementation, one or more surface mount components (e.g., capacitors, resistors, inductors) SM (two shown), for example decoupling capacitors, are each mounted to an RDL 1066 internal to the assembly and operably coupled to traces 1068 thereof, as well as optionally to one or more TPVs by RDL traces 1068 extending from surface mount component SM locations to TPV locations. As depicted in FIG. 10C2, the internally located surface mount components SM may be mounted spaced from TPV locations. As shown in broken lines, semiconductor dice 1060A-1060D may then be encapsulated in, for example, an EMC 1078 as extending at least around the lateral periphery of die stack 1080 and abutting the upper surface of substrate 1052. The EMC 1078 may extend over the uppermost semiconductor die 260D as shown. The EMC 1078 may, alternatively, leave the uppermost RDL 1066 uncovered, to be covered by a thin dielectric layer, which may comprise a thermal interface material (TIM), and a heat sink, for enhanced heat transfer from the microelectronic device package 1050C.

Figure 10D:
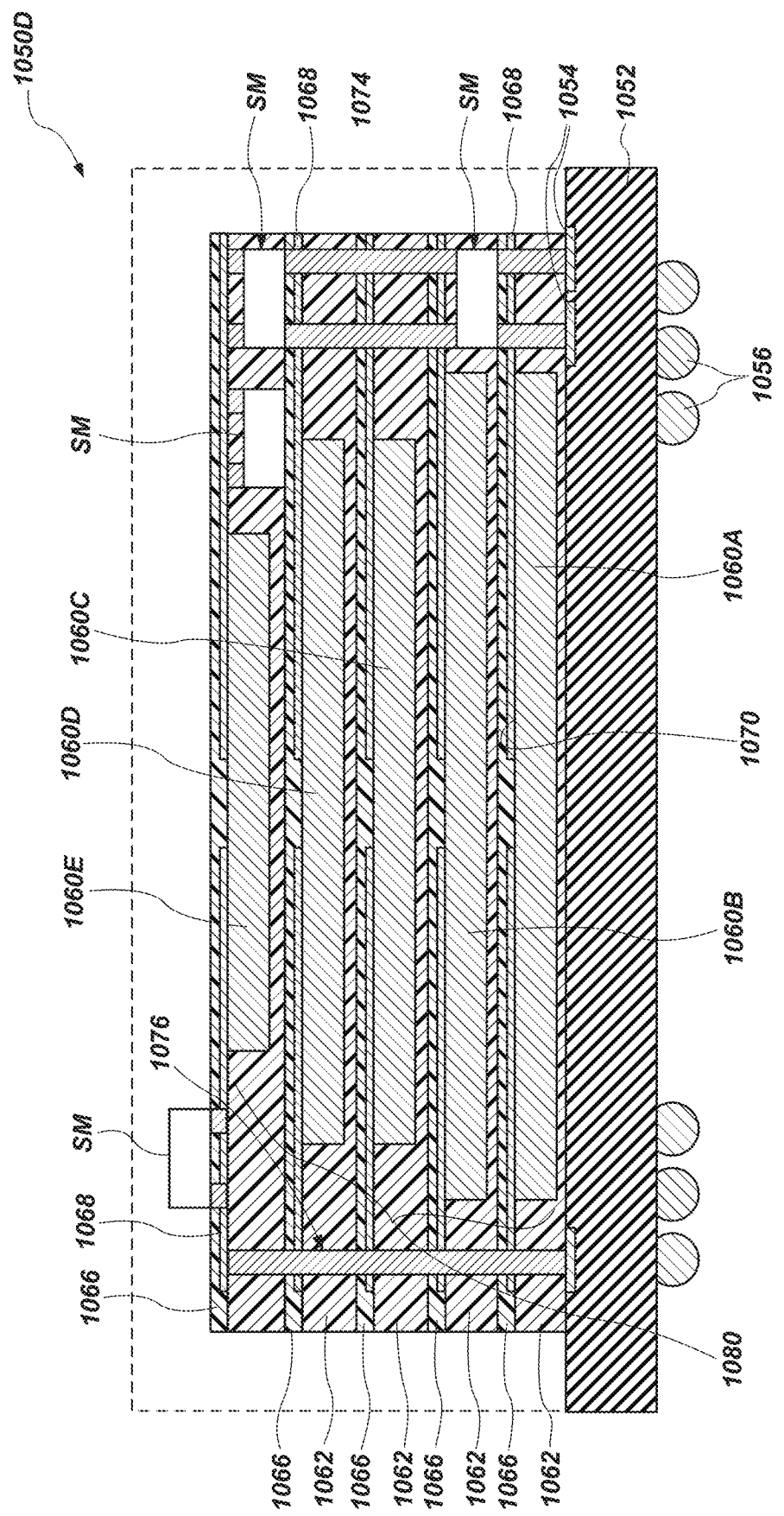

FIG. 10D is a side sectional schematic elevation of a microelectronic device package 1050D according to an embodiment of the disclosure, and which may be fabricated in according to the method of FIG. 10A. Although illustrated as a memory device package comprising a stack of memory die and a controller die, which may, for example be configured as a managed NAND (mNAND) package, the structure is not so limited. Microelectronic device package 1050D comprises a substrate 1052 having traces (not shown) carried in a dielectric material and extending from conductive pads 1054 on an upper surface thereof to conductive elements 1056 on an opposing, lower surface thereof. Conductive elements 1056 may comprise, for example, solder balls formed on or applied to under bump metallization (UBM) of substrate 1052. Multiple semiconductor dice 1060A-1060E, for example dice configured as NAND Flash or 3D XPoint (e.g., SXP) memory (die 1060A and 1060D), low-power DRAM (LPDRAM) die 1060C and 1060D and as a controller die (die 1060E) are stacked on the upper surface of substrate 1052. However, other numbers and combinations of die exhibiting different functionalities may be fabricated incorporating surface mount components. Further, if a controller die, ASIC or other relatively higher power density device is deployed at the top of the die stack, a thermally conductive material, such as a copper plate or other heat sink structure (not shown), may be placed between the uppermost die and the relatively lower power density memory dice below. Such an approach is applicable to all of the embodiments of the disclosure. Each semiconductor die 1060A-1060E is laminated on its back side to a polymer film 1062, for example, a non-conductive film (NCF), a b-staged polyimide film, a polytetrafluoroethylene (PTFE) film or other polymer film extending beyond a lateral periphery of the respective die 1060A-1060D on one or more sides thereof (two sides shown in FIG. 10D). An FOP-configured RDL 1066 bearing conductive traces 1068 is secured to the active surface 1070 of each semiconductor die 1060A-1060E, conductive traces 1068 extending through or over RDLs 1066 from bond pad locations (not shown) on the active surfaces 1070 of each semiconductor die 1060A-1060E laterally outwardly at least to locations of vias 1074 filled with conductive material 1076 (i.e., TPVs) extending between semiconductor dice 1060A-1060E and to conductive pads 1054 of substrate 1052. In this implementation, one or more surface mount components (e.g., capacitors, resistors, inductors) SM (two shown), for example decoupling capacitors, are each mounted to (one above, one below) an uppermost RDL 1066 and operably coupled to traces 1068 thereof. Two other surface mount components SM are mounted to RDLs 1066 internal to the assembly and operably coupled to traces 1068 thereof, as well as optionally to one or more TPVs by RDL traces 1068 extending from surface mount component SM locations to TPV locations. As depicted in FIGS. 10B2 and 10C2, the internally located surface mount components SM may be mounted spaced from TPV locations, while a top mounted surface mount component may be mounted anywhere over the uppermost RDL. As shown in broken lines, semiconductor die 1060A-1060E may then be encapsulated in, for example, an EMC 1078 extending at least around the lateral periphery of die stack 1080 and abutting the upper surface of substrate 1052. The EMC 1078 may extend over the uppermost semiconductor die 1060E as shown.

The embodiments of FIGS. 10A-10D use the additional surface area of the FOP-configured RDLs outside the footprint of each die to incorporate surface mount components (e.g., capacitors, resistors, inductors) in close proximity to each die of a stacked die package. If located internally within a die stack on an internal RDL, the surface mount components may not increase package height, and the additional vertical spacing between inter-die bond lines provided by the thickness of the die may allow for the use of larger (i.e., thicker) surface mount components. Further, surface mount component placement may be optimized with respect to each die, and placement of decoupling capacitors for stable power delivery close to a die is particularly beneficial, due to reduction in loop inductance and resistance. In comparison, due to manufacturing design rule check (DRC) rules, it is not possible to place substrate-mounted decoupling capacitors in close proximity to the die bond pads. In addition, removal of surface mount components from the substrate of a package provides more signal routing space on the substrate.

Figure 11A:
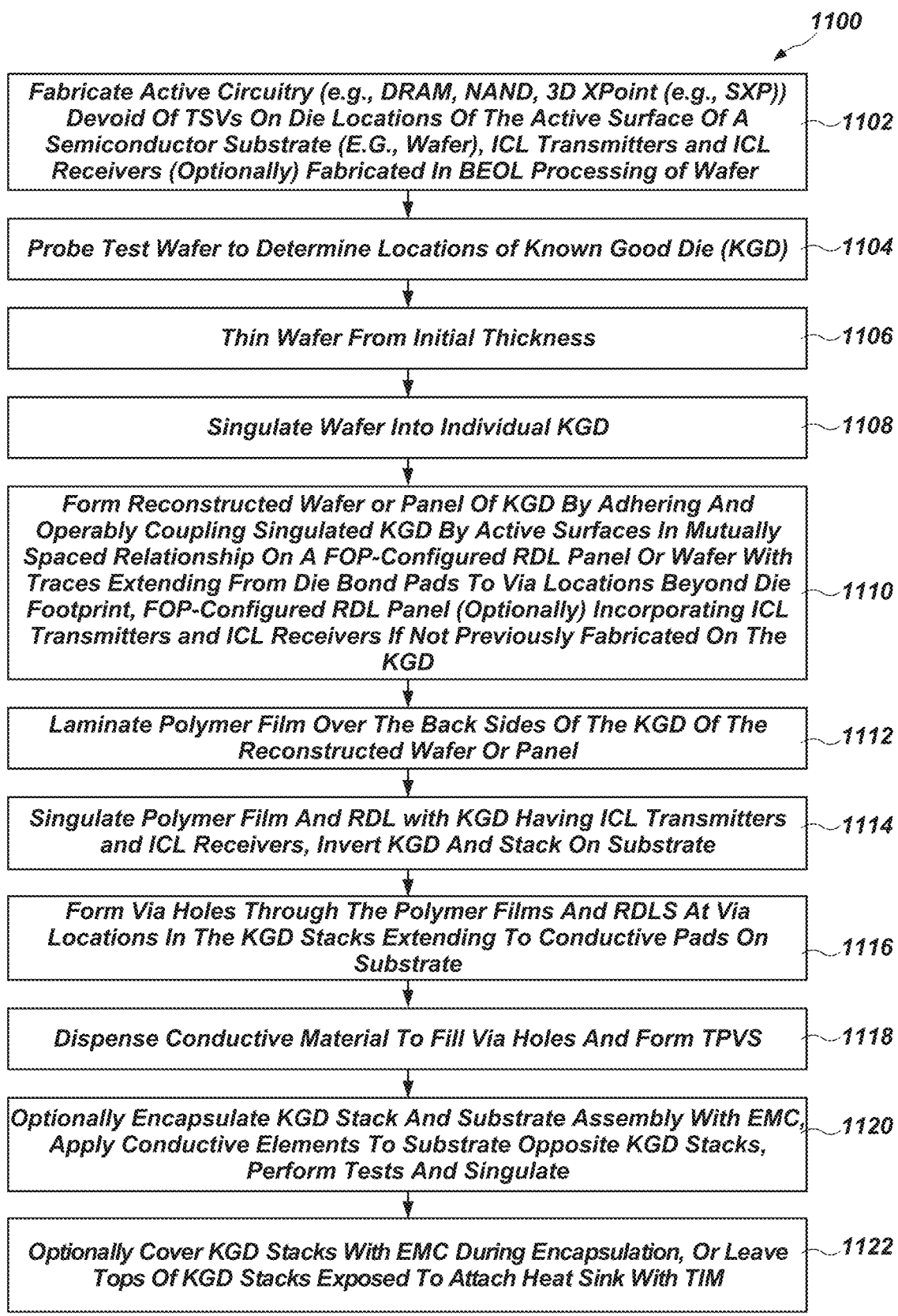
FIG. 11A is a flow diagram of an embodiment of a method for fabricating a microelectronic device assembly incorporating inductive coupling loops (ICLs) for data signal transmission and through poly vias (TPVs) for power and ground bias according to the disclosure and FIG. 11B is a side sectional schematic elevation of a microelectronic device package according to an embodiment of the disclosure which may be fabricated according to the method of FIG. 11A.
Figure 11B:
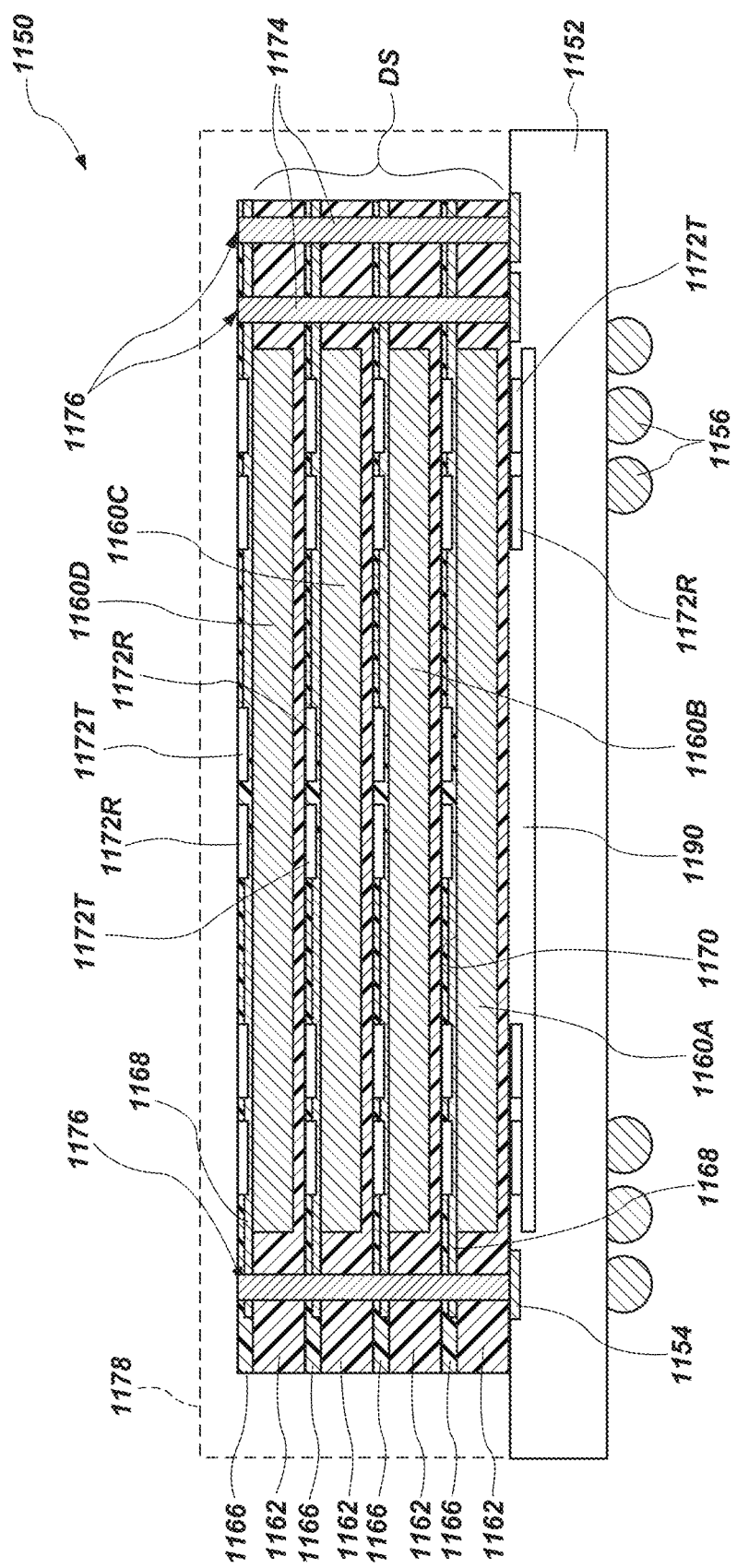

Referring now to yet another embodiment, FIGS. 11A and 11B, respectively, depict a process sequence for fabricating a microelectronic device package employing inductive coupling loops for data signal transmission and TPVs for power and ground/bias signal transmission, and a side sectional schematic elevation of a microelectronic device package, according to embodiments of the disclosure.

FIG. 11A is a flow diagram of an embodiment of a method 1100 for fabricating a microelectronic device assembly incorporating inductive coupling links (ICLs) for data signal transmission and TPVs for power and ground/bias signal transmission, according to embodiments of the disclosure. In act 1102, active circuitry (e.g., DRAM, NAND, 3D XPoint (e.g., SXP)) devoid of TSVs is fabricated on die locations of the active surface of a semiconductor substrate (e.g., wafer). In one implementation, inductively coupled link (ICL) transmitters and ICL receivers may be fabricated in the metallization of the die in Back End of Line (BEOL) processing as part of a BEOL structure. In act 1104, the wafer is probe tested to determine locations of known good die (KGD). The wafer is thinned in act 1106, for example, from an initial thickness of about 600 µm to about 700 µm, for example to a thickness of about 5 µm to about 200 µm, and as specific non-limiting examples, to a thickness on the order of about 100 µm, about 50 µm, or about 30 µm. However, it is noted that the embodiment of the method is not limited to any particular die thickness that will not compromise inductively coupled data signal transmission or initiate cross-talk. The wafer is then singulated (i.e., diced) using a conventional process (saw blade, laser, stealth (i.e., laser-induced street defects followed by fracture from radial expansion of carrier membrane), etc.) at act 1108 into individual KGD. In act 1110, a reconstructed wafer or panel of KGD is then formed by adhering and operably coupling singulated KGD by the active surfaces thereof in mutually spaced relationship on a fan out package (FOP) configured RDL panel or wafer with traces extending from bond pads of the die to areas beyond the die footprint. If ICL transmitters and ICL receivers have not been fabricated on the die, the FOP-configured RDL wafer or panel may incorporate the ICL transmitters and ICL receivers therein. In act 1112, a polymer film, for example a wafer or panel level film such as a non-conductive film (NCF) comprising a silica-filled epoxy, a b-staged polyimide film, a polytetrafluoroethylene (PTFE) film or other polymer film is laminated over the back sides side of the mutually spaced KGD of the reconstructed wafer or panel. In act 1114, the polymer film bearing the die with the ICL transmitters and ICL receivers and the FOP-configured RDLs is singulated and the individual die each with an RDL and ICL transmitters and ICL receivers are inverted and stacked on a base wafer or other substrate to a desired stack height (e.g., four, eight, twelve, sixteen die). In act 1116, via holes, which may be referred to as through poly vias (TPVs) are formed, for example, by laser or patterning and anisotropic etching through the RDLs and polymer films in the KGD stacks at the via locations and extending to conductive pads or traces on an adjacent surface of the substrate. In act 1118, a sintered Ag or Cu paste is dispensed, or other conductive material is employed, to fill the via holes by, for example, using an ink jet type applicator and form through poly vias (TPVs). As another approach, the vias may be filled with a Sn solder in a wave solder process. In act 1120, the assembly may be optionally encapsulated with an epoxy molding compound (EMC), conductive elements applied to or formed on the substrate opposite the KGD stacks (for example, solder bumps in a ball grid array (BGA) format coupled to conductive paths extending to conductive pads or traces on the substrate surface adjacent the KGD stacks), testing performed and the KGD stacks singulated through the EMC (if present) and substrate to form packages. In act 1122, the tops of the die stacks may be covered with the EMC, or may be exposed to attach heat sink with thermal interface material (TIM).

FIG. 11B is a side sectional schematic elevation of a microelectronic device package 1150 according to an embodiment of the disclosure, and which may be fabricated according to the method of FIG. 11A. Although illustrated as a memory device package comprising a stack of memory die, the structure is not so limited. Microelectronic device package 1150 comprises a substrate 1152 having traces (not shown) carried in a dielectric material and extending from conductive pads 1154 on an upper surface thereof to conductive elements 1156 on an opposing, lower surface thereof. Conductive elements 1156 may comprise, for example, solder balls formed on or applied to terminal pads of substrate 1152. Multiple semiconductor dice 1160A-1160D, for example dice configured as double data rate (DDRx) DRAM, NAND Flash or 3D XPoint (e.g., SXP) memory, are stacked on the upper surface of substrate 1152. Each semiconductor die 1160A-1160D is laminated on its back side to a polymer film 1162, for example, a non-conductive film (NCF), a b-staged polyimide film, a polytetrafluoroethylene (PTFE) film or other polymer film extending beyond a lateral periphery of the respective die 1160A-1160D on one or more sides thereof (two sides shown in FIGS. 10B1 and 10B2 by way of non-limited example). An FOP-configured RDL 1166 bearing conductive traces 1168 is secured to the active surface 1170 of each semiconductor die 1160A-1160D, some conductive traces 1168 (i.e., power and ground/bias traces) extending through or over RDLs 1166 from power and ground/bias bond pad locations (not shown) on the active surfaces 1170 of each semiconductor die 1160A-1160D laterally outwardly at least to locations of vias 1174 filled with conductive material 1176 (i.e., TPVs) extending between semiconductor die 1160A-1160D and to conductive pads 1154 of substrate 1152. Power and ground/bias signals may be ganged for all the semiconductor dice 1160A-1160D, or may be individualized for at least some, or all, semiconductor dice 1160A-1160D. ICL transmitters 1172T and ICL receivers 1172R of the RDL 1166 or incorporated in the die metallization are operably coupled to data signal pinouts on the active surfaces 1170 of each semiconductor die 1160A-1160D by data signal conductive traces 1168. ICL transmitters 1172T and ICL receivers 1172R may be mounted anywhere within the footprint of each semiconductor die 1160A-1160D with ICL transmitters 1172T of one die located in cooperative vertical alignments with ICL receiver 1172R of one or more vertically adjacent die, as shown. Similarly, substrate 1152 may be equipped with ICL transmitters 1172T and ICL receivers 1172R on the upper surface thereof, again in cooperative vertical alignment with ICL receivers 1172R and ICL transmitters 1172T of lowermost semiconductor die 1160A. Notably, thinning semiconductor die 1160A-1160D sufficiently (e.g., to about 50 µm or less) so that ICL signals may be transmitted and received between ICL transmitters and ICL receivers on active surfaces of vertically adjacent die eliminates any need to place ICL transmitters and ICL receivers on both sides of each die. Substrate 1152 may further comprise translation integrated circuitry 1190 operably coupled to the ICL transmitters 1172T and ICL receivers 1172R of substrate 1152 for converting the inductive data signals (i.e., inductance electrical flow) to electrical signals for communication with higher level packaging. Alternatively, another lowermost die (not shown), for example a controller die, equipped with ICL transmitters 1172T and ICL receivers 1172R on its upper surface for communicating with semiconductor die 1160A-1160D may incorporate such translation circuitry and be operably coupled to substrate 1152 via DCA connections, or connections functional as DCA connections as depicted and described with FIGS. 9A and 9B above. As shown in broken lines, semiconductor dice 1160A-1160D may then be encapsulated in, for example, an EMC 1178 extending at least around the lateral periphery of die stack DS and abutting the upper surface of substrate 1152. The EMC 1178 may extend over the uppermost semiconductor die 1060D as shown, or may only cover the sides of die stack DS.

Inductive coupling loop signal transmission as effected using embodiments of the disclosure as described above, presents a low-power solution to transmit data signals from one location to another without requiring a continuous physical connection, thus removing the need for expensive TSVs, or other physical means of interconnection such as bond wires, which present issues with package height and die spacing to avoid shorting. As ICL cannot supply power or ground/bias, using ICL communication in conjunction with through poly vias (TPVs) allows easy vertical alignment of ICL transmitters and ICL receivers within the footprint of the die stack while routing physical power and ground/bias outside of the footprint and to a supporting substrate through the TPVs. Thus, not only TSVs are eliminated, but also potential shingle or stair-step stacking of die for ICL communication, which would require complex design practices and limit die face-to-face area.

Figure 12:
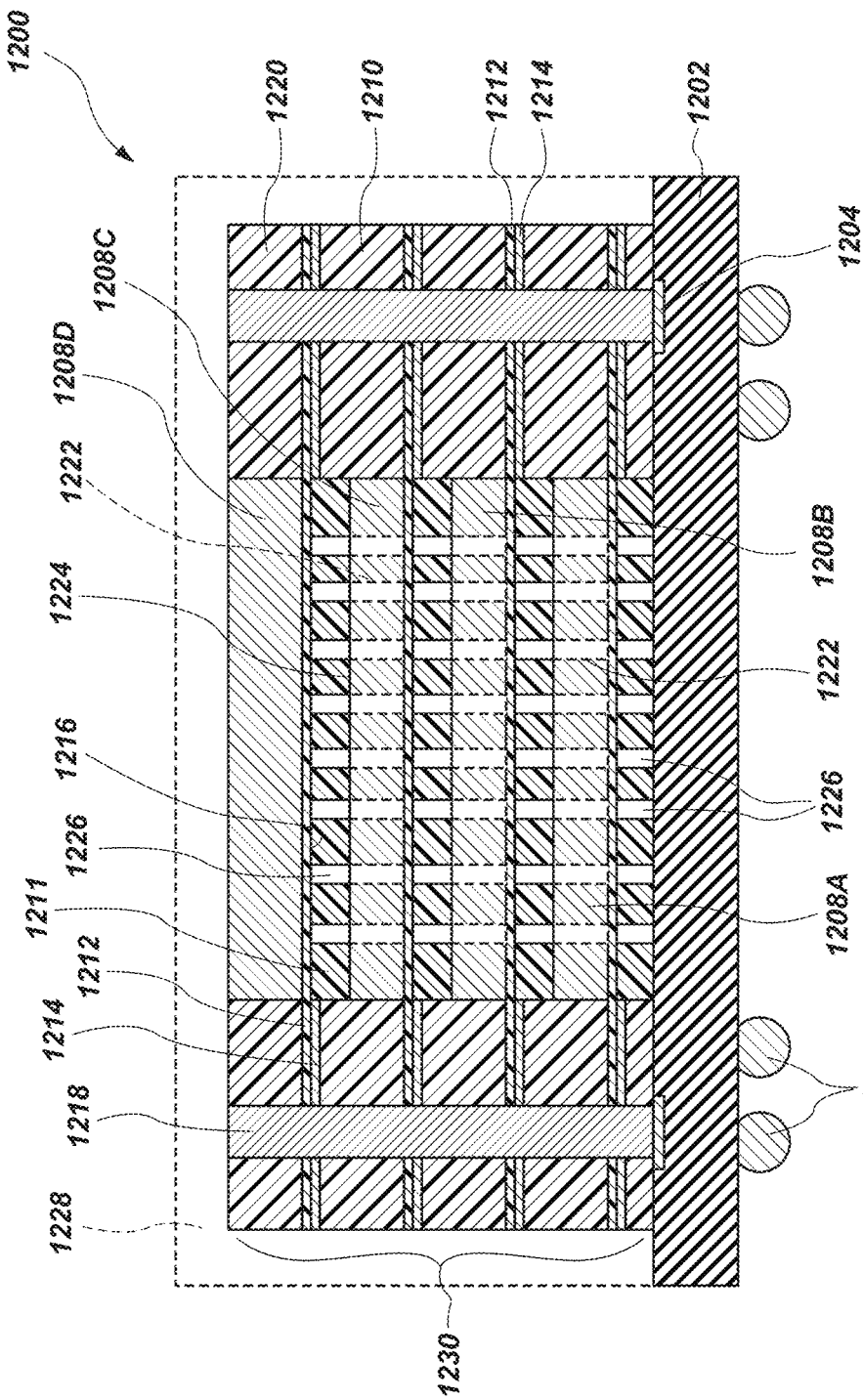
FIG. 12 is a side sectional schematic elevation of a microelectronic device assembly incorporating both through silicon vias (TSVs) and through poly vias (TPVs) according to an embodiment of the disclosure.

Yet another embodiment of the disclosure is illustrated and described with respect to FIG. 12. In this embodiment, both TSVs and TPVs are employed in a microelectronic device. FIG. 12 is a side sectional schematic elevation of a microelectronic device assembly 1200 according to an embodiment of the disclosure. Although illustrated as a memory device package comprising a stack of memory die, the structure is not so limited. Microelectronic device assembly comprises a substrate 1202 having traces (not shown) carried in a dielectric material and extending from conductive pads 1204 on an upper surface thereof to conductive elements 1206 on an opposing, lower surface thereof. Conductive elements 1206 may comprise, for example, solder balls formed on or applied to terminal pads of substrate 1202. Multiple semiconductor dice 1208A-1208D, for example dice configured as double data rate (DDRx) DRAM, NAND Flash or 3D XPoint (e.g., SXP) memory, are stacked on the upper surface of substrate 1202. Each semiconductor die 1208A-1208D is surrounding on its lateral periphery by an EMC 1210. A FOP-configured RDL 1212 bearing conductive traces 1214 is secured to the active surface 1216 of each semiconductor die 1208A-1208D, with conductive traces 1214 (i.e., power and ground/bias traces) extending through or over RDLs 1212 from power and ground/bias bond pad locations (not shown) on the active surfaces 1216 of each semiconductor die 1208A-1208D laterally outwardly at least to locations of vias 1218 filled with conductive material 1220 (i.e., TPVs) extending between semiconductor die 1208A-1208D and to conductive pads 1204 of substrate 1202 for power and ground/bias signal communication. Of course, a FOP-configured RDL is not required, as a dielectric film bearing conductive traces may be employed. As desired, the power and ground/bias connections may be ganged for all of the semiconductor die 1208A-1208D, or may be individualized for each or at least some of the semiconductor die 1208A-1208D. All semiconductor die 1208A-1208C but not uppermost semiconductor die 1208D have been fabricated with TSVs 1222 shown in broken lines extending through their respective thicknesses from aligned bond pads (not shown) of integrated circuitry on the active surface 1216 thereof to conductive pads (not shown) on the back sides 1224 thereof. The uppermost semiconductor die 1208D has bond pads on an active surface thereof aligned with TSVs of a next lower semiconductor device 1208C. Conductive elements such as pillars 1226, for example solder-capped copper pillars, extend between the bond pads and the terminal pads through polymer films 1211 and RDLs 1212, interconnecting the semiconductor die 1208A-1208D through TSVs 1222 for data signal communication with conductive pads (not shown) of substrate 1202 within the footprint of the die stack. Instead of pillar-type conductive elements, a conductive material filling via holes in a polymer film in the bond line may be employed, as described above with respect to FIGS. 9A and 9B. As shown in broken lines, semiconductor dice 1208A-1208D may then be encapsulated in, for example, another EMC 1228 extending at least around the lateral periphery of die stack 1230 and abutting the upper surface of substrate 1202. The EMC 1228 may extend over the uppermost semiconductor die 1060D as shown, or may only cover the sides of die stack 1230, leaving exposed uppermost semiconductor die 1208D for application of (for example) a TIM and a heat sink structure.

Figure 13A:
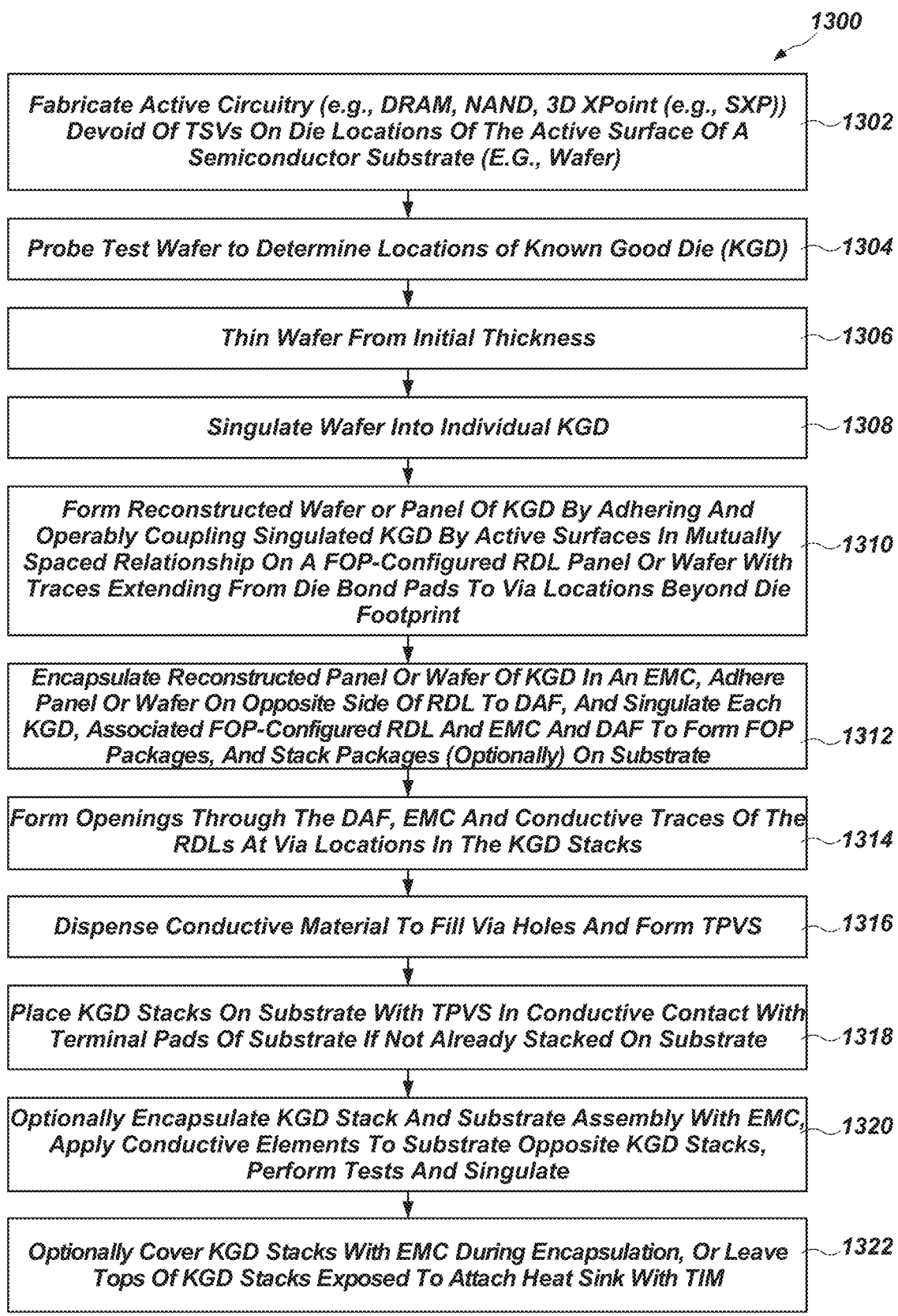
FIG. 13A is a flow diagram of an embodiment of a method for fabricating a microelectronic device package using fan out package (FOP) configured redistribution layers (RDLs) according to the disclosure and FIG. 13B is a side sectional schematic of a microelectronic device package using FOP configured RDLs according to an embodiment of the disclosure.

Referring now to FIGS. 13A-14B of the drawing, further embodiments of the disclosure employing FOP-configured RDLs in conjunction with TPVs are illustrated and described. FIG. 13A is a flow diagram of an embodiment of a method 1300 for fabricating a microelectronic device package using FOP-configured RDLs according to the disclosure. In act 1302, active circuitry (e.g., DRAM, NAND, 3D XPoint (e.g., SXP)) devoid of TSVs is fabricated on die locations of the active surface of a semiconductor substrate (e.g., wafer), In act 1304, the wafer is probe tested to determine locations of known good die (KGD). The wafer is thinned in act 1306, for example, from an initial thickness of about 600 µm to about 700 µm, for example, to a thickness of about 5 µm to about 50 µm, and as a specific example, to a thickness on the order of about 30 µm. However, it is noted that the embodiment of the method is not limited to any particular die thickness. The wafer is then singulated (i.e., diced) using a conventional process (saw blade, laser, stealth (i.e., laser-induced street defects followed by fracture from radial expansion of carrier membrane), etc.) at act 1308. In act 1310, a reconstructed wafer or panel of KGD is then formed by placing and adhering singulated KGD by front sides (i.e., active surfaces) thereof in mutually spaced relationship onto die mount locations of a panel or wafer configured as multiple fan-out package (FOP) redistribution layers (RDLs) each having one or more layers of conductive (e.g., copper) traces operably coupled to bond pads of a respective KGD and carried by a dielectric material extending to via locations beyond at least one lateral periphery of an associated die footprint. In act 1312, the reconstructed panel or wafer of KGD is then encapsulated in an EMC, adhered on the side opposite the RDL to a die attach film (DAF), and each KGD, associated FOP-configured RDL and the DAF singulated to form FOP-configured RDL packages. Multiple packages are then stacked. In act 1314, openings are formed at via locations (e.g., by laser ablation or anisotropic etching) through the DAF, the EMC and through conductive traces of the FOP-configured RDLs. In act 1316, an Ag or Cu paste or other conductive material is dispensed to fill the vias, for example, using an ink jet type applicator, to form TPVs. As another example, the vias may be filled with a Sn solder in a wave solder process. In act 1318, the stack of FOP packages is placed on a substrate with the TPVs in conductive contact with terminal pads on the upper surface of the substrate. If desired, the FOP packages may be stacked on a substrate prior to formation of TPVs. In act 1320, the assembly may be (optionally) encapsulated with another epoxy molding compound (EMC), conductive elements applied to or formed on the substrate opposite the KGD stacks (for example, solder bumps in a ball grid array (BGA) format), testing performed and the KGD stacks singulated through the other EMC (if present) and substrate to form packages. In act 1322, the tops of the die stacks may be covered with the other EMC (if present), or may be exposed, for example, for attachment of heat sinks with a thermal interface material (TIM).

Figure 13B:
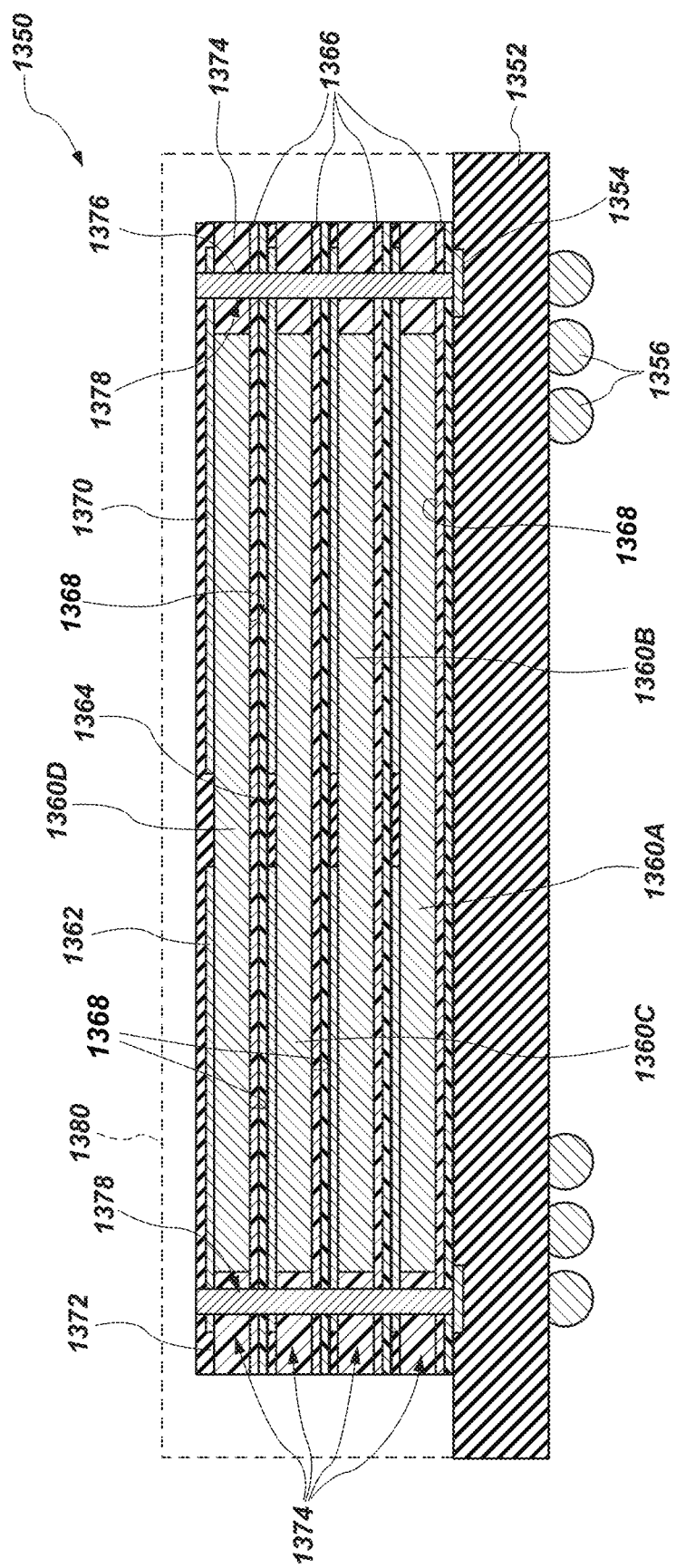

FIG. 13B is a side sectional schematic of a microelectronic device package 1350 according to an embodiment of the disclosure, and which may be fabricated according to the method of FIG. 13A. Microelectronic device package 1350 comprises a substrate 1352 having traces (not shown) carried in a dielectric material and extending from conductive pads 1354 on an upper surface thereof to conductive elements 1356 on an opposing, lower surface thereof. Conductive elements 1356 may comprise, for example, solder balls formed on or applied to terminal pads on the underside of substrate 1352. Multiple semiconductor dice 1360A-1360D, for example, dice configured as double data rate (DDRx) DRAM, NAND Flash or 3D Xpoint (e.g., SXP) memory, all of which are devoid of TSVs, are stacked on the upper surface of substrate 1352. Each semiconductor die 1360A-1360D is laminated on active surface 1362 to a FOP-configured RDL 1364 extending beyond at least one lateral periphery of the respective die 1360A-1360D on one or more sides thereof (two sides shown). Each semiconductor die 1360A-1360D is attached to a DAF segment 1366 on the back side 1368 thereof. Conductive traces 1370 of RDLs 1364 extend from bond pad locations (not shown) on active surfaces 1362 of each semiconductor die 1360A-1360D laterally outwardly over upper surfaces 1372 of EMC 1374 surrounding each semiconductor die 1360A-1360D at least to TSV locations of vias 1376 filled with conductive material 1378 extending between semiconductor dice 1360A-1360D and to conductive pads 1354 of substrate 1352. As shown in broken lines, semiconductor dice 1360A-1360D may be encapsulated in, for example, another EMC 1380 extending at least around the lateral periphery of the die stack and abutting the upper surface of substrate 1352. The EMC 1380 may extend over the uppermost semiconductor die 1360D as shown. The other EMC 1380 may, alternatively, leave the active surface 1362 and conductive traces 1370 of uppermost semiconductor die 1360D uncovered, to be covered by a thin dielectric layer, which may comprise a thermal interface material (TIM) and a heat sink for enhanced heat transfer from the microelectronic device package 1350.

Figure 14A:
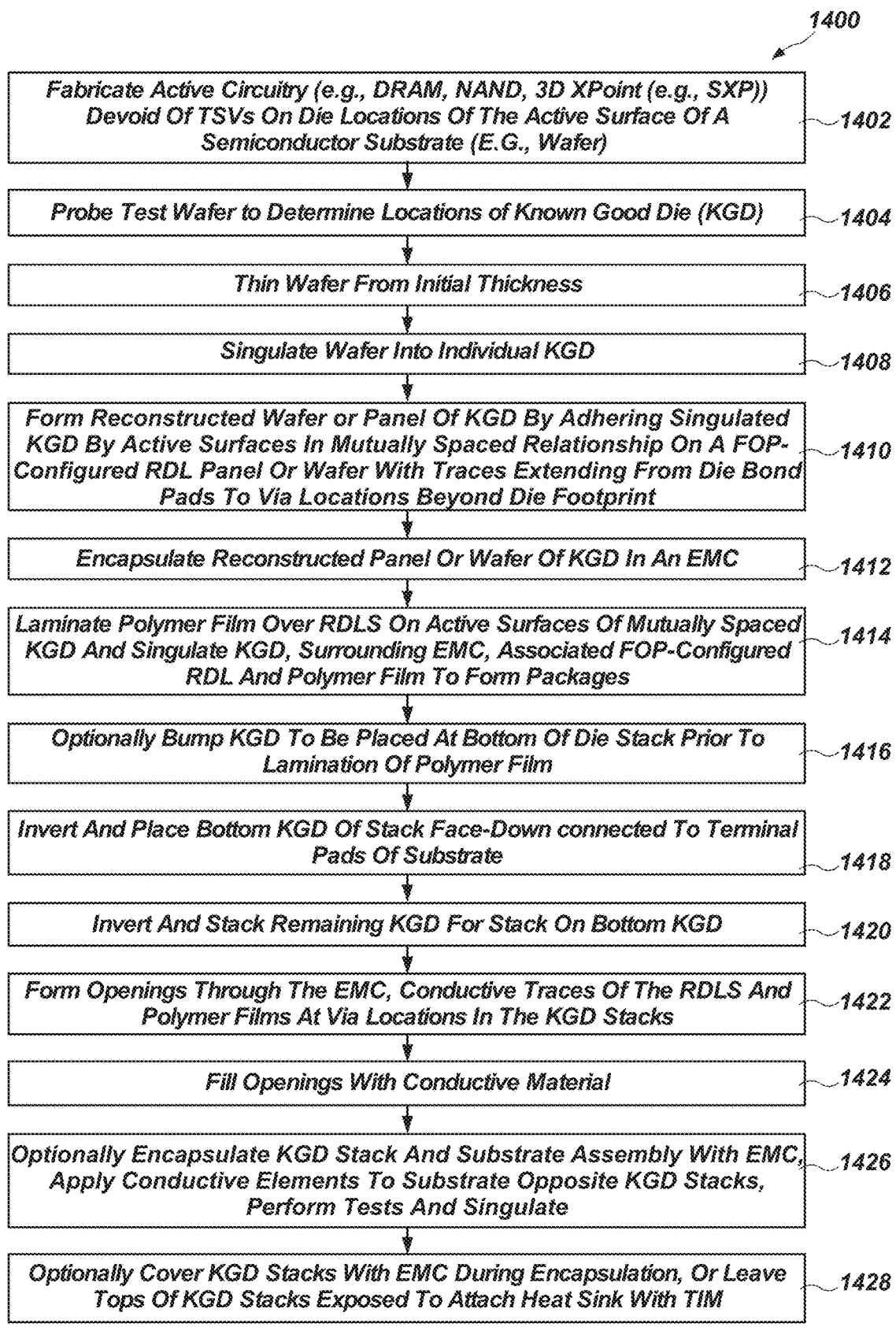
FIG. 14A is a flow diagram of an embodiment of a method for fabricating a microelectronic device package employing FOP-configured RDLs in conjunction with TPVs according to the disclosure and FIG. 14B is a side sectional schematic of a microelectronic device package employing FOP-configured RDLs in conjunction with TPVs according to an embodiment of the disclosure.

FIG. 14A is a flow diagram of an embodiment of a method 1400 for fabricating a microelectronic device package employing FOP-configured RDLs in conjunction with TPVs according to the disclosure. In act 1402, active circuitry (e.g., DRAM, NAND, 3D XPoint (e.g., SXP)) devoid of TSVs is fabricated on die locations of the active surface of a semiconductor substrate (e.g., wafer), In act 1404, the wafer is probe tested to determine locations of known good die (KGD). The wafer is thinned in act 1406, for example, from an initial thickness of about 600 μm to about 700 μm, for example, to a thickness of about 5 μm to about 50 μm, and as a specific example, to a thickness on the order of about 30 μm. However, it is noted that the embodiment of the method is not limited to any particular die thickness. The wafer is then singulated (i.e., diced) using a conventional process (saw blade, laser, stealth (i.e., laser-induced street defects followed by fracture from radial expansion of carrier membrane), etc.) at act 1408. In act 1410, a reconstructed wafer or panel of KGD is then formed by adhering and operably coupling singulated KGD by front sides (i.e., active surfaces) thereof in mutually spaced relationship onto die mount locations of a panel or wafer configured as multiple fan-out package (FOP) redistribution layers (RDLs) each having one or more layers of conductive (e.g., copper) traces operably coupled to bond pads of a respective KGD and carried by a dielectric material extending to via locations beyond at least one lateral periphery of an associated die footprint. In act 1412, the reconstructed panel or wafer of KGD is then encapsulated in an EMC. In act 1414, a polymer film, for example a wafer or panel level film such as a non-conductive film (NCF) comprising a silica-filled epoxy, a b-staged polyimide film, a polytetrafluoroethylene (PTFE) film or other polymer film is then laminated over RDLs on the active surfaces of the mutually spaced KGD of the reconstructed wafer or panel and each KGD, surrounding EMC and associated FOP-configured RDL and polymer film singulated to form packages. In act 1416, which may be implemented prior to application of the polymer film and singulation, KGD to be placed at the bottom of a die stack are bumped with conductive elements in the form of copper pillars or solder bumps, or may be bumped with a conductive material (e.g., Ag or Cu paste) disposed in via holes in the polymer film. In act 1418, the bottom (i.e., bumped) KGD of a stack is inverted and placed in flip-chip orientation, active surface down, on a substrate, connected to terminal pads of the substrate through the polymer film. The remaining KGD for the stack are then inverted and placed, face down, over the bottommost KGD in act 1420. In act 1422, openings are formed at via locations (e.g., by laser ablation or anisotropic etching) through the EMC, through conductive traces of the FOP-configured RDLs and the polymer films. In act 1424, an Ag or Cu paste or other conductive material is employed to fill the vias, for example, using an ink jet type applicator and form TSVs. As another example, the vias may be filled with a Sn solder in a wave solder process. In act 1426, the assembly may be (optionally) encapsulated with another epoxy molding compound (EMC), conductive elements applied to or formed on the substrate opposite the KGD stacks (for example, solder bumps in a ball grid array (BGA) format), testing performed and the KGD stacks singulated through the other EMC (if present) and substrate to form packages. In act 1428, the tops of the die stacks may be covered with the other EMC (if present), or may be exposed, for example, for attachment of heat sinks with a thermal interface material (TIM).

Figure 14B:
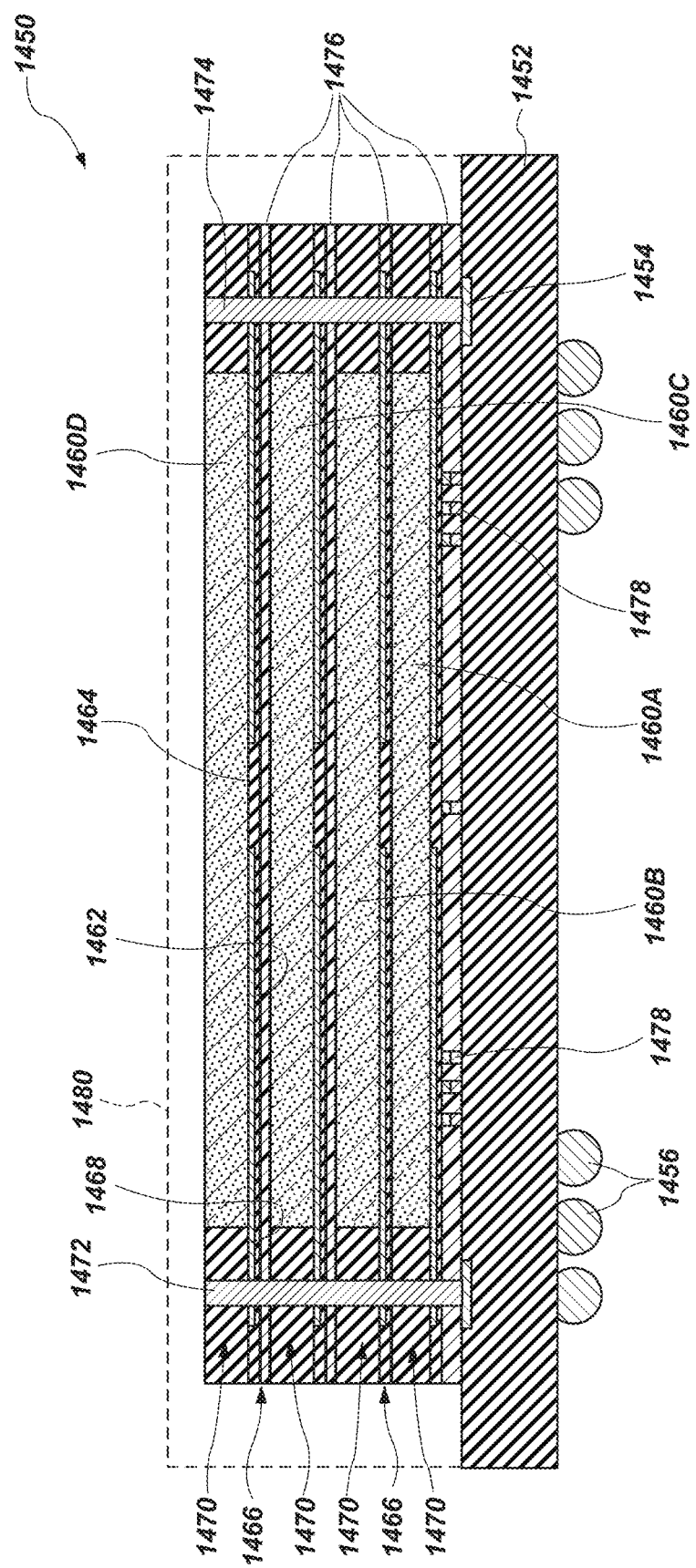

FIG. 14B is a side sectional schematic of a microelectronic device package 1450 according to an embodiment of the disclosure, and which may be fabricated according to the method of FIG. 14A. Microelectronic device package 1450 comprises a substrate 1452 having traces (not shown) carried in a dielectric material and extending from conductive pads 1454 on an upper surface thereof to conductive elements 1456 on an opposing, lower surface thereof. Conductive elements 1456 may comprise, for example, solder balls formed on or applied to under bump metallization (UBM) of substrate 1452. Multiple semiconductor dice 1460A-1460D, for example, dice configured as double data rate (DDRx) DRAM, NAND Flash or 3D Xpoint (e.g., SXP) memory, are stacked on the upper surface of substrate 1452. Each semiconductor die 1460A-1460D is laminated on active surface 1462 to a FOP-configured RDL 1464 extending beyond at least one lateral periphery of the respective die 1460A-1460D on one or more sides thereof (two sides shown). Conductive traces 1466 of RDLs 1464 extend from bond pad locations (not shown) on active surfaces 1462 of each semiconductor die 1460A-1460D laterally outwardly over lower surfaces 1468 of EMC 1470 surrounding each semiconductor die 1460A-1460D at least to locations of vias 1472 filled with conductive material 1474 extending between semiconductor dice 1460A-1460D and to conductive pads 1454 of substrate 1452. A polymer film 1476, for example a wafer or panel level film such as a non-conductive film (NCF) comprising a silica-filled epoxy, a b-staged polyimide film, a polytetrafluoroethylene (PTFE) film or other polymer film is laminated over the RDLs 1464 on each semiconductor die 1460A-1460D. Alternatively, a capillary underfill (CUF) may be disposed between the semiconductor die 1460A-1460D. Conductive elements 1478 in the form of copper pillars or solder bumps extend through the polymer film 1476 between the lowermost semiconductor die 1460A and substrate 1452 to contract terminal pads (not shown) of substrate 1452. The lowermost semiconductor die 1460A is connected to the substrate through conductive elements 1478 and connected to other semiconductor die 1460B-1460D through conductive traces 1466 of its associated RDL 1464 and TPVs. The die stack may be encapsulated in, for example, another EMC 1480 extending at least around the lateral periphery of die stack and abutting the upper surface of substrate 1452. The EMC 1480 may extend over the uppermost semiconductor die 1460D as shown. The EMC 1480 may, alternatively, leave the back side of semiconductor die 1460D uncovered, to be covered by a thin dielectric layer, which may comprise a thermal interface material (TIM) and a heat sink for enhanced heat transfer from the microelectronic device package 1450.

The embodiments of FIGS. 13A-14B offer a significant cost reduction for multi-die stacks and packages through the elimination of TSVs and, also conventional post-wafer fabrication processes on the die. Further, these embodiments offer the ability to use different conductive trace designs for each RDL, allowing for separate address pins for each die in the stack. Still further, power and ground/bias for the semiconductor die in the stack may be tied together, or individualized for each die. In addition, the customization of the trace patterns for each layer of RDL facilitates customization of multi-die package configurations of the same or different die functionalities.

Embodiments of the disclosure include a microelectronic device assembly comprising a microelectronic device having an active surface facing a substrate and preformed holes filled with conductive material and extending through a dielectric film between an array of bond pads on the active surface of the microelectronic device and terminal pads on the substrate.

Embodiments of the disclosure include a microelectronic device assembly comprising a stack of microelectronic devices on a substrate, each microelectronic device comprising TSVs extending through a thickness thereof between bond pads on an active surface and terminal pads on a back side thereof and dielectric films interposed between adjacent microelectronic devices of the stack, the dielectric films comprising preformed holes aligned between bond pads and terminal pads of adjacent microelectronic devices of the stack, the preformed holes filled with conductive material in contact with aligned bond pads and terminal pads of adjacent microelectronic components.

Embodiments of the disclosure include a method comprising forming a reconstructed wafer or panel by placing singulated semiconductor dice in mutually spaced relationship and laminating a polymer film over active surfaces of the singulated semiconductor dice comprising bond pads, forming via holes through the polymer film to expose bond pads on the active surfaces, filling the via holes with conductive material, singulating the semiconductor dice of the reconstructed panel or wafer through the polymer film, inverting at least one semiconductor die and placing the inverted at least one semiconductor die on a substrate with conductive material-filled via holes aligned with terminal pads on the substrate and bonding the polymer film to the substrate with the conductive material in contact with the terminal pads.

Additional non-limiting example embodiments of the disclosure are described below.

Embodiment 1: A method comprising:
forming a reconstructed wafer or panel by placing semiconductor dice in mutually spaced relationship and laminating polymer film over active surfaces of dice;
forming opening through the polymer film to expose bond pads on the active surfaces;
forming conductive traces on the polymer film from the bond pads to via locations beyond the lateral peripheries of the semiconductor dice and between the semiconductor dice;
singulating groups of two or more semiconductor dice through the polymer film and stacking the singulated groups of two or more semiconductor dice on a substrate;
forming via holes through the polymer films on the stacks of semiconductor dice at the via locations; and filling the via holes with conductive material.

Embodiment 2: The method of embodiment 1, further comprising, before forming a reconstructed wafer or panel:
fabricating active circuitry on die locations of an active surface of a semiconductor substrate devoid of TSVs;
testing to determine die locations of known good die (KGD);
thinning the semiconductor substrate from an initial thickness to a thickness of about 5 μm to about 200 μm;
singulating the semiconductor substrate into individual KGD.

Embodiment 3: The method of embodiment 1 or 2, further comprising, after filling the via holes with the conductive material:
encapsulating the stacks of singulated groups of two or more semiconductor dice on the substrate with an epoxy molding compound (EMC);
applying or forming conductive elements on the substrate opposite the stacks of singulated groups of two or more semiconductor dice;
testing the stacks of singulated groups of two or more semiconductor dice; and
singulating the stacks of singulated groups of two or more semiconductor dice through the EMC and the substrate.

Embodiment 4: The method of embodiment 3, wherein encapsulating the stacks of singulated groups of two or more semiconductor dice comprises leaving tops of the stacks exposed and applying a thermal interface material (TIM) and heat sink to the top of each stack.

Embodiment 5: The method of any of embodiments 1 through 4, wherein providing singulated semiconductor dice comprises providing DRAM, NAND Flash or 3D XPoint (SXP) memory dice.

Embodiment 6: The method of embodiment 1, further comprising, before laminating the polymer film over the mutually spaced semiconductor dice, placing the semiconductor dice by the back sides thereof in the mutually spaced relationship on an adhesive film.

Embodiment 7: The method of embodiment 6, wherein placing the semiconductor dice by the back sides thereof in the mutually spaced relationship on an adhesive film comprises placing the semiconductor dice on a die attach film (DAF) or a film over die (FOD) material.

Embodiment 8: The method of any of embodiments 1, 5, or 6, wherein laminating a polymer film comprises laminating a non-conductive film (NCF), a b-staged polyimide film, or a polytetrafluoroethylene (PTFE) film.

Embodiment 9: The method of embodiment 2, wherein:
fabricating active circuitry on die locations of an active surface of a semiconductor substrate devoid of TSVs comprises:
fabricating active circuitry exhibiting a first functionality on die locations of an active surface of a first semiconductor substrate comprises fabricating memory dice configured for operation as slave dice in a master/slave memory architecture; and
fabricating active circuitry exhibiting at least one second, different functionality on die locations of an active surface of a second semiconductor substrate comprises fabricating memory dice configured for operation as master dice in a master/slave memory architecture.

Embodiment 10: The method of embodiment 9, further comprising:
singulating groups of two or more master dice and placing the groups of two or more master dice on a substrate; and
stacking groups of two or more slave dice on the groups of two or more master dice.

Embodiment 11: The method of embodiment 9, wherein forming a reconstructed panel or wafer comprises:
forming a first reconstructed wafer by placing a master die adjacent one or more slave dice in mutually spaced relationship;
singulating groups of two or more semiconductor dice through the polymer film comprises singulating a master die grouped with one or more slave dice;
forming a second reconstructed wafer by placing slave die in mutually spaced relationship;
singulating groups of two or more semiconductor die comprises singulating groups of two or more slave dice; the method further comprising:
placing singulated groups of a master die with one or more slave dice on a substrate; and
stacking singulated groups of two or more slave dice respectively on groups of a master die with one or more slave dice.

Embodiment 12: The method of embodiment 2, wherein:
fabricating active circuitry on die locations of an active surface of a semiconductor substrate devoid of TSVs comprises:
fabricating active circuitry exhibiting a first functionality on die locations of an active surface of a first semiconductor substrate comprises fabricating memory dice; and
fabricating active circuitry exhibiting at least one second, different functionality on die locations of an active surface of a second semiconductor substrate comprises fabricating logic dice configured for operation as memory controllers.

Embodiment 13: The method of embodiment 12, further comprising:
singulating groups of two or more logic dice and placing the groups of two or more logic dice on a substrate; and
stacking groups of two or more memory dice respectively on groups of two or more logic dice.

Embodiment 14: The method of embodiment 12, wherein forming a reconstructed panel or wafer comprises:
forming a first reconstructed wafer by placing a logic die adjacent one or more memory dice in mutually spaced relationship;
singulating groups of two or more semiconductor dice through the polymer film comprises singulating a logic die grouped with one or more memory dice;
forming a second reconstructed wafer by placing memory dice in mutually spaced relationship;
singulating groups of two or more semiconductor die comprises singulating groups of two or more memory dice; the method further comprising:
placing singulated groups of a logic die with one or more memory dice on a substrate; and stacking singulated groups of two or more memory dice respectively on groups of one or more master die.

Embodiment 15: A microelectronic device assembly, comprising:
a substrate having conductors exposed on a surface thereof;
two or more stacks of two or more microelectronic devices on the substrate, each microelectronic device comprising an active surface having bond pads operably coupled to first conductive traces extending over a dielectric material to via locations beyond at least one side of microelectronic devices of the stacks and to second conductive traces extending between at least some of the microelectronic devices of the two or more stacks of two or microelectronic devices; and
vias extending through the dielectric materials at the via locations and comprising conductive material in contact with at least some of the conductive traces of each of the two or more stacks of two or more microelectronic devices and extending to exposed conductors of the substrate.

Embodiment 16: The microelectronic device assembly of embodiment 15, wherein at least some of the vias comprising conductive materials are configured, in combination with conductive traces of selected microelectronic devices of the two or more microelectronic devices of the stack, to route signals between microelectronic devices of different stacks.

Embodiment 17: The microelectronic device assembly of embodiment 15 or 16, wherein the microelectronic devices comprise semiconductor dice.

Embodiment 18: The microelectronic device assembly of embodiment 17, wherein the semiconductor dice comprise a master memory die on the substrate at the base of at least one stack of microelectronic device and a remainder of the semiconductor dice comprise in the assembly comprise slave memory dice, wherein the microelectronic device assembly is configured with a master/slave DDR architecture.

Embodiment 19: The microelectronic device assembly of embodiment 18, further comprising a master memory die on the substrate at the base of each stack of microelectronic devices.

Embodiment 20: The microelectronic device assembly of embodiment 17, wherein the semiconductor dice are configured as memory dice and logic dice, and a logic die is located at the base of at least one stack.

Embodiment 21: The microelectronic device assembly of embodiment 20, wherein a logic die is located at the base of each stack.

Embodiment 22: The microelectronic device assembly of embodiment 17, wherein the microelectronic devices comprise semiconductor dice exhibiting at least two different functionalities.

Embodiment 23: A method comprising:
forming a reconstructed wafer or panel by placing singulated semiconductor dice in mutually spaced relationship and laminating a polymer film over active surfaces of dice, the singulated semiconductor dice comprising iRDLs comprising traces rerouting bond pad locations into an array of iRDL pads;
forming via holes through the polymer film to expose iRDL pads on the active surfaces;
filling via holes with conductive material;
singulating the semiconductor dice through the polymer film; and
inverting at least one of the semiconductor dice and placing the inverted at least one semiconductor die on a substrate with conductive material-filled via holes aligned with terminal pads on the substrate; and
bonding the polymer film to the substrate and conductive material to the terminal pads.

Embodiment 24: The method of embodiment 23, further comprising, before forming a reconstructed wafer or panel:
fabricating active circuitry on die locations of an active surface of a semiconductor substrate and forming iRDLs on each die location with traces to reroute bond pad locations into an array of iRDL pads;
testing the semiconductor substrate to determine die locations of known good die (KGD);
thinning the semiconductor substrate from an initial thickness to a thickness of about 5 µm to about 200 µm; and
singulating the semiconductor substrate into individual KGD.

Embodiment 25: The method of embodiment 1 or 2, further comprising stacking additional semiconductor dice on the respective semiconductor dice placed on the substrate and operably coupling the additional semiconductor dice to terminal pads of the substrate by conductive vias extending through dielectric materials outside of a periphery of the additional semiconductor dice and in electrical communication with the additional semiconductor dice by traces carried by the dielectric material and extending to bond pads on active surfaces of the additional semiconductor dice.

Embodiment 26: A microelectronic device assembly, comprising:
a microelectronic device having a surface facing a substrate;
conductive material-filled holes extending through a dielectric film between an array of iRDL pads on the active surface of the microelectronic device and terminal pads on the substrate; and
additional microelectronic devices stacked on the semiconductor die, the additional microelectronic devices each having a dielectric film extending over a surface thereof and beyond at least one periphery the dielectric films each carrying conductive traces extending from bond pads on the surfaces of the microelectronic devices to and in contact with conductive material-filled vias in the dielectric films extending to terminal pads on the substrate.

Embodiment 27: A microelectronic device assembly comprising:
a stack of microelectronic devices on a substrate, each microelectronic device comprising TSVs extending through a thickness thereof between bond pads on an active surface and terminal pads on a back side thereof;
dielectric films interposed between adjacent microelectronic devices of the stack, the dielectric films comprising holes aligned between bond pads and terminal pads of adjacent microelectronic devices of the stack;
the holes filled with conductive material in contact with aligned bond pads and terminal pads of adjacent microelectronic components.

Embodiment 28: The microelectronic device assembly of embodiment 27, wherein the dielectric films comprise preformed polymer films and the conductive material comprises a conductive metal paste.

Embodiment 29: The microelectronic device assembly of embodiment 27, wherein the dielectric films extend beyond at least one side of the stack and carry conductive traces from misaligned bond pads or terminal pads to conductive vias located beyond the at least one side of the stack extending to terminal pads on the substrate, the conductive traces and conductive vias operably coupled for power and ground or bias transmission between the substrate and the microelectronic devices of the stack.

Embodiment 30: The microelectronic device assembly of embodiment 29, wherein the TSVs and the conductive material in contact with the aligned bond pads and terminal pads are operably coupled for data signal transmission among microelectronic devices of the stack and between microelectronic devices of the stack and the substrate.

Embodiment 31: A method comprising:
forming a reconstructed wafer or panel of semiconductor dice by adhering semiconductor dice by active surfaces in mutually spaced relationship on a FOP-configured RDL wafer or panel with traces extending from bond pads to areas on RDLs beyond a footprint of each semiconductor die;
placing one or more surface mount components on a FOP-configured RDL outside of the footprint of a laterally associated semiconductor die at locations where via holes are not to be formed;
laminating a polymer film over back sides of the semiconductor dice of the reconstructed wafer or panel;
singulating the polymer film and RDL wafer or panel between the semiconductor dice;
inverting the semiconductor dice and stacking the inverted semiconductor dice on a substrate with the one or more surface mount components within the die stack;
forming via holes through the polymer films and RDLs at via locations extending to conductive pads on the substrate; and
filling the via holes with conductive material.

Embodiment 32: The method of embodiment 31, wherein placing one or more surface mount components comprises placing one or more capacitors, inductors or resistors.

Embodiment 33: The method of embodiment 31 or 32, further comprising placing one or more surface mount components on a top level RDL of the stack of inverted semiconductor dice.

Embodiment 34: The method of any of embodiments 31, 32 or 33, wherein placing at least one surface mount component on a top level RDL of the stack of semiconductor dice comprises at least one of placing at least one surface mount component above the top level RDL of the stack of semiconductor dice or placing at least one surface mount component below the top level RDL of the stack and outside a footprint of the semiconductor dice of the stack.

Embodiment 35: The method of any of embodiments 31 through 34, wherein the semiconductor dice are of at least two different sizes and wherein, when stacking the inverted semiconductor dice, at least one surface mount component is located within a footprint of a vertically adjacent semiconductor die.

Embodiment 36: A method comprising:
forming a reconstructed wafer or panel of semiconductor dice by adhering semiconductor dice by active surfaces in mutually spaced relationship on a FOP-configured RDL panel or wafer with traces extending from bond pads to areas on RDLs beyond a footprint of each semiconductor die;
laminating a polymer film over back sides of the semiconductor dice of the reconstructed wafer or panel;
singulating the polymer film and the RDLs between the semiconductor dice;
inverting the semiconductor dice and stacking the inverted semiconductor dice on a substrate;
forming via holes through the polymer films and the RDLs at via locations extending to conductive pads on the substrate;
filling the via holes with conductive material; and
placing one or more surface mount components on a top level RDL of the stack of semiconductor dice.

Embodiment 37: The method of embodiment 36, wherein placing one or more surface mount components comprises placing one or more capacitors, inductors or resistor.

Embodiment 38: A microelectronic device assembly, comprising:
a substrate having conductors exposed on a surface thereof;
a stack of two or more microelectronic devices on the substrate, each microelectronic device comprising an active surface having bond pads operably coupled to conductive traces extending over a dielectric material to via locations beyond a footprint of an associated microelectronic device;
vias extending through the dielectric materials at the via locations and comprising conductive material in contact with at least some of the conductive traces of each of the two or more microelectronic devices and extending to exposed conductors of the substrate; and
one or more surface mount components operably coupled to conductive traces of at least one dielectric material.

Embodiment 39: The microelectronic device assembly of embodiment 38, wherein the one or more surface mount components are mounted to the at least one dielectric material at a location outside of the footprint of the microelectronic device associated with the dielectric material.

Embodiment 40: The microelectronic device assembly of embodiment 38 or 39, wherein the one or more surface mount components are mounted to an upper surface of the at least one dielectric material.

Embodiment 41: The microelectronic device assembly of embodiment 38 or 39, wherein the one or more surface mount components are mounted to a lower surface of the at least one dielectric material.

Embodiment 42: The microelectronic device assembly of any of embodiment 38, 39 or 40, wherein the one or more surface mount components are located on an uppermost dielectric material over at least one via.

Embodiment 43: The microelectronic device assembly of embodiment 38, wherein the one or more surface mount components are located on a dielectric material within the stack where no vias are located.

Embodiment 44: The microelectronic device assembly of any of embodiments 38, 39, 40 or 43, wherein at least one microelectronic device of the stack is smaller than at least one other adjacent microelectronic device of the stack and the one or more surface mount components are mounted to the at least one dielectric material of the at least one dielectric material within a footprint of the at least one other adjacent microelectronic device of the stack.

Embodiment 45: The microelectronic device assembly of any of embodiments 38 through 44, wherein the conductive traces extending over the dielectric material to via locations beyond a footprint of an associated microelectronic device comprise a fan-out package configured redistribution layer (FOP-configured RDL) structure.

Embodiment 46: The microelectronic device assembly of any of embodiments 38 through 45, wherein the microelectronic devices comprise semiconductor dice.

Embodiment 47: The microelectronic assembly of any of embodiments 38 through 46, wherein the one or more surface mount components comprises one or more capacitors, inductors or resistors.

Embodiment 48: A method comprising:
forming a reconstructed wafer or panel of semiconductor dice by adhering semiconductor dice by active surfaces in mutually spaced relationship on a FOP-configured RDL panel or wafer with traces extending from bond pads of each semiconductor die to areas on an associated RDL beyond a footprint of the semiconductor die, wherein at least one of each semiconductor die or an associated RDL includes at least one ICL transmitter and at least one ICL receiver;
laminating a polymer film over back sides of the semiconductor dice of the reconstructed wafer or panel;
singulating the polymer film and RDL panel or wafer between the semiconductor dice;
inverting the semiconductor dice and stacking the inverted semiconductor dice on a substrate with the at least one ICL transmitter of each semiconductor die or an associated RDL vertically aligned with the at least one ICL receiver of an adjacent semiconductor die or an associated RDL and the at least one ICL receiver of each semiconductor die or an associated RDL vertically aligned with the at least one ICL transmitter of an adjacent semiconductor die or an associated RDL;
forming via holes through the polymer films and RDLs at via locations extending to conductive pads on the substrate; and
filling the via holes with conductive material.

Embodiment 49: The method of embodiment 48, further comprising forming the at least one ICL transmitter and the at least one ICL receiver on the semiconductor die in BEOL processing of a wafer before singulating the semiconductor dice from the wafer.

Embodiment 50: The method of embodiment 48, further comprising forming or placing the at least one ICL transmitter and the at least one ICL receiver for each semiconductor die on the FOP-configured RDL panel or wafer before forming the reconstructed panel or wafer of semiconductor dice.

Embodiment 51: The method of any of embodiments 48, 49 or 50, further comprising providing the substrate with at least one ICL transmitter and at least one ICL receiver before stacking the inverted semiconductor dice thereon, and vertically aligning the at least one ICL transmitter of an adjacent semiconductor die or an associated RDL with the at least one ICL receiver of the substrate and the at least one ICL receiver of an adjacent semiconductor die or an associated RDL with the at least one ICL transmitter of the substrate.

Embodiment 52: The method of embodiment 48 or 51, further comprising providing each semiconductor die or an associated RDL with multiple ICL transmitters and multiple ICL receivers, and stacking the inverted semiconductor dice with ICL transmitters of a stacked semiconductor die or associated RDL vertically aligned with ICL receivers of an adjacent stacked semiconductor die or associated RDL and ICL receivers of the stacked semiconductor die or associated RDL vertically aligned with ICL transmitters of an adjacent stacked semiconductor die or associated RDL.

Embodiment 53: A microelectronic device assembly, comprising:
 a substrate having conductors exposed on a surface thereof;
 a stack of two or more microelectronic devices on the substrate, each microelectronic device comprising an active surface having bond pads operably coupled to conductive traces extending over a dielectric material to via locations beyond a footprint of an associated microelectronic device;
 vias for power and ground/bias signal communication extending through the dielectric materials at the via locations and comprising conductive material in contact with at least some of the conductive traces of each of the two or more microelectronic devices and extending to exposed conductors of the substrate; and
 the microelectronic devices or associated RDLs include at least one ICL transmitter and at least one ICL receiver within footprints of the respective microelectronic device, the at least one ICL transmitter of each microelectronic device or an associated RDL being vertically aligned with the at least one ICL receiver of an adjacent microelectronic device or an associated RDL and the at least one ICL receiver of each microelectronic device or an associated RDL being vertically aligned with the at least one ICL transmitter of an adjacent microelectronic device or an associated RDL for data signal communication.

Embodiment 54: The microelectronic device assembly of embodiment 53, wherein the at least one ICL transmitter and the at least one ICL receiver are located within BEOL structures of the respective microelectronic devices.

Embodiment 55: The microelectronic device assembly of embodiment 53, wherein the at least one IC transmitter and the at least one ICL receiver are located on RDLs associated with respective microelectronic devices.

Embodiment 56: The microelectronic device assembly of any of embodiments 53, 54 or 55, wherein the substrate includes at least one ICL transmitter and at least one ICL receiver and the at least one ICL transmitter of an adjacent microelectronic device or associated RDL is vertically aligned with the at least one ICL receiver of the substrate and the at least one ICL receiver of the adjacent microelectronic device or associated RDL is vertically aligned with the at least one ICL transmitter of the substrate.

Embodiment 57: The microelectronic device assembly of embodiment 53 or 56, wherein each microelectronic device or associated RDL includes multiple ICL transmitters and multiple ICL receivers, and ICL transmitters of a stacked microelectronic device or associated RDL are vertically aligned with ICL receivers of an adjacent stacked microelectronic device or associated RDL and ICL receivers of the stacked microelectronic device or associated RDL are vertically aligned with ICL transmitters of an adjacent stacked microelectronic device or associated RDL.

Embodiment 58: The microelectronic device assembly of any of embodiments 53 through 57, wherein the conductive traces extending over the dielectric material to via locations beyond a footprint of an associated microelectronic device comprise a fan-out package configured redistribution layer (FOP-configured RDL) structure.

Embodiment 59: The microelectronic device assembly of any of embodiments 53 through 58, wherein the microelectronic devices comprise semiconductor dice.

Embodiment 60: The microelectronic device assembly of any of embodiments 53 through 59, wherein power and ground/bias signal communication through the conductive traces and vias are ganged for all of the microelectronic devices.

Embodiment 61: The microelectronic device assembly of any of embodiments 53 through 59, wherein power and ground/bias communication through the conductive traces and vias are individualized for at least some of the microelectronic devices.

Embodiment 62: A microelectronic device assembly, comprising:
 a substrate having conductors exposed on a surface thereof;
 a stack of two or more microelectronic devices on the substrate, each microelectronic device comprising an active surface having power and ground/bias bond pads operably coupled to conductive traces extending over a dielectric material to via locations beyond a footprint of an associated microelectronic device, and TSVs for data signal communication extending through the microelectronic devices aligned with TSVs of at least one adjacent microelectronic device;
 vias for power and ground\bias communication extending through the dielectric materials at the via locations and comprising conductive material in contact with at least some of the conductive traces of each of the two or more microelectronic devices and extending to at least some of the exposed conductors of the substrate; and
 conductive elements extending through a dielectric material between adjacent microelectronic devices in alignment with the TSVs for data signal communication.

Embodiment 63: The microelectronic device assembly of embodiment 62, wherein power and ground/bias signal communication through the conductive traces and vias are ganged for all of the microelectronic devices.

Embodiment 64: The microelectronic device assembly of embodiment 62, wherein power and ground/bias communication through the conductive traces and vias are individualized for at least some of the microelectronic devices.

Embodiment 65: The microelectronic device assembly of any of embodiments 62 through 64, further comprising an additional, uppermost microelectronic device of the stack devoid of TSVs and having bond pads aligned with TSVs of a next lower microelectronic device of the stack.

Embodiment 66: The microelectronic device assembly of any of embodiments 62 through 65, wherein each microelectronic device is laterally surrounded by an EMC through which the vias extend.

Embodiment 67: The microelectronic device assembly of any of embodiments 62 through 66, further comprising conductive elements extending through a dielectric material between TSVs of a lowermost microelectronic device and the stack and conductors on the upper surface of the substrate for data signal communication.

Embodiment 68: A method comprising:
 forming a reconstructed wafer or panel of semiconductor dice by adhering semiconductor dice by active surfaces in mutually spaced relationship on a FOP-configured RDL wafer or panel with traces extending from bond pads to areas on the RDLs beyond a footprint of each semiconductor die;

laterally encapsulating the semiconductor dice of the reconstructed wafer or panel of semiconductor dice in an EMC;

adhering the reconstructed wafer or panel of semiconductor dice to a DAF on a side of the EMC opposite the FOP-configured wafer or panel;

singulating the semiconductor dice, FOP-configured RDL wafer or panel, the EMC and the DAF;

stacking the singulated semiconductor dice, FOP-configured RDLs, EMC and DAF;

forming openings through the singulated RDLs, EMC and DAF at via locations in communication with traces beyond footprints of semiconductor dice of the stack; and filling the openings with conductive material.

Embodiment 69: The method of embodiment 68, further comprising stacking the singulated semiconductor dice, FOP-configured RDLs, EMC and DAF on a substrate; and wherein filling the opening with conductive material comprises filling the openings with conductive material to contact conductors on an upper surface of the substrate.

Embodiment 70: A microelectronic device assembly, comprising:
- a substrate having conductors exposed on a surface thereof;
- a stack of two or more microelectronic devices on the substrate, each microelectronic device comprising an active surface having bond pads operably coupled to conductive traces extending over a dielectric material to via locations beyond a footprint of an associated microelectronic device;
- an EMC laterally surrounding each of the two or more microelectronic devices;
- a DAF over each of the microelectronic devices and the surrounding EMC; and
- vias extending through the dielectric materials, the EMC and the DAF at the via locations and comprising conductive material in contact with at least some of the conductive traces of each of the two or more microelectronic devices and extending to exposed conductors of the substrate.

Embodiment 71: The microelectronic device assembly of embodiment 70, wherein the conductive traces extending over the dielectric material to via locations beyond a footprint of an associated microelectronic device comprise a fan-out package configured redistribution layer (FOP-configured RDL) structure.

Embodiment 72: A method comprising:
- forming a reconstructed wafer or panel of semiconductor dice by adhering singulated semiconductor dice by active surfaces in mutually spaced relationship on a FOP-configured RDL wafer or panel with traces extending from bond pads to areas on RDLs beyond a footprint of each semiconductor die;
- laterally encapsulating the semiconductor dice of the reconstructed wafer or panel of semiconductor dice in an EMC;
- laminating a polymer film over the RDLs;
- singulating the semiconductor dice, EMC, RDL wafer or panel and polymer film;
- inverting and stacking the singulated semiconductor dice, FOP-configured RDLs, EMC and polymer film;
- forming openings through the singulated RDLs, EMC and polymer film at via locations; and
- filling the openings with conductive material.

Embodiment 73: The method of embodiment 72, further comprising:
- bumping selected microelectronic devices with conductive elements on active surfaces thereof before inverting and stacking the singulated semiconductor dice, FOP-configured RDLs, EMC and polymer film;
- wherein inverting and stacking the singulated semiconductor dice, FOP-configured RDLs, EMC and polymer film comprises inverting and stacking a bumped microelectronic device on a substrate with the conductive elements in contact with conductors of the substrate through a polymer film; and
- inverting and stacking remaining microelectronic devices.

Embodiment 74: A microelectronic device assembly, comprising:
- a substrate having conductors exposed on a surface thereof;
- a stack of two or more microelectronic devices over the substrate, each microelectronic device comprising an active surface facing the substrate and having bond pads operably coupled to conductive traces extending over a dielectric material to via locations beyond a footprint of an associated microelectronic device;
- a polymer film over the dielectric material and conductive traces;
- an EMC laterally surrounding each of the two or more microelectronic devices;
- vias extending through the dielectric materials, the polymer film and the EMC at the via locations and comprising conductive material in contact with at least some of the conductive traces of each of the two or more microelectronic devices and extending to exposed conductors of the substrate; and
- another microelectronic device under the stack, adjacent the substrate and having an active surface facing the substrate, bond pads of the other microelectronic device in communication with conductors of the substrate through conductive elements extending through a polymer film and in contact with conductor of the substrate.

Embodiment 75: The microelectronic device assembly of embodiment 74, wherein the conductive traces extending over the dielectric material to via locations beyond a footprint of an associated microelectronic device comprise a fan-out package configured redistribution layer (FOP-configured RDL) structure.

Embodiment 76: A microelectronic device assembly, comprising:
- a substrate having conductors exposed on a surface thereof;
- a stack of two or more microelectronic devices on the substrate, each microelectronic device comprising an active surface having bond pads operably coupled to conductive traces extending over a dielectric material to via locations beyond all sides of the stack;
- vias extending through the dielectric materials at the via locations and comprising conductive material in contact with at least some of the conductive traces of each of the two or more microelectronic devices and extending to exposed conductors of the substrate;
- the vias in combination comprise a ground stitching structure providing electromagnetic interference (EMI) protection;
- a ground structure extending over an uppermost microelectronic device, operably coupled to the ground stitching structure, the ground structure and ground stitching structure in combination providing a Faraday cage; and a radiofrequency antenna disposed over and dielectrically isolated from the Faraday cage and operably coupled to one or more microelectronic devices of the stack.

Embodiment 77: A microelectronic device assembly, comprising:
  a substrate having conductors exposed on a surface thereof;
  a stack of two or more microelectronic devices on the substrate, each microelectronic device comprising an active surface having bond pads operably coupled to conductive traces extending over a dielectric material to via locations beyond a footprint of an associated microelectronic device;
  an uppermost microelectronic device of the stack configured as a relatively high power density device compared to a power density of one or more other microelectronic devices of the stack;
  a heat sink structure located between the uppermost microelectronic device of the stack and a remainder of microelectronic devices of the stack; and
  vias extending through the dielectric materials at the via locations and comprising conductive material in contact with at least some of the conductive traces of each of the two or more microelectronic devices and extending to exposed conductors of the substrate.

While certain illustrative embodiments have been described in connection with the FIGURES, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device assembly, comprising:
  a substrate having conductive pads at an upper surface thereof;
  a first non-conductive polymer material on the upper surface of the substrate;
  a first semiconductor die on the first non-conductive polymer material;
  redistribution layer (RDL) pads at a bottom surface of the first semiconductor die opposing the upper surface of the substrate; and
  first conductive contacts coupled to the RDL pads and vertically extending to the substrate, some of the first conductive contacts physically contacting the conductive pads;
  second conductive contacts coupled to the RDL pads and vertically extending completely through first semiconductor material of the first semiconductor die;
  a second semiconductor die overlying the first semiconductor die;
  a second non-conductive polymer material vertically interposed between the first semiconductor die and the second semiconductor die;
  third conductive contacts vertically extending completely through second semiconductor material of the second semiconductor die, the third conductive contacts horizontally overlapping the second conductive contacts; and
  fourth conductive contacts vertically extending through the second non-conductive polymer material and coupled to the third conductive contacts and the second conductive contacts.

2. The microelectronic device assembly of claim 1, further comprising:
  additional conductive contacts coupled to the conductive pads and vertically extending completely through the substrate; and
  solder balls on a lower surface of the substrate, some of the additional conductive contacts vertically extending to and in physical contact with some of the solder balls.

3. The microelectronic device assembly of claim 1, wherein RDL pads comprise copper.

4. The microelectronic device assembly of claim 1, wherein the first non-conductive polymer material physically contacts each of the bottom surface of the first semiconductor die and side surfaces of the first semiconductor die.

5. The microelectronic device assembly of claim 1, further comprising an epoxy molding compound (EMC) on the upper surface of the substrate and enveloping the first non-conductive polymer material, the first semiconductor die, the second non-conductive polymer material, and the second semiconductor die.

6. A stacked semiconductor die assembly, comprising:
  a substrate having first conductive pads at an upper surface thereof;
  a die stack vertically overlying the substrate and comprising:
    a first non-conductive film (NCF) material on the upper surface of the substrate;
    a first semiconductor die on the first NCF material, the first NCF material covering a bottom surface and side surfaces of the first semiconductor die;
    a second NCF material over an upper surface of the first semiconductor die; and
    a second semiconductor die on the second NCF material, the second NCF material covering a bottom surface and side surfaces of the second semiconductor die; and
  first conductive contacts vertically extending through the first NCF material and the second NCF material of the die stack to the first conductive pads at the upper surface of the substrate, the first conductive contacts respectively offset from horizontal areas of the first semiconductor die and the second semiconductor die of the die stack.

7. The stacked semiconductor die assembly of claim 6, wherein the die stack further comprises:
  first conductive traces coupled to the first semiconductor die and the first conductive contacts, respective ones of the first conductive traces horizontally extending from the first semiconductor die to respective ones of the first conductive contacts; and
  second conductive traces coupled to the second semiconductor die and the first conductive contacts, respective ones of the second conductive traces horizontally extending from the second semiconductor die to the respective ones of the first conductive contacts.

8. The stacked semiconductor die assembly of claim 7, wherein the die stack further comprises:
  a first fan-out-package-(FOP)-configured redistribution layer (RDL) vertically interposed between the first semiconductor die and the second NCF material and bearing the first conductive traces; and a second FOP-configured RDL vertically overlying the second semiconductor die and bearing the second conductive traces.

9. The stacked semiconductor die assembly of claim 8, wherein:
the first FOP-configured RDL comprises first inductive coupling loop (ICP) transmitters and first ICP receivers coupled to first date signal pinouts of the first semiconductor die; and
the second FOP-configured RDL comprises second ICP transmitters and second ICP receivers coupled to second date signal pinouts of the second semiconductor die.

10. The stacked semiconductor die assembly of claim 6, further comprising:
second conductive pads at the upper surface of the substrate and coupled to conductive structures at a bottom surface of the substrate; and
second conductive contacts on the first conductive pads and vertically extending through the first NCF material to the first semiconductor die.

11. The stacked semiconductor die assembly of claim 10, wherein the second conductive contacts are directly attached to the second conductive pads by way of thermocompression bonds.

12. The stacked semiconductor die assembly of claim 6, further comprising decoupling capacitors respectively coupled to one or more of the first conductive contacts, the decoupling capacitors offset from the horizontal areas of the first semiconductor die and the second semiconductor die of the die stack.

13. A memory device package, comprising:
a substrate;
a die stack vertically overlying and operably coupled to the substrate, the die stack comprising:
memory levels respectively comprising at least one memory die;
non-conductive polymer material vertically alternating with the memory levels; and
adhesive material on a bottom surface of the at least one memory die of respective ones of the memory levels, the adhesive material having a different material composition than the non-conductive polymer material; and
conductive contacts operably coupled to circuitry of at least some of the memory levels and additional circuitry of the substrate, the conductive contacts vertically extending through portions of the non-conductive polymer material extending beyond lateral peripheries of the at least one memory die of respective ones of the memory levels.

14. A memory device package, comprising:
a substrate;
a die stack vertically overlying and operably coupled to the substrate, the die stack comprising:
memory levels respectively comprising at least one memory die, the at least one memory die of a vertically lowest one of the memory levels of the die stack operably coupled to the substrate through a direct-chip-attach (DCA) assembly comprising:
conductive pads at a bottom surface of the at least one memory die; and
additional conductive contacts coupled to the conductive pads and vertically extending to the substrate; and
non-conductive polymer material vertically alternating with the memory levels; and
conductive contacts operably coupled to circuitry of at least some of the memory levels and additional circuitry of the substrate, the conductive contacts vertically extending through portions of the non-conductive polymer material extending beyond lateral peripheries of the at least one memory die of respective ones of the memory levels.

15. The memory device package of claim 13, wherein the non-conductive polymer material comprises one or more of silica-filled epoxy, b-staged polyimide, and polytetrafluoroethylene.

16. The memory device package of claim 13, wherein the die stack further comprises a controller die vertically overlying an uppermost one of the memory levels.

* * * * *